United States Patent [19]
Okada et al.

[11] Patent Number: 5,796,356
[45] Date of Patent: Aug. 18, 1998

[54] DATA COMPRESSING APPARATUS, DATA RESTORING APPARATUS AND DATA COMPRESSING/RESTORING SYSTEM

[75] Inventors: Yoshiyuki Okada; Noriko Satoh, both of Kawasaki, Japan

[73] Assignee: Fujitsu Limited, Kawasaki, Japan

[21] Appl. No.: 556,772

[22] Filed: Nov. 2, 1995

[30] Foreign Application Priority Data

Mar. 14, 1995 [JP] Japan ................................. 7-054520

[51] Int. Cl.⁶ ........................................................ H03M 7/40
[52] U.S. Cl. ........................................... 341/51; 341/67
[58] Field of Search ............................. 341/51, 65, 67

[56] References Cited

U.S. PATENT DOCUMENTS 4,870,662  9/1989  Lindbergh et al. .................... 341/67

OTHER PUBLICATIONS

Liu et al., "Cam-Based VLSI Architectures For Dynamic Huffman Coding", *IEEE Transactions*, vol. 40, No. 3 pp. 282-288 (Aug. 1, 1994).

Anderson, "Overview of Huffman Encoding as Compression Technique", *Computer Technology Review*, vol. 11, No. 6, pp. 97-98, 100-101 (May 1, 1991).

Ramabadran et al., "An Adaptice Algorithm for the Compression of Computer Data", *IEEE Transactions*, vol. 37, No. 4, pp. 317-324 (Apr. 1, 1989).

*Primary Examiner*—Howard L. Williams
*Attorney, Agent, or Firm*—Staas & Halsey

[57] ABSTRACT

In a data compressing apparatus, when a data input unit inputs unit data, a coding unit obtains an order corresponding to the input unit data and outputs a code corresponding to this order with reference to a compression table. When completing this coding process, a compression table updating unit changes the order of the unit data in the compression table in a self-organizing manner based on only that order. In a data restoring apparatus, when a code input unit inputs the code as a result of the compression, a data restoring unit obtains another corresponding to the inputted code and outputs the unit data corresponding to this order with reference to a restoration table. When completing this coding process, a restoration table updating unit changes the order of the unit data in the restoration table in the self-organizing manner based on only that order.

27 Claims, 34 Drawing Sheets

FIG. 28

|  | 2bit | | 3bit | | | 4bit | |
|---|---|---|---|---|---|---|---|
| LETTER | a | b | c | d | e | f | g |
| APPEARANCE FREQUENCY | 7 | 6 | 5 | 5 | 3 | 2 | 1 |
| APPEARANCE PROBABILITY | 0.24 | 0.21 | 0.17 | 0.17 | 0.10 | 0.07 | 0.04 |
| CODE WORD | 00 | 10 | 010 | 011 | 110 | 1110 | 1111 |

FIG. 30
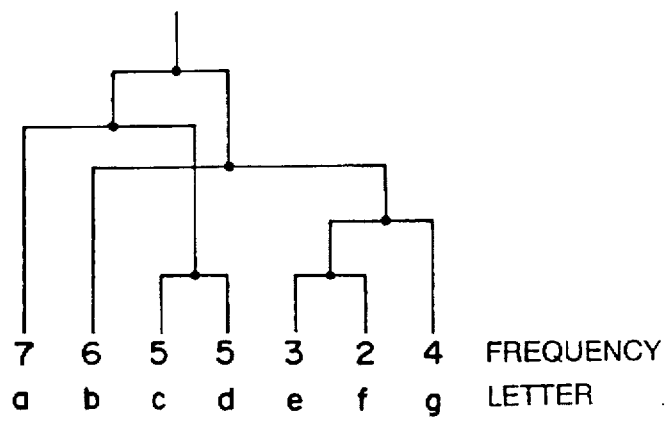
FIG. 31
| 2bit | 3bit | 4bit |
|---|---|---|
| 7 6 | 5 5 4 | 3 2 |
| a b | c d g | e f |
FIG. 32
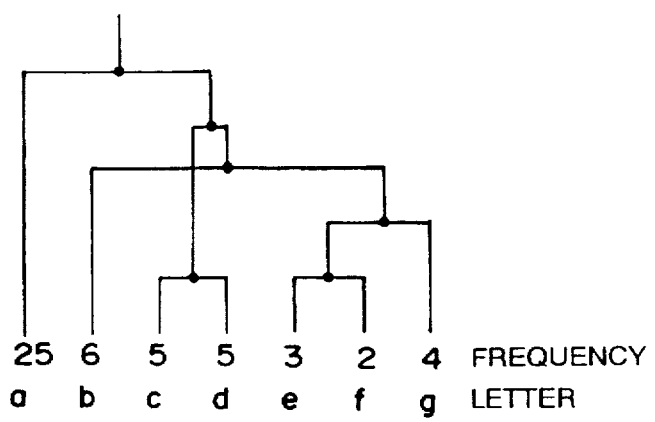

| 1bit | 3bit | | | 4bit | 5bit | |
|---|---|---|---|---|---|---|
| 25 | 6 | 5 | 5 | 4 | 3 | 2 |
| a | b | c | d | g | e | f |

```
25   6   5   5   3   2   20   FREQUENCY
 a   b   c   d   e   f    g   LETTER
```

| 1bit | 2bit | 4bit | | | 5bit | |
|---|---|---|---|---|---|---|
| 25 | 20 | 6 | 5 | 5 | 3 | 2 |
| a | g | b | c | d | e | f |

(a) INITIAL STATUS        (b) REGISTER LETTER 'b'

5,796,356

DATA COMPRESSING APPARATUS, DATA RESTORING APPARATUS AND DATA COMPRESSING/RESTORING SYSTEM

BACKGROUND OF THE INVENTION

1. Field of the Invention

The present invention relates generally to a data compressing apparatus, a data restoring apparatus and a data compressing/restoring system that serve to compress data when storing the data in a computer or transmitting the data from a computer and restoring the data when using the data. The present invention relates more particularly to a data compressing apparatus, a data restoring apparatus and a data compressing/restoring system that are based on a probability statistic type coding method.

2. Description of the Related Art

In recent years, a computer has dealt with various kinds of data such as character codes, video data, etc., and an amount of data dealt with has also increased. Such a large quantity of data can be compressed by omitting redundant items of data. It is possible to apparently increase a disk capacity or reduce a time for transmitting the data to a remote area by compressing the data that way.

A method capable of compressing the various kinds of data described above may be a compressing method based on universal coding. A data compressing method based on this universal coding will hereinafter be described. Note that the universal coding is, as explained above, applicable to any kinds of data. In the following discussion, however, an explanation will be given by exemplifying the coding of character codes. Further, on the basis of an information theory, in the explanatory statement, 1 word unit of the data is referred to as a "character", and a string of arbitrary characters are called a "character string".

The universal coding method is roughly classified into two types which follow. There are a dictionary type coding method making use of a similarity of a data string and a probability statistic type coding method making use of a frequency of occurrence of a data string. The present invention relates to the latter method, i.e., the probability statistic type coding method.

One typical method of the probability statistic type coding methods may be a Huffman coding method. This Huffman coding method exhibits a maximum compression efficiency as a coding method in which a character appearance frequency from an information source is known, and the coding is performed on one-character unit. This method involves the use of a code table (hereinafter referred to as a code tree) expressing a data string as a tree structure constructed of "nodes" and "branches" connecting the respective nodes.

Names of respective parts of the tree will be explained with reference to FIG. 26. To start with, an uppermost node is termed a "root". In an example of FIG. 26, node 1 is defined as the root. A lower node (provisionally named "Y") connected via a branch to a certain node (provisionally named "X") is called a "child of the node X", whereas the node X is called a "parent of the node Y". For example, children of node 6 are node 8 and node 9, while the parent of the node 6 is node 3. Further, a grandparent and a great-grandparent are termed "ancestors", while a grandchild and a great-grandchild are termed "descendants". For instance, an ancestor of the node 5 is only the node 1, while descendants of the node 3 are the nodes 8 and 9. Further, if a parent of two nodes is the same node, these nodes are called "sibling". A node having no child is referred to as a "leaf". Moreover, a node that is not defined as a leaf is called an "internal node". In the thus structured code tree, the respective leaves of the code tree are labeled with letters. Then, each branch invariably diverges two ways from one node, and hence each branch is labeled with a code "0" or "1". Accordingly, the letter allocated to each leaf shows one-to-one correspondence to a string of codes labeled with the respective branches constituting a path extending from a root to that leaf. Accordingly, in the case of coding a certain letter, it is possible to effect a conversion into a code expressed by a specified binary number.

The principle of the Huffman coding for creating such a code tree will be described with reference to FIG. 27. According to the Huffman coding, at first, a leaf corresponding to each appeared letter (hereinafter referred to as "symbol") is created, and an occurrence probability or an appearance frequency of the symbol is written to each leaf. Note that these leaves are arranged in such a way that the appearance frequencies (occurrence probabilities) thereof increase from right to left.

Then, there is newly created one node of a parent having two leaves as children that exhibit a lowest occurrence probability (minimum appearance frequency). A sum of occurrence probabilities of the two leaves (children) are written to this new node (parent). Further, this node (parent) is connected via two branches to these two leaves (children). The right branch of these two branches is labeled with a value "1", while the left branch is labeled with a value of "0".

Next, the remaining leaves and the new node are compared with one another, and two nodes having the lowest occurrence probability are selected from them. Then, there is created a new node of the parent having two nodes or leaves as children. Further, this new node (parent) is connected via two branches to the two children. The operation described above continues till the root is generated to form a single tree as a whole. In the finally obtained code tree, a string of codes labeled with the respective branches constituting a path originating from the root down to the leaves is code word corresponding to the letter labeled to those leaves. As described above, each branch is labeled with the code of "0" or "1". Therefore, at respective diverging points i.e. internal nodes, when the path branches off leftward, "0" is allocated thereto, and when branching off rightward, "1" is allocated thereto. It follows that a series of code word are thus created. FIG. 28 is a table showing a relationship between the code word and the symbol obtained by creating the code tree of FIG. 27.

The above-described Huffman coding method (probability statistic type coding method) is further classified into a static coding method in which the occurrence probability of each symbol is previously determined, a semi-adaptive type coding method in which the occurrence probability of each symbol is obtained by scanning all the character strings at first and an adaptive type coding method in which the occurrence probability is recalculated by taking a frequency each time the symbol appears. The present invention relates to the adaptive type coding method capable of performing the coding with one path without depending on a data format.

FIG. 29 illustrates how a tree structure and the code are updated each time the appearance frequency of each symbol changes according to this adaptive type coding method. FIG. 29(a) illustrates a code tree created at an initial stage. Referring to FIG. 29, a round node indicates the internal node, while a square node indicates the leaf. Further, a numeral put inwardly of the circle or the square showing each node indicates a node number (order). Further, a numeral affixed to the right shoulder of each node indicates an occurrence frequency registered in each node. Further, an alphabetic letter shown under the leaf indicates a symbol registered. Accordingly, at a stage of FIG. 29(a), the occurrence frequencies of symbols "a"–"g" are respectively "7", "6", "5", "5", "3", "2" and "1".

When the symbol "g" appears from this status, as illustrated in FIG. 29(b), the occurrence frequency of a node 15 is incremented to "2" after performing the coding in this code tree. With this processing, the frequencies of the parent node 13 and ancestor nodes 9, 2, 0 are each incremented by 1. As a result of the increment, the frequency "4" of the node 13 is larger than the frequency "3" of the adjacent node 12, and, therefore, the node 12 is exchanged for the node 13. Similarly, the parent node 9 thereof is exchanged for the node 8 (see FIG. 29(c)). Further, the frequencies of the parent node 2 thereof and the node 1 are not reversed, and hence the exchanging thereof is not conducted. Accordingly, with the occurrence of the single symbol "g", the form of the code tree varies finally to a state shown in FIG. 29(d).

FIGS. 30 through 37 illustrate how the code tree varies when the symbols occur consecutively. If the occurrence frequencies of the respective symbols are as shown in FIG. 31 in an initial status, the state of the code tree becomes as illustrated in FIG. 30. In this code tree, as depicted in FIG. 31, "a" and "b" can be compressed down to 2 bits; "c", "d" and "g" can be compressed down to 3 bits; and "e" and "f" can be compressed down to 4 bits. From the states of FIGS. 30 and 31, the symbol "a" occurs 18 times, and when its occurrence frequency amounts to "25", the state of the code tree becomes as illustrated in FIG. 33. In this code tree, as depicted in FIG. 33, "a" can be compressed down to 1 bit; "b", "c" and "d" can be compressed down to 3 bits; "g" can be compressed down to 4 bits; and "e" and "f" can be compressed down to 5 bits. From this status, when the symbol "g" occurs 16 times with the result that its occurrence frequency amounts to "20", the state of the code tree becomes as shown in FIG. 34, and a compression quantity of each symbol goes as shown in FIG. 35.

Thus, according to the adaptive type coding method, with an increased occurrence frequency of the symbol, a length of the code word corresponding to the relevant symbol becomes shorter. Namely, a compression effect increases. Note that when the structure of the code tree gradually varies this way, the code word corresponding to the same symbol becomes different at the end of the data from it at the beginning of the data. On the restoration side of the data, however, the same code tree as that on the compression side is created, and, after encoding the symbol appeared, the code tree is updated on the data compression side. Hence, on the data restoration side, the code tree of its own can be updated synchronizing with the compression side by seeing the code word outputted. It is therefore possible to restore the previous symbol irrespective of changes of a code word-to-symbol correspondence.

Further, according to the above-described static coding method or the semi-adaptive type coding method, all the symbols appearing at the input side are previously registered in the code tree, and the symbols can not be added. In contrast with this, according to the adaptive type coding method, the occurrence probability of the symbol is recalculated each time the symbol occurs, and, therefore, the symbols can be added and registered. Procedures for adding and registering the symbols according to the above-mentioned adaptive type coding method will be explained with reference to FIG. 38.

In this case, as depicted in FIG. 38(a), when initialized, only a code connoting "unregistered" (hereinafter referred to as an escape code or ESC) and a code indicating the end of a file (hereinafter termed EOF) are registered in the code tree. Then, if an appeared symbol is not registered in the code tree, the code word corresponding to ESC and an item of raw data (data before being compressed) of the symbol are outputted. Thereafter, an occurrence frequency of ESC is incremented by 1, and a node (leaf) with a minimum weight within the code tree branches off. One of new leaves generated by the divergence is registered with a symbol of the previous node (having a minimum appearance frequency), while other leaves are registered with the new appeared symbol (FIG. 38(b)).

The explanation given above deals with a case where the variable-length coding is dynamically performed based on the occurrence probability per character. A further enhancement of a compression effect is attainable with the variable-length coding by use of a conditional appearance probability in which a dependent relationship (hereinafter termed a "context") between an inputted character and a just-anterior character is considered. That is, under such a status that a probability of generating a character string according to a certain context is high, when the first symbol of the context is generated, a symbol that will probably be generated next can be limited to some extent (to a next symbol constituting the context). Accordingly, if there is prepared the code tree applied under the condition where this first symbol is generated, the length of the code word corresponding to the next symbol can be decreased. That is, a compression efficiency can be enhanced.

When using the conditional appearance probability adopting the "context", the context and the coding target character are expressed in a tree structure (hereinafter referred to as a context tree) as shown in FIG. 21. This context tree is formed of a flow of contexts (a flow of character strings) inputted in the past. Each node of the context tree has a code tree in which the nodes of the children in the context tree serve as leaves. A frequency (at which the next symbol appears in each context) is registered in this code tree. In this way, the probability of occurrence of the next symbol (when a certain symbol occurs) can be obtained as a conditional probability.

This context collecting method may include two methods which follow. A first method thereof is a method of fixing a degree of condition of the conditional probability. Herein, the term "degree" connotes a length of the context in which the conditional probability is to be obtained. In this instance, if fixed to, e.g., a second degree context, only contexts in which a character connected to just-anterior two characters are collected, thereby obtaining a conditional probability P (Y|X1, X2). Wherein Y is a coding target character, while X1, X2 are respectively first and second just-anterior characters. Further, a second method thereof is a method of extending the degree in accordance with input data without fixing the length of the conditional character string. This is known as a blending context.

As explained above, the Huffman coding method is a method capable of compressing the data at the maximum efficiency among the coding methods involving the use of the code tree. In particular, the adaptive type Huffman coding exhibits advantages of having no necessity for holding the occurrence probability of each character beforehand and being capable of following up fluctuations of the occurrence probability within one file. According to this adaptive type coding method, the code tree is updated per occurrence of each symbol. This updating is actualized by an increment of the occurrence frequency of each symbol, an increment of the occurrence frequency at each node, a comparison of the occurrence frequency at the respective nodes and a reorganization of the structure of the code tree.

In case a Huffman tree is actually structured that way, however, this needs a great quantity of frequency comparisons and frequency increments. Further, a multiplicity of memories are required because of the necessity for holding the frequency per node.

SUMMARY OF THE INVENTION

It is a primary object of the present invention to provide a data compressing apparatus, a data restoring apparatus and a data compressing/restoring system capable of saving a memory by eliminating a necessity for holding a frequency per node of a code tree and of updating the code tree to increase a compression efficiency of a symbol having a high occurrence frequency without making a comparison with the frequency held per node.

The data compressing apparatus, the data restoring apparatus and the data compressing/restoring system according to the present invention adopts the following elements to obviate the above problems.

First aspect of a data compressing apparatus according to the present invention dynamically codes an item of inputted unit data in accordance with an occurrence situation of the unit data appeared in the past. The data compressing apparatus according to the present invention comprises a compression table for determining an order of each unit data and allocating a code per order and a data input element for inputting the unit data to be compressed. The data compressing apparatus also comprises a coding element for retrieving the compression table, obtaining the order corresponding to the unit data inputted by the data input element and outputting the code corresponding to this order and a compression table updating element for changing the order of the unit data in the compression table in a self-organizing manner based on only the order thereof after the coding element has outputted the code corresponding to the unit data.

Further, first aspect of a data restoring apparatus according to the present invention outputs unit data which is restored by dynamically decoding an inputted code in accordance with an occurrence situation of the unit data appeared in the past. The restoring apparatus comprises a restoration table for determining an order of each unit data and allocating a code per order and a code input element for inputting the code to be restored. The restoring apparatus further comprises a data restoring element for retrieving the restoration table, obtaining the order corresponding to the code inputted by the code input element and outputting the unit data corresponding to this order and a restoration table updating element for changing the order of the unit data in the restoration table in a self-organizing manner based on only the order thereof after the data restoring element has outputted the unit data corresponding to the code.

Moreover, first aspect of a data compressing/restoring system according to the present invention has the above data compressing apparatus and the above data restoring apparatus. Contents of the compression table are identical with contents of the restoration table, and the compression table updating element and the restoration table updating element perform an updating process of each of the tables in accordance with the same procedures.

Herein, the "unit data" may be characters (symbols), video data or other kinds of data.

The compression table and the restorations tables may have a tree structure in which a branch repeatedly diverges from a single root. In this case, the construction is that orders are given to respective nodes formed at diverging points of the branches and terminals thereof in sequence from the root towards the terminals; the unit data are registered in the nodes of the terminals; and the diverged branches are each labeled with codes distinguishable from each other.

In this instance, the data coding element reads the code on a path connecting the root to the node registered with the inputted unit data and then outputs the code. Further, the data restoring elements retrieves the unit data registered in the nodes of the terminals of a path by tracing the path extending from the root labeled with the same code as the above code and outputs the retrieved unit data.

In an initial status, only an end symbol and a non-appeared symbol are registered in the compression table and the restoration table, and each time an unregistered item of unit data appears this items of unit data may be registered in these tables.

In this case, the data compressing apparatus further includes a data registration/non-registration determining element for determining whether or not the unit data inputted by the data inputting element is registered in the compression table. The coding element, when the data registration/non-registration determining element determines that the unit data is not registered in the compression table, obtains an order corresponding to the non-appeared symbol, outputs the a code corresponding to this order and thereafter outputs the unit data itself. The compression table updating element, when the coding element outputs the code corresponding to the non-appeared symbol and the unit data itself, changes the order of the non-appeared symbol in the compression table in a self-organizing manner and thereafter registers the unit data in the compression table.

Further, in the data restoring apparatus, the data restoring element, when the order corresponding to the code in the restoration table corresponds to the unregistered code, outputs the unit data inputted immediately after the unregistered code as it is. The restoration table updating element, when the data restoring element outputs the unit data inputted immediately after the code as it is, changes the order of the non-appeared symbol in the restoration table in the self-organizing manner based on only the order thereof and thereafter registers the unit data in the restoration table.

The compression table updating element and the restoration table updating element may be constructed to set the node registered with the unit data as a processing target node and perform an updating process of exchanging this processing target node for a node of the order higher by one.

Further, the compression table updating element and the restoration table updating element may be constructed to set the node registered with the unit data as a processing target node and perform an updating process of inserting this processing target node into a position of the order higher by two or more and letting down the orders of other nodes that are disposed in the inserting position through the previous position of the inserted node by ones.

Moreover, the compression table updating element and the restoration table updating element may be constructed to set the node registered with the unit data as a processing target node and perform an updating process of exchanging this processing target node for a node of the order higher by one in case the processing target node is of the highest order within the same level spaced the same away from the root, inserting this processing target node into a position of the highest order in case this processing target node is an order exclusive of the highest order within the same level and letting down the orders of other nodes that are disposed in the inserting position through the previous position of the inserted node by ones.

Additionally, the compression table updating element and the restoration table updating element may be constructed to set a node connected closer to the root side than the node at which the updating process is effected as a processing target node and perform the updating process with respect to this processing target node.

Further, the compression table updating element and the restoration table updating element may be constructed so as not to perform the updating process in case both of the processing target node and the node of the order higher by one than this processing target node are not nodes of the terminals.

Furthermore, the compression table updating element and the restoration table updating element may be constructed to perform the updating process of inserting the node registered with the unit data into a position of the order next to the root.

Moreover, the compression table updating element and the restoration table updating element may be constructed to perform an updating process of shifting the node registered with the unit data to a position of the order next to the root by repeating an inserting process of inserting the node registered with the unit data into a position of the highest order within the same level spaced the same away from the root and letting down the orders of others that are disposed in this inserting position through the previous position of the inserted node by ones and an exchanging process of exchanging for a node of the order higher by one.

In addition, the compression table updating element and the restoration table updating element may be constructed to cause a divergence of the node of the non-appeared symbol and register the non-appeared symbol and a newly apperared unit data in the nodes of terminals of two branches generated by this divergence.

Further, the compression table updating element and the restoration table updating element may be constructed to cause a divergence of the node of the terminal positioned at the order next to the node of the lowest order that is not a terminal and register a newly appeared unit data in the nodes of the terminals of the branches generated by this divergence.

Second aspect of a data compressing apparatus according to the present invention dynamically performs a coding process in accordance with a conditional occurrence situation in a context just before a symbol appeared in the past. The data compressing apparatus comprises a compression table for storing a context tree including contexts appeared in the past, the contexts being registered based on a tree structure within a range from 0th degree to a certain degree and code trees which are provided for every symbol in the context tree, and in which codes are allocated to a subsequent symbol following to the symbol and non-appeared symbol determining an order of them. The data compressing apparatus also comprises an input element for inputting a compression target symbol, a context retrieving element for retrieving the certain degree context having the symbol existing at the terminal thereof from the context tree and a non-appeared symbol order coding element for coding an order of the non-appeared symbol with reference to each of the code trees corresponding to the contexts from the certain degree to the degree that the symbol exists. The compressing apparatus further comprises a symbol order coding element for coding the order of the symbol with reference to the code tree corresponding to the highest degree of the context tree in which the symbol is registered, which is retrieved by the context retrieving element, a code tree order updating element for updating the order of the symbol in the code tree in a self-organizing manner on the basis of only the order of the symbol in the code tree referred and a non-appeared symbol order updating element for updating the order of the non-appeared symbol in each code tree in the self-organizing manner on the basis of only the order of the non-appeared symbol in each code tree referred.

Further, second aspect of a data restoring apparatus according to the present invention dynamically outputs such a symbol that an inputted code is decoded in accordance with a conditional occurrence situation in a context just before a symbol appeared in the past. The restoring apparatus according to the present invention comprises a restoration table for storing a context tree including contexts appeared in the past, the contexts being registered based on a tree structure within a range from 0th degree to a certain degree and code trees which are provided for every symbol in the context tree and in which codes are allocated to a subsequent symbol following to the symbol and non-appeared symbol determining an order of them. The restoring apparatus also comprises an input element for inputting a restoration target code, a context retrieving element (123) for retrieving the certain degree context having the symbol at the terminal thereof from the context tree, and a symbol order decoding element (124) for decoding an order of the symbol from the code on the basis of the code tree corresponding to the certain degree of the context tree in which the symbol is expected to exist. The data restoring apparatus further comprises a symbol order re-decoding element for ordering the symbol order decording element to decode the symbol order with reference to a code tree corresponding to the degree lower by one than the degree of the above code tree in case the non-appeared symbol is obtained as a result of the decording by the symbol order decoding element a code tree order updating element for updating the order of the symbol in the code tree in a self-organizing manner on the basis of only the order of the symbol in the code tree referred and a non-appeared symbol order updating element for updating the order of the non-appeared symbol in each code tree in the self-organizing manner on the basis of only the order of the non-appeared symbol in each code tree referred.

Moreover, second aspect of a data compressing/restoring system according to the present invention comprises the above data compressing apparatus and the above data restoring apparatus. Contents of the compression table are identical with contents of the restoration table, and each of the code tree order updating elements and each of the non-appeared symbol order updating elements of the data compressing apparatus and the data restoring apparatus respectively perform the same process.

All the appeared symbols including the end symbol may be registered in the code tree in the initial status.

In the first aspect of the data compressing apparatus, when the data input element inputs the unit data, the coding element obtains the order corresponding to the inputted unit data with reference to the compression table and outputs the code corresponding to this order. When completing this coding, the compression table updating element changes the order of the unit data in the compression table in the self-organizing manner based on only the order thereof.

On the other hand, in the second aspect of the data restoring apparatus, when the code input element inputs the code as a result of the compression, the data restoring element obtains the order corresponding to the inputted code with reference to the restoration table and outputs the unit data corresponding to this order. When completing this coding, the restoration table updating element changes the order of the unit data in the restoration table in the self-organizing manner based on only the order thereof.

The two table updating elements, when changing the respective tables (101, 106), do not take the occurrence frequency into consideration at all but only the order. Accordingly, there is no necessity for holding the occurrence frequency in each node and for performing the recalculation and comparison with respect to the occurrence frequency. Hence, it is possible to relieve loads on a memory and a central processing unit (CPU). Note that the length of the code corresponging to the unit data becomes short as the order of the unit data increases even without the occurrence frequency taken into consideration as described above, and therefore the compression efficiency can be enhanced by making the short code corresponding to a character having a high occurrence frequency.

Further, the compression table of the data compressing apparatus and the restoration table of the data restoring apparatus are constructed so that the contents thereof are identical with each other, and the compression table updating element and the restoration table updating element are constructed to perform the updating process of the respective tables in accordance with the same procedures. If thus constructed, the compression can be synchronized with the restoration, and, therefore, even if the code corresponding to the same unit data fluctuates, the previous unit data can be accurately restored.

The compression table and the restoration table are formed based on the tree structure in which the branch repeatedly diverges from the single root. The orders are given to the respective nodes formed at the diverging points of the branches and the terminals thereof in sequence from the root toward the terminals, and the unit data are registered in the nodes of the terminals. Then, the diverged branches are labeled with codes distinguishable from each other. If constructed in this way, the code corresponding to the specified unit data is directly determined even when updating the tree structure in any form. Further, the unit data corresponding to the specified code is also directly determined. Accordingly, the data can be accurately surely compressed and restored.

The compression and restoration tables are registered with only the end symbol and the non-appeared symbol in the initial status. An non-appeared unit data are registered in those tables each time the non-appeared unit data appears. If registered this way, since there is no necessity for searching the inside of the compression target file in advance of the compression, it is possible to reduce a processing time and compress the data in real time with respect to the data input.

When the compression table updating element and the restoration table updating element perform the updating process to exchange the node registered with the unit data for a node of the order higher by one within each table, the order of the node registered with the unit data can be certainly raised on.

The compression table updating element and the restoration table updating element effect the updating process to insert the node registered with the unit data into a position the order of which is higher by two or more and let down the orders of other nodes by ones that exist in the inserting position through the previous position of the inserted node, thereby making it possible to raise the order of the unit data fast.

The compression table updating element and the restoration table updating element set the node registered with the unit data as a processing target node within each table, and, if this processing target node is of the highest order within the same level spaced the same away from the root, the updating process is conducted to exchange this processing target node for a node of the order higher by one. Whereas if this processing target node is out of the highest order within the same level, the updating process is performed to insert this processing target node into a position of the highest order and let down the orders of other nodes that exist in this inserting position through the previous position of the inserted node by ones. With this operation, a length of the code corresponding to this item of unit data can be made shorter by 1 bit simply with the same unit data occurring consecutively at least twice. Hence, the compression efficiency can be further enhanced.

The compression table updating element and the restoration table updating element set the node connected closer the root than the node undergoing the updating process as a new processing target node and perform the updating with respect to this processing target node, whereby the order of the unit data registered in the order higher than the processing target unit data can be gradually let downd. It is therefore to effect the compression conforming to thet fact that the occurrence probability has let downd. In this case, when both of the processing target node and the node of the order higher by one than this processing target node are not nodes of the terminals, and if constructed so as not to perform the updating process, it is feasible to prevent such a drawback that the table is wastefully updated.

When the compression table updating element and the restoration table updating element perform the updating process to insert the node registered with the unit data into a position of the order next to the root within each table, there is obtained the same result as limiting a period of measuring the occurrence frequency to an approximately latest time. That is, the length of the code corresponding to the relevant unit data can be minimized on the premise that the unit data generated latest is maximum in terms of the probability of being generated next.

The compression table updating element and the restoration table updating element perform the updating process to shift the node registered with the unit data up to a position of the order next to the root by repeating both of the inserting process to insert the node registered with the unit data into the position of the highest order within the sale level spaced the same away from the root in each table and to let down the orders of other nodes that exist in this inserting position through the previous position of the inserted node by ones and the exchanging process to effect exchanging the node registered with the unit data for the node of the order higher by one. With this operation, the orders of other nodes can be let down by ones, and hence an influence on other nodes can be restrained.

In the case of adding and registering the unit symbol, if the compression table updating element and the restoration table updating element are constructed to cause a divergence of the node of a non-appeared symbol and register the non-appeared symbol and the unit data in the nodes of the terminals of two branches generated by this divergence, this item of unit data can be registered under simple control.

In the case of adding and registering the unit symbol, if the compression table updating element and the restoration table updating element cause a divergence of the node of the terminal positioned in the order next to the lowest node that is not a terminal and register the unit data in the nodes at the terminals of the branch produced by this divergence, the code corresponding to the relevant unit data after being registered can be prevented from being extremely elongated.

In the second aspect of the data compressing apparatus (110), when the data input element inputs the symbol, the context retrieving element retrieves such a context of a certain degree that the inputted symbol exists at the terminal from the above context tree within the compression table. The non-appeared symbol order coding element encodes the order of the non-appeared symbol with reference to the respective code trees corresponding to the contexts of the certain degree through such a degree that the inputted symbol exists. Next, the symbol order coding element encodes the order of the symbol with reference to the code tree of the highest degree, in which the inputted symbol is registered. When completing this encoding, the code tree order updating element updates the order of the symbol within the code tree registered with the encoded symbol in the self-organizing manner based on only the order thereof. Further, the non-appeared symbol order updating element updates the order of the non-appeared symbol within the code tree registered with the encoded non-appeared symbol in the self-organizing manner based on the order thereof.

On the other hand, in the second aspect of the data restoring apparatus, when the input element inputs the code as a result of the compression, the context retrieving element retrieves, from the context tree, such a context of a certain degree that the inputted symbol is expected to exist at the terminal thereof. The symbol order decoding element decodes the order of the symbol from the code on the basis of the code tree existing under such a context of the certain degree that the symbol is expected to exist. When obtaining the non-appeared symbol as a result of being decoded, the symbol order re-decoding element causes this symbol order decoding element to decode the symbol order with reference to of the degree smaller by one than the degree of the code tree. Upon a completion of this decoding, the code tree order updating element updates the order of the symbol in the code tree registered with the coded symbol in the self-organizing manner based on only the order thereof. Further, the non-appeared symbol order updating element updates the order of the non-appeared symbol in the code tree registered with the coded non-appeared symbol in the self-organizing manner based on the order thereof.

When each of the updating elements updates the code tree in each of the tables, the occurrence frequency is not taken into consideration at all but only the order. Accordingly, there is no necessity for holding the occurrence frequency in each node and performing the recalculation and comparison of the occurrence frequency. Hence, the loads on the memory and the central processing unit (CPU) can be relieved. Note that the length of the code corresponging to the unit data becomes short as the order of the unit data increase even without the occurrence frequency took into consideration that way, and hence the compression efficiency can be enhanced by making the short code corresponding to the character exhibiting a high occurrence frequency. Besides, there are dispersed the code trees for coding the next symbol under such condition that each symbol once occurs under the context of each degree that is registered in the context tree, and, therefore, a size of each context tree can be reduced. As a result, the code length after being coded can be decreased.

Further, the contents of the compression table on the data compressing apparatus are identical with the contents of the restoration table in the data restoring apparatus. If the respective code tree order updating elements and the non-appeared order updating elements of the data restoring apparatus and the data restoring apparatus are constructed to perform the same processing, the compression can be synchronized with the restoration. Hence, even when the code corresponding to the same symbol fluctuates, the previous symbol can be accurately restored.

If constructed to register the code tree with all the symbols including the end symbol in the above compression table and restoration table, the compressing/restoring process can be simplified.

BRIEF DESCRIPTION OF THE DRAWINGS

Other objects and advantages of the present invention will become apparent during the following discussion in conjunction with the accompanying drawings, in which:

FIG. 28 is a diagram showing a relationship between a character and a code word in the code tree of FIG. 27;

FIG. 30 is an explanatory diagram illustrating an example of updating the code tree by the adaptive type coding method;

FIG. 31 is a diagram showing a relationship between the character and the code word in the code tree of FIG. 30;

FIG. 32 is an explanatory diagram illustrating an example of updating the code tree by the adaptive type coding method;

DESCRIPTION OF THE PREFERRED EMBODIMENTS

Embodiments of the present invention will hereinafter be discussed with reference to the drawings.

Figure 1:
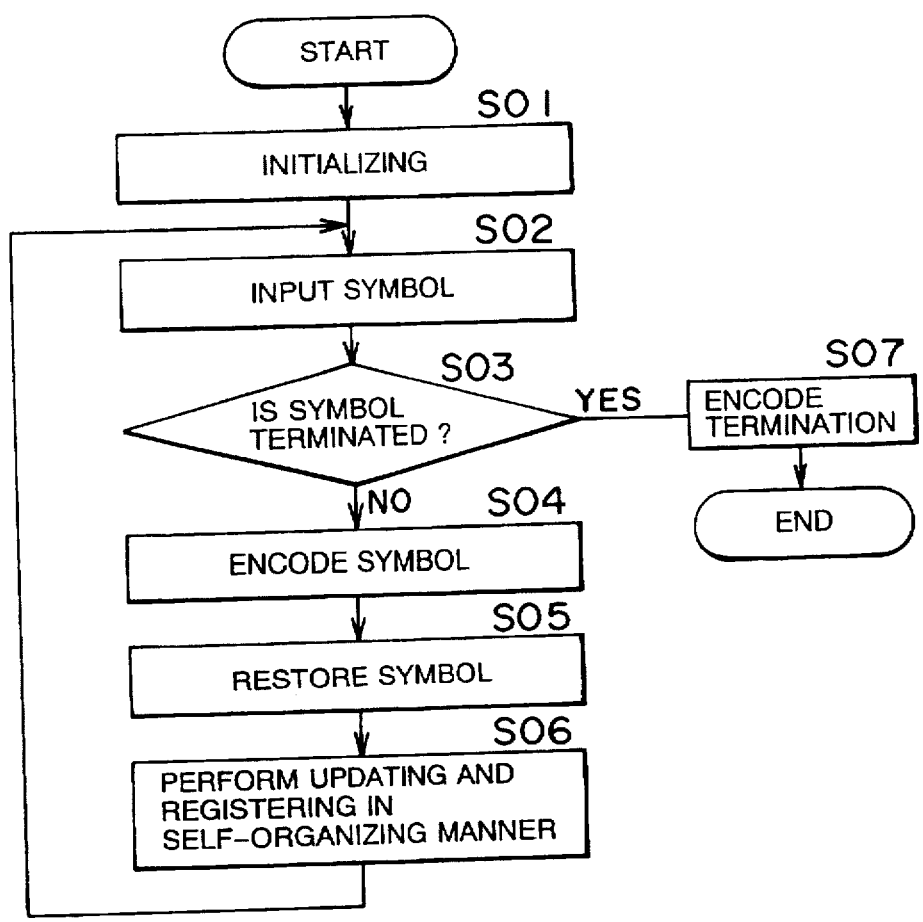
FIG. 1 is a flowchart illustrating the principle of compressing process in each embodiment of the present invention.
Figure 2:
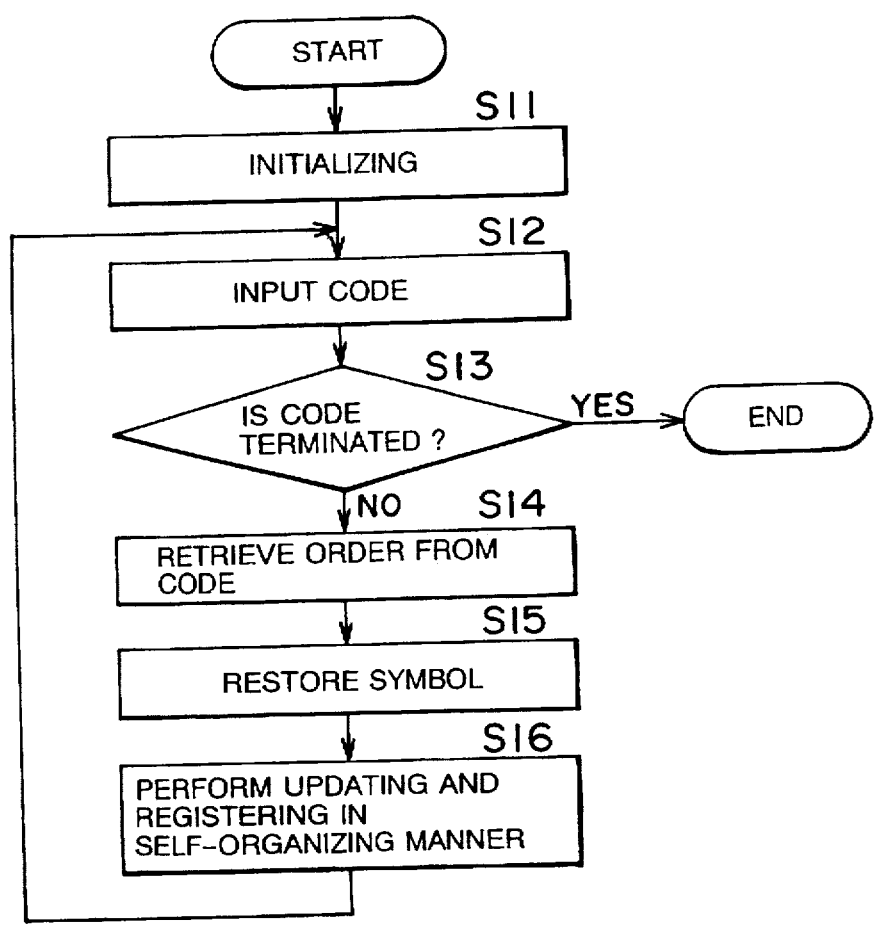
FIG. 2 is a flowchart illustrating the principle of restorating process in each embodiment of the present invention.

The principle common to the respective embodiments will be described with reference to FIGS. 3 and 4 in advance of explaining a specific construction of each embodiment of the present invention. FIG. 1 is a flowchart showing processing procedures when data compressed by an adaptive coding method. FIG. 2 is a flowchart showing processing procedures when the data which is compressed by the adaptive coding method restored.

The processes in FIG. 1 are executed when transmitting the data is transmitted, when the data is stored in a storage device, and so on. Referring to FIG. 1, initialization is effected in first step S01. That is, in the case of a method in which symbols are previously recorded, a file is searched, and there is generated a code tree including leaves written with all the symbols appeared (see FIG. 7(a)). On this occasion, probabilies of every symbols are not calculated, but the leaves are arranged in an arbitrary order. Then, nodes of a parent and an ancestor are formed based on these leaves till a root is obtained. On the contrary, in the case of a method in which symbols are not previously registerd and registered each time they appears, a code tree which consists of only the leaves corresponding to the non-appeared symbol (ESC code) and end symbol (EOF code) is created (see FIG. 15(a)).

In next step S02, a file is read, and the symbols (unit data) are inputted one by one. In subsequent step S03, whether the symbols are terminated or not is checked. If not terminated, the processing proceeds to step S04. In step S04, it is checked which order of the node the inputted symbol coincides with in the code tree. This order is a numeral labeled to each node and indicates a position of each node. Namely, the order of the root of the code tree is "0". The order becomes larger as the generation descends down to a generation of children, a generation of grandchildren and so on (The generation means a level of nodes which distanced the same from the root, which is hereinafter simply referred to as a "level"). The order also becomes larger as it approaches to more rightward positions within the same level (see FIG. 7(a)).

In next step S05, the inputted symbols are encoded in accordance with the retrieval order. That is, the processing involves tracing a path to the leaves positioned corresponding to the order retrieved from the root, sequentially picking up the code of "0" or "1" labeled to branches on that path and outputting the codes as a series of code words. Note that if there is no relevant leaf within the code tree in the case of the method in which symbols are not registered beforehand, a code word corresponding to the ESC and raw data (data before being compressed) are to be outputted.

In next step S06, the code tree is updated and registered in a self-organizing manner. This "updating in the self-organizing manner" implies that the code trees are reorganized autonomously in accordance with a given routine without calculating a probability of occurrence and comparing a frequency occurrence as well. Then, for encoding the next symbol, the updated code tree is registered, and the processing goes back to step S02.

If all the symbols within the file are terminated as a result of repeating the above loop, the processing proceeds to step S07 from step S03, wherein the end symbol (EOF) is encoded. In the case of the method in which symbols are not registered beforehand, the code word corresponding to EOF is outputted. Thereafter, the processing comes to an end.

FIG. 2 shows processes executed when the compressed data is received through the communications or when the compressed data is read out of the storage device. Referring to FIG. 2, in first step S11, absolutely the same process as step S01 in FIG. 1 is carried out, and absolutely the same code tree as that generated in FIG. 1 is generated. In subsequent step S12, the code word encoded in step S05 of FIG. 1 are inputted according to the encoded order thereof. In next step S13, it is checked whether or not the inputted code word indicates a termination, i.e., whether or not the inputted code word is a code encoded in step S07 of FIG. 1.

If the code does not indicate the termination, in step S14, the order is retrieved from the code. Namely, with the root of the code tree serving as an originating point, the branches are traced according to the order of "0" and "1" shown by the code word, and a node (leaf) of the corresponding order is searched.

In next step S15, the symbols are restored. That is, the symbols corresponding to the nodes (leaves) in the retrieved order are outputted. Note that if the symbol corresponding to the code word is an ESC code in the case of the method in which symbols are not registered, the data subsequent to this code word is defined as an item of raw data, and hence this item of raw data is outputted as it is.

In subsequent step S16, the code tree is updated and registered in the self-organizing manner. That is, the code tree is autonomously reorganized in accordance with absolutely the same routine as that in step S06 of FIG. 1. Accordingly, the code tree for restoration can be updated in exactly the same way in synchronization with the updating of the code tree for compression in FIG. 1. Then, for encoding the next symbol, the updated code tree is registered, and the processing is returned to step S12.

In the case of inputting the code word indicating the termination as a result of repeating the above loop, the processing ends up with step S13.

FIRST EMBODIMENT

A first embodiment of the present invention is characterized such that all the symbols are previously registered in the code tree, and the code tree is updated by a routine for exchanging a leaf corresponding to an occurred symbol, a parent node and an ancestor node for nodes that are higher in their order by ones.

<Construction of Hardware>

Figure 3:
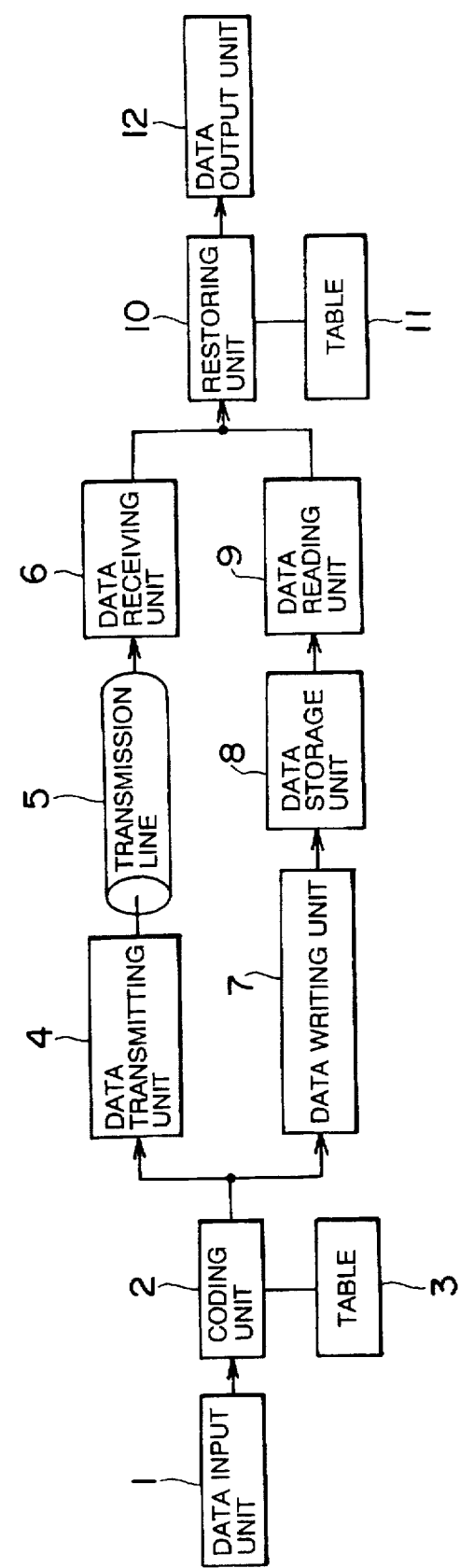
FIG. 3 is a block diagram illustrating a construction of hardware in a first embodiment of the present invention.

FIG. 3 is a block diagram illustrating a data compressing/restoring system in the first embodiment. Referring to FIG. 3, a data compressing apparatus is constructed of a data input unit 1, a coding unit 2, a table 3, a data transmitting unit 4 and a data writing unit 7. A data restoring apparatus is constructed of a data receiving unit 6, a data reading unit 9, a restoring unit 10, a table 11 and a data output unit 12.

The data input unit 1 defined as a data inputting means is a device for reading the data from an external storage device for storing the data files or a device for encoding data which is inputted from a man-machine interface such as a keyboard, a mouse, etc.

The coding unit 2 to which the data are transferred from this data input unit 1 is a device serving as a compression table updating means and a coding means executes a data compressing (coding) process. This coding unit 2 generates the code tree within the table (compression table) 3 and updates the code tree within the table 3 in the course of compressing (encoding) the data.

The data compressed (encoded) by the coding unit 2 are outputted to one of the data transmitting unit 4 and the data writing unit 7. This data transmitting unit 4 is a device for sending the compressed data to a transmission line 5 and transmitting the data to a remote place via a communication network. Further, the data writing unit 7 is a device for writing the compressed data to the data storage unit 8. This data storage unit 8 is a data storage device such as a hard disk, etc.

The data receiving unit 6 serving as a code inputting means receives the compressed data transmitted from the transmission line 5 and transfers the data to the restoring unit 10.

The restoring unit 10 is a device defined as a restoration table updating means and a data restoring means executes a data restoring process of the compressed data which is transferred. This restoring unit 10 generates a code tree within the table (restoration table) 11 and updates the code tree within the table 11 in the course of restoring the data. The data restored by the restoring unit 10 are transferred to the data output unit 12.

This data output unit 12 outputs the restored data to the external storage device, a display device or a printing device.

<Processing>

Processing in Coding Unit

Figure 4:
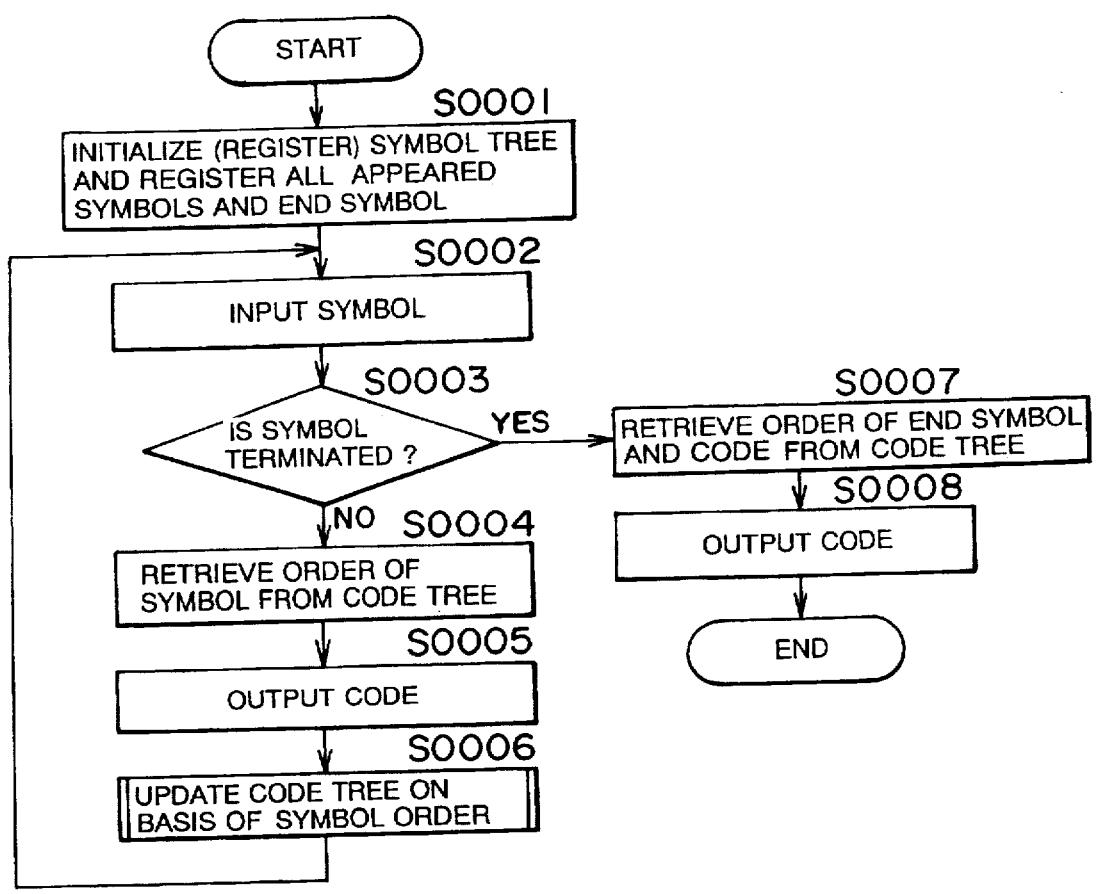
FIG. 4 is a flowchart showing a compressing process executed by a coding unit of FIG. 3.

FIG. 4 shows the processes for the data compression (encoding) executed by the coding unit 2 when the data are transferred from the data input unit 1. The processing in FIG. 4 starts when the coding unit 2 receives a file (data) to be compressed, which serves as a trigger.

In first step S0001 after the start, the code tree is initialized and registered in the table 3. That is, contents of the file inputted are searched, thus all the appeared symbols extracted. Then, a new code tree as illustrated in FIG. 7(a) is created, in which those extracted symbols and the end symbols serves as leaves.

When this code tree is created, the leaves corresponding to the respective symbols and the end symbols (EOF) are arranged in an arbitrary sequence. Then, every two leaves adjacent to each other are selected in the sequence from one side and connected via two branches to one internal node (parent node). The left branch of those two branches is labeled with a code "0", while the right branch thereof is labeled with a code "1". When all the leaves are thus connected to the internal nodes (parent nodes), every two internal nodes adjacent to each other are selected in the sequence from one side and connected via two branches to one internal node (grandparent node). Those two branches are labeled with the codes "0" or "1" in the same way as the above-mentioned. Such an operation continues till a connection to the only one root is attained. When connected to the only one root and all the nodes are organized into one code tree, a generation of the root is defined as a "level 0"; a generation of root's children is defined as a "level 1"; a generation of root's grandchildren is defined as a "level 2"; and a generation of root's great-grandchildren is defined as a "level 3". Further, the respective nodes are numbered. That is, the order goes down as the level goes down, wherein the root is "0". The respective nodes are sequentially numbered so that the order goes down from left to right within the same level. When completing the initialization of the code tree in this manner, the coding unit 2 stores the table 3 with this code tree. Further, the coding unit 2 transfers this code tree to the data receiving unit 6 via the communications line 5 or causes the data storage unit 8 to store this code tree.

In next step S0002, the symbols (letters) are taken one by one out of the inputted data (inputting of symbols). Checked in subsequent step S0003 is whether or not the symbols are taken out in step S0002, i.e., whether or not the symbols in the file are terminated. Then, if the symbols are not terminated, the processing proceeds to step S0004.

In step S0004, the order of the leaf corresponding to the symbol taken out in step S0002 is retrieved with reference to the code tree stored in the table 3. Then, the path from the root to the corresponding leaf is traced, and the codes of "0" or "1" labeled to the branches on that path are picked up in sequence, thus a series of code word obtained (corresponding to the coding means).

In next step S0005, the thus obtained code word is outputted to the data transmitting unit 4 or the data writing unit 7.

Figure 6:
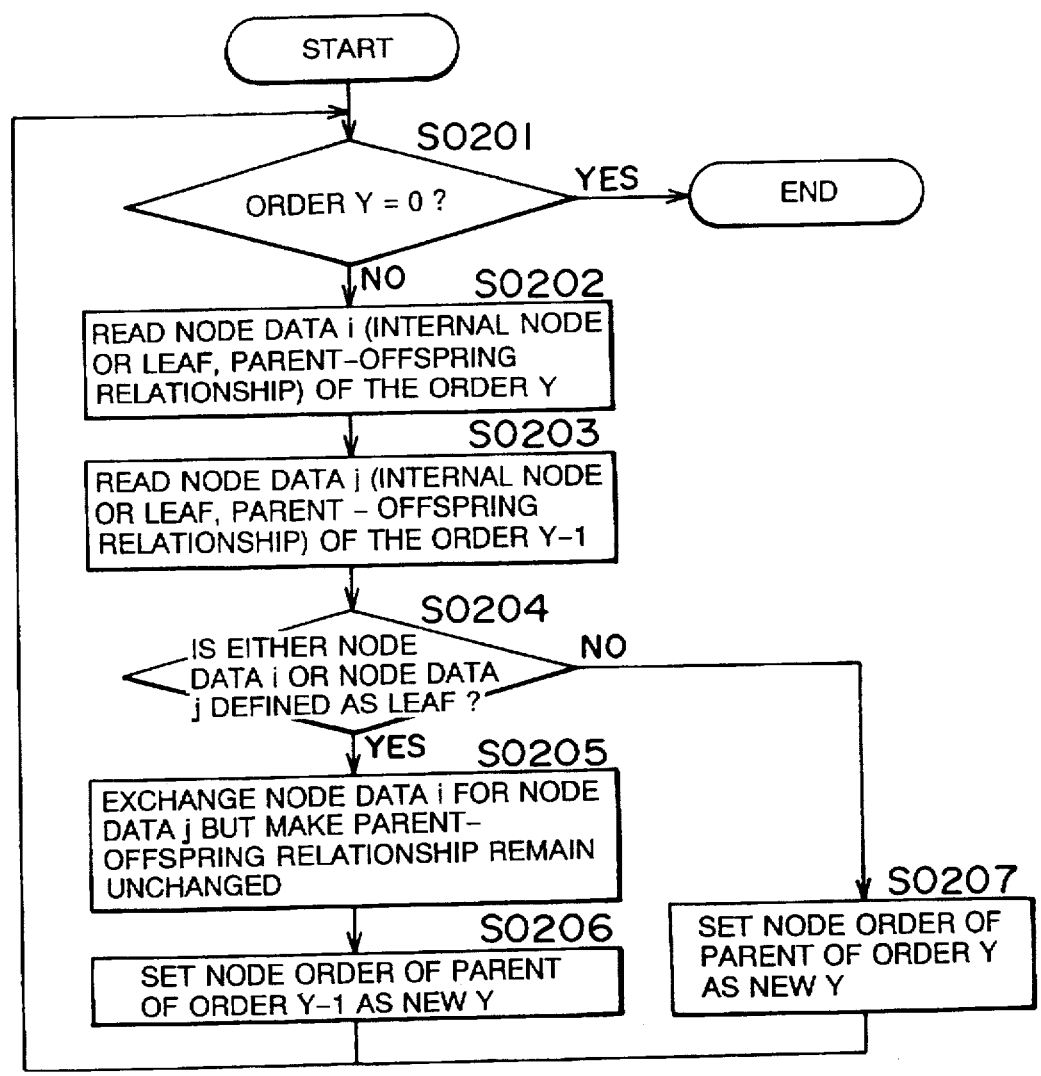
FIG. 6 is a flowchart showing an updating process subroutine for a code tree that is executed in step S0006 of FIG. 4 and step S0106 of FIG. 5.

In subsequent step S0006, the code tree is updated based on the order of the leaf corresponding to the symbol processed in this time that is retrieved in step S0004 (corresponding to the compression table updating means). FIG. 6 is a flowchart showing an updating process subroutine implemented in this step S0006.

In first step S0201 after entering the subroutine of FIG. 6, the order of the leaf corresponding to the symbol processed in this time is substituted into a variable "Y", and whether Y is 0 or not is checked. That the variable Y is not 0 implies that the order corresponds to a node other than the root, and, hence, the processing proceeds to step S0202.

In this step S0202, node data i of the order Y is read. This item of node data i indicates a substance of the symbol, a non-appeared symbol (ESC) or the end symbol (EOF) corresponding to this node. There are also, read a piece of data about whether this node is an internal node or a leaf and a piece of data about a parent-offspring relationship, with this node being centered.

In next step S0203, an item of node data j of the order Y−1 is read.

In next step S0204, whether the node of the order Y or the node of the order Y−1 is a leaf of not is checked, with reference the node data i read in step S0202 and the node data j read in step S0203.

When determining that one of those nodes is the leaf, the node data i is exchanged for the node data j in step S0205. The data about the relationship with the parent is, however, made to remain in the previous node. Namely, only the children data are replaced, and the children nodes shift together with the node data.

In subsequent step S0206, a node order of the parent of the order Y−1 is set to new Y, and the processing returned to step S201 to repeat the processed described above.

On the other hand, when determining that both two nodes are defined as internal nodes in step S0204, the node order of the parent of the order Y is set to new Y in step S0207 without performing the process in step S0205. Then, the processing is returned to step S0201 to repeat the processes given above.

If the order Y turns out 0 as a result of repeating the above processes, this indicates a case where the processed node becomes the root, and hence the processing returns to the main routine by terminating this subroutine in step S0201.

In the main routine of FIG. 4 to which the processing returns from FIG. 6, the processing goes back to step S0002 to execute the compressing process of the next symbol.

When determining that the symbols are terminated in step S0003 as a consequence of carrying out the above compressing process for all the symbols in the file, the processing proceeds to step S0007. In this step S0007, the order of the leaf corresponding to the end symbol (EOF) is retrieved with reference to the code tree within the table 3. Then, the path from the root to the leaf corresponding to the end symbol (EOF) is traced, and the codes of "0" or "1" labeled to the branches on that path are picked up in sequence, thus a series of code word obtained.

In next step S0008, the code word obtained in step S0007 are outputted to the data transmitting unit 4 or the data writing unit 7, thus this compressing (encoding) process finished.

Processing of Control in Restoring Unit

Figure 5:
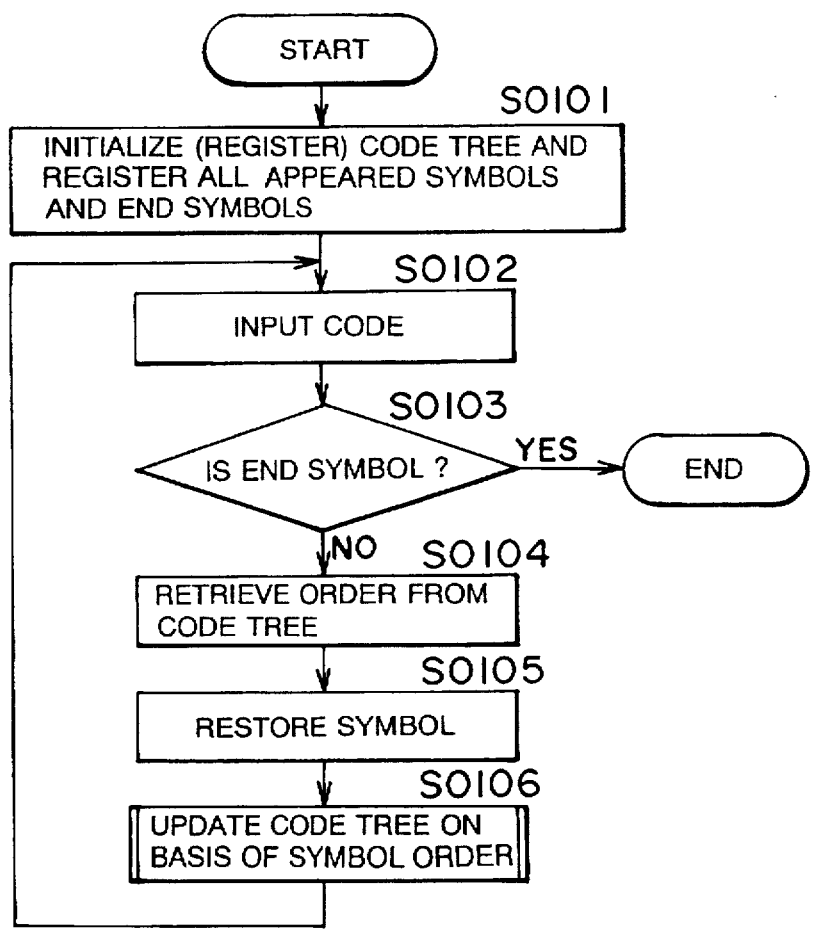
FIG. 5 is a flowchart showing a restoring process executed by a restoring unit of FIG. 3.

FIG. 5 shows the processes for a data restoration executed by the restoring unit 10. The processes start when the data receiving unit 6 receives the data or when the data reading unit 9 reads the data from the data storage unit 8 in accordance with an external indication, which serves as a trigger.

In first step S0101 after the start, the code tree is initialized and registered in the table 3. Namely, what the restoring unit 10 receives at first from the data receiving unit 6 or the data reading unit 9 is an item of data indicating the code tree itself initialized in step S0001 of FIG. 4. For this reason, the code tree in the initial status is generated from the data received and stored in the table 11.

In next step S0102, one of the code words corresponding to the symbols within the file is inputted in the receiving sequence (i.e., the sequence in which the data are compressed by the coding unit 2). Checked in subsequent step S0103 is whether or not the inputted code word corresponds to the end symbol (EOF) with reference to the code tree stored in the table 11. If it does not correspond to the end symbol, the processing proceeds to step S0104.

In this step S0104, the order of the leaf corresponding to the code word inputted in step S0102 is retrieved referring to the code tree stored in the table 11. That is, the branches are traced originating from the root of the code tree according to the sequence of "0" and "1" indicated by the code word, thus a node (leaf) of the corresponding order searched.

In next step S0105, a symbol corresponding to the leaf retrieved in step S0104 is outputted to the data output unit 12 (symbol restoration) (corresponding to the data restoring means).

In subsequent step S0106, the code tree stored in the table 11 is updated based on the order, retrieved in step S0105, of the leaf to which the symbol corresponding to the code processed in this time is written (corresponding to the restoration table updating means). Executed in this step S0106 is exactly the same process as that executed in step S0006 of FIG. 4, i.e., the subroutine of FIG. 6. Accordingly, the updating of the code tree stored in the table 11 goes on in absolutely the same way in synchronization with the code tree stored in the table 3. Upon a completion of step S0106, the processing is returned to step S0102 to restore a next code word.

When the above restoring process is implemented with respect to all the code words constituting the file are restored, and, it is determined in step S0103 that the code word corresponding to the end symbol is inputted, this restoring process is ended.

<Operation of Embodiment>

Figure 7:
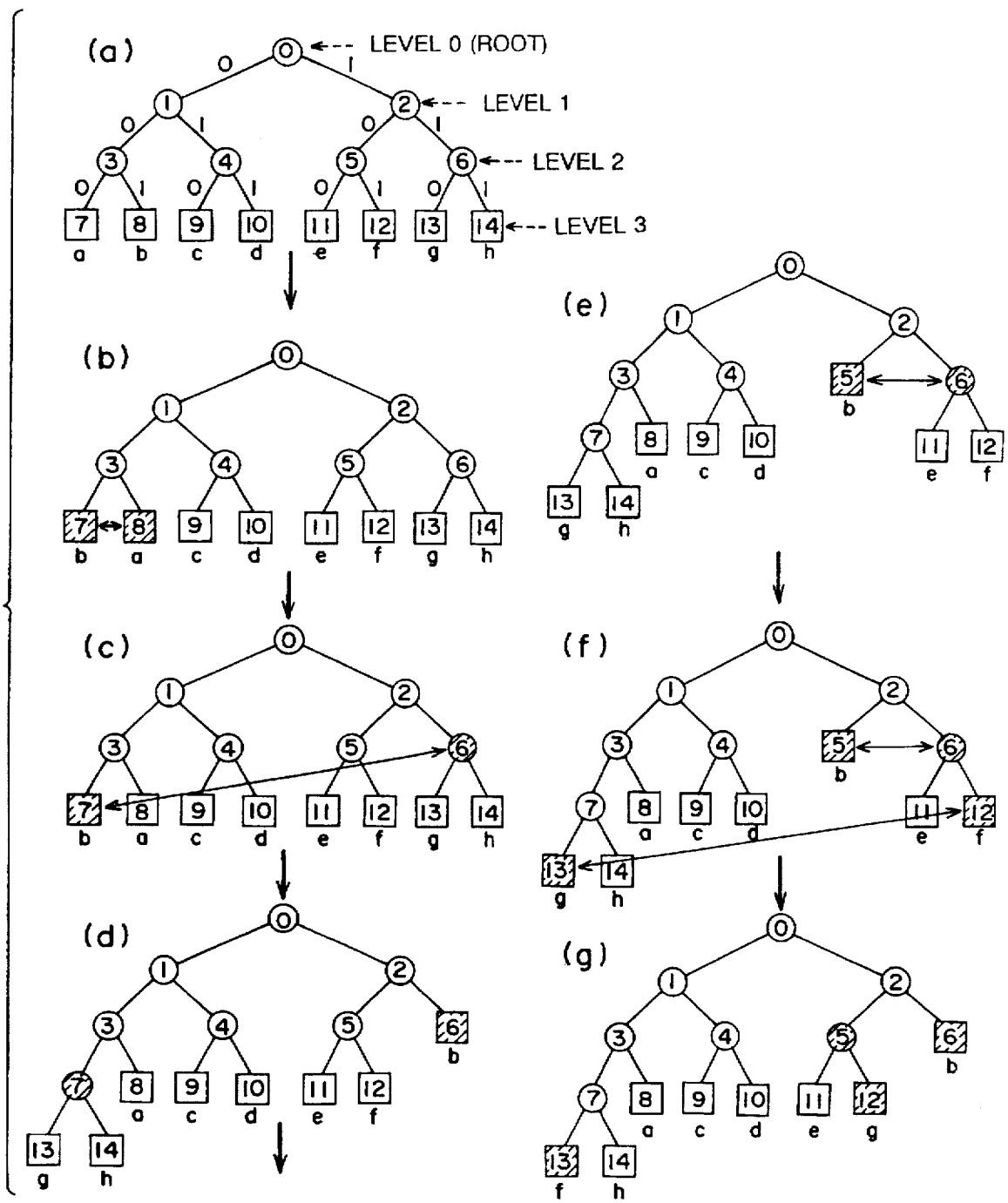
FIG. 7 is a explanatory drawing for an operation in the first embodiment of the present invention.

An operation of this embodiment constructed above will be discussed with reference to FIG. 7.

Now, it is assumed that the code tree in the table 3 is initialized as shown in FIG. 7(a). Then, it is also assumed that a symbol "b" appears at first. Hereupon, the coding unit 2 retrieves the code tree in a form shown in FIG. 7(a), thereby encoding the symbol into a code word of "001". The coding unit 2, after effecting the encoding, sets the leaf of the coded symbol "b" as a target node (node to be processed), and exchanges a position of this target node for a node of the order higher by one. Referring to FIG. 7(a), the order of the leaf corresponding to "b" is "8", and, therefore, it is exchanged for a node (leaf corresponding to "a") of the order "7". Note that each of a parent and ancestors (i.e., nodes of the orders "3", "1" and "0") of the node corresponding to "b" has, after being exchanged, no leaf at the node of the order higher by one, and hence the orders thereof are not exchanged. As a result, the form of the code tree after being updated goes as illustrated in FIG. 7(b).

On the other hand, in the initial status, the code tree taking the form shown in FIG. 7(a) is stored also in the table 11.

Accordingly, the restoring unit 10, upon receiving a code word of "001", retrieves the code tree in the form illustrated in FIG. 7(a), whereby the symbol "b" can be obtained. The restoring unit 10, after implementing this restoration, sets the leaf of the restored symbol "b" as a target node, and exchanges a position of this target node for a node of the order higher by one. That is, as in the same way with the code tree within the table 3, the position of the leaf corresponding to "b" is exchanged for the leaf corresponding to "a". As a consequence, the form of the code tree after being exchanged goes as shown in FIG. 7(b).

Next, it is assumed that the symbol "b" again appears in the coding unit 2. Hereupon, the coding unit 2 retrieves the code tree taking a form illustrated in FIG. 7(b) and thereby encodes the symbol into a code word of "000". The coding unit 2, after carrying out the encoding, sets the leaf of the encoded symbol "b" as a target node, and exchanges a position of this target node for a node of the order higher by one. Referring to FIG. 7(b), the order of the leaf corresponding to "b" is "7", and, therefore, it is exchanged for a node of the order "6" (see FIG. 7(c)). Note that when the node of the order "6" shifted, nodes of the children (i. e., nodes of the orders "13" and "14") connected thereto also shift together. Further, after the exchange, each of a parent and an ancestor (i. e., nodes of the orders "2" and "0") of the node corresponding to "b" has no leaf at the node of the order higher by one, and hence the orders thereof are not exchanged. As a result, the form of the code tree after being updated goes as illustrated in FIG. 7(d).

On the other hand, the restoring unit 10, upon receiving a code word of "000", retrieves the code tree in the form illustrated in FIG. 7(b), whereby the symbol "b" can be obtained. The restoring unit 10, after implementing this restoration, sets the leaf of the restored symbol "b" as a target node, and exchanges a position of this target node for a node of the order higher by one (see FIG. 7(c)). That is, as in the same way with the code tree within the table 3, the position of the leaf corresponding to "b" is exchanged for the node of the order "6". As a consequence, the form of the code tree after being exchanged goes as shown in FIG. 7(d).

Next, it is assumed that the symbol "b" again appears in the coding unit 2. Hereupon, the coding unit 2 retrieves the code tree taking a form illustrated in FIG. 7(d) and thereby encodes the symbol into a code word of "11". The coding unit 2, after carrying out the encoding sets the leaf of the encoded symbol "b" as a target node, and exchanges a position of this target node for a node of the order higher by one. Referring to FIG. 7(d), the order of the leaf corresponding to "b" is "6", and, therefore, it is exchanged for a node of the order "5". Note that when the node of the order "5" shifted, nodes of the children (i.e., nodes of the orders "11" and "12") connected thereto also shift together. Further, after the exchange, each of a parent and an ancestor (i. e., nodes of the orders "2" and "0") of the node corresponding to "b" has no leaf at the node of the order higher by one, and hence the orders thereof are not exchanged. As a result, the form of the code tree after being updated goes as illustrated in FIG. 7(e).

On the other hand, the restoring unit 10, upon receiving a code word of "11", retrieves the code tree in the form illustrated in FIG. 7(e), whereby the symbol "b" can be obtained. The restoring unit 10, after executing this restoration, sets the leaf of the restored symbol "b" as a target node, and exchanges a position of this target node for a node of the order higher by one. That is, as in the same way with the code tree within the table 3, the position of the leaf corresponding to "b" is exchanged for the node of the order "5". As a consequence, the form of the code tree after being exchanged goes as illustrated in FIG. 7(e).

Next, it is assumed that a symbol "g" appears. Hereupon, the coding unit 2 retrieves the code tree taking a form illustrated in FIG. 7(e) and thereby encodes the symbol into a code word of "0000". The coding unit 2, after carrying out the encoding, sets the leaf of the encoded symbol "g" as a target node, and exchanges a position of this target node for a node of the order higher by one. Referring to FIG. 7(e), the order of a leaf corresponding to "g" is "13", and, hence, it is exchanged for a node of the order "12" (see FIG. 7(f)). The coding unit 2, after carry out the exchanging sets a parent (i.e., node of the order "6") of the node corresponding to "g" as a target node, checkes whether the node of the order higher by one (i.e., made of the order "5") is a leaf or not. This node of the order "5" is a leaf (i. e., leaf corresponding to "b") and therefore exchanged for the node of the order "6". Note that when the node of the order "6" shifted, nodes of the children (i.e., nodes of the orders "11" and "12") connected thereto also shift together. Further, after the exchange, each of a parent and an ancestor (i. e., nodes of the orders "2" and "0") of the node of the order "5" has no leaf at the node of the order higher by one, and hence the orders thereof are not exchanged. As a result, the form of the code tree after being updated goes as illustrated in FIG. 7(g).

On the other hand, the restoring unit 10, upon receiving a code word of "0000", retrieves the code tree in a form illustrated in FIG. 7(e), whereby the symbol "g" can be obtained. The restoring unit 10, after performing this restoration, sets the leaf of the restored symbol "g" as a target node, and exchanges a position of this target node for a node of the order higher by one. That is, as in the same way with the code tree within the table 3, the position of the leaf corresponding to "g" is exchanged for the node of the order "12" (corresponding to ta symbol "f"). Further, the restoring unit 10 makes the node (of the order "6") of a parent thereof a target node, and exchanges a position of the target node for a node of the order higher by one. Namely, as in the same way with the code tree within the table 3, the position of the node of the order "6" is exchanged for the node of the order "5". As a result, the form of the code tree after being exchanged goes as shown in FIG. 7(g).

Table 1 shows fluctuations of the order of the nodes when the respective symbols appear in the sequence described above.

TABLE 1

| | Order of Node | | | | | | | | | | | | | | |
|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 |
| | . | . | . | . | . | . | . | a | b | c | d | e | f | g | h |
| b Appearance | . | . | . | . | . | . | . | b | a | c | d | e | f | g | h |
| b Appearance | . | . | . | . | . | . | b | . | a | c | d | e | f | g | h |
| b Appearance | . | . | . | . | . | b | . | . | a | c | d | e | f | g | h |
| g Appearance | . | . | . | . | . | . | b | . | a | c | d | e | g | f | h |
| | 1bit | | 2bits | | | 3bits | | | | 4bits | | | | | |

As obvious with paying attention to "b" and "g" in the table 1, as a symbol consecutively occurs, the order corresponding to the symbol goes up and, concomitantly with this, a length of the corresponding code word becomes shorter. Further, as the occurrence of the symbol discontinues, the order gradually goes down. On the occasion of updating such a code tree, since the data about a frequency of symbol occurrence is not given to each node, a using quantity of a memory can be saved. It is also possible to reduce a load on a processing unit (CPU) for actualizing functions of the coding unit 2 and of the restoring unit 10 because of no necessity for making a comparison of the frequency of occurrence and a recalculation thereof.

SECOND EMBODIMENT

A second embodiment of the present invention has the same construction as the first embodiment except for a substance of the updating process for the code tree that is executed in step S0006 of FIG. 4 and step S0106 of FIG. 5. Accordingly, descriptions for the same construction will be omitted.

<Processing>

In accordance with this second embodiment, a coding unit 4 executes the processes of FIG. 4, while the restoring unit 10 implements the processes of FIG. 5.

Figure 8:
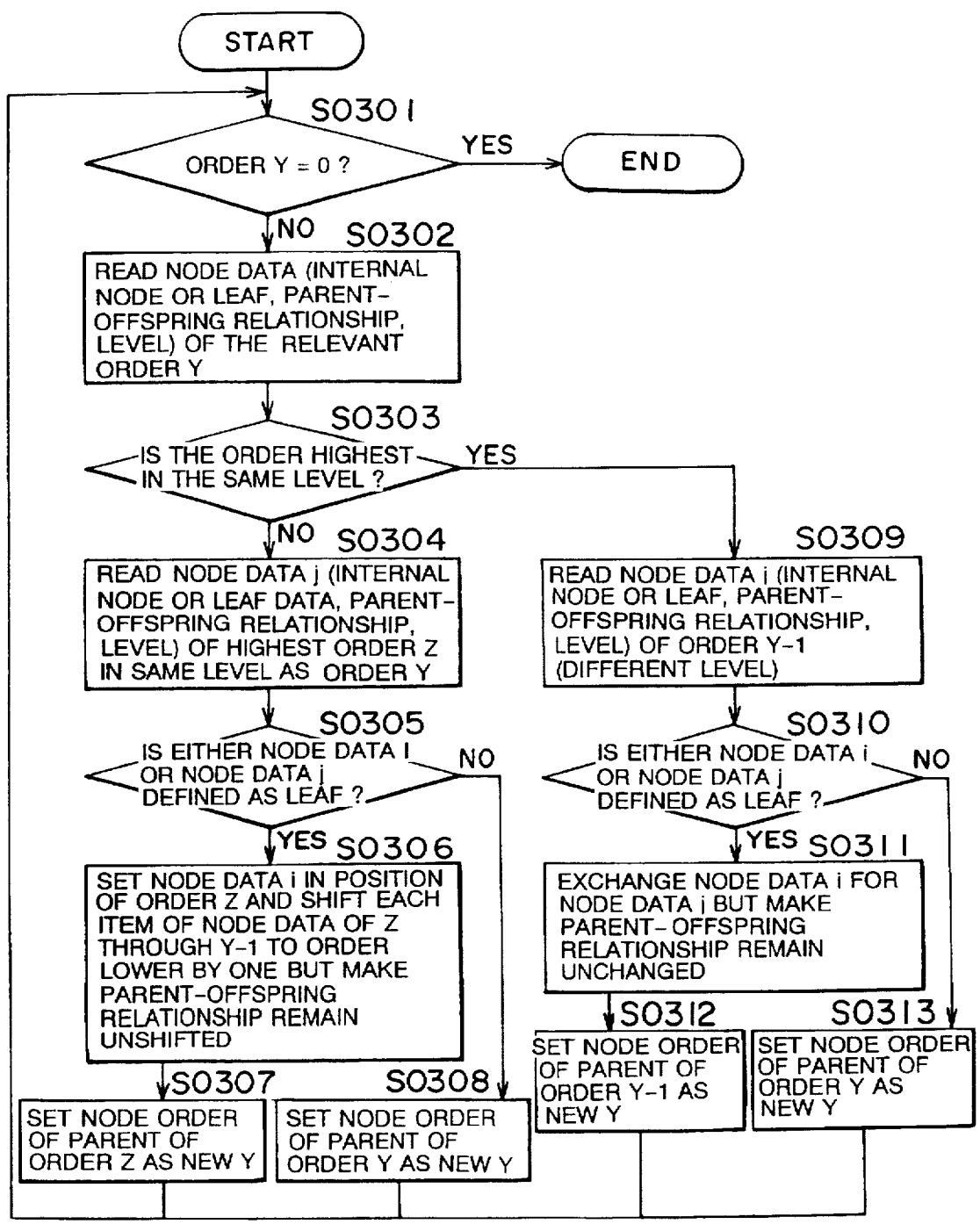
FIG. 8 is a flowchart showing the updating process subroutine for the code tree that is executed in step S0006 of FIG. 4 and step S0106 of FIG. 5 in a second embodiment of the present invention.

FIG. 8 is a flowchart showing an updating process subroutine for the code tree that is executed in step S0006 of FIG. 4 and in step S0106 of FIG. 5.

In first step S0301 after entering the subroutine of FIG. 8, the order of a leaf corresponding to a symbol processed in this time is substituted into a variable "Y", and whether Y is 0 or not is checked. That the variable Y is not 0 implies that the order corresponds to a node other than the root, and, hence, the processing proceeds to step S0302. In this step S0302, the node data i of the order Y is read. This item of node data i indicates a substance of the symbol, the non-appeared symbol (ESC) or the end symbol (EOF) corresponding to this node. There are simultaneously, however, read a piece of data about whether this node is an internal node or a leaf, a piece of data about a parent-offspring relationship with this node being centered and a piece of data about a level of this node.

Checked in next step S0303 is whether or not the order Y is the highest at its level. Then, if not the highest order, the processing proceeds to step S0304. Whereas if the order is highest, the processing proceeds to step S0309.

In step S0304, node data j of the highest order (referred to as "Z") at the same level as the order Y is read.

In next step S0305, the node data i read in step S0302 and the node data j read in step S0304 are referred to, thus whether the node of the order Y or the node of the order Z is a leaf or not is checked.

When determining that one of the nodes is defined as the leaf, in step S0306, the node data i is placed in a position of the order Z, and pieces of node data about the orders Z through Y−1 are each shifted down to the order lower by one. On this occasion, the data about the relationship with the parent contained in the node data of the respective nodes is left in the previous node. In next step S0307, the node order of the parent of the order Z S0301 to repeat the processes given above.

On the contrary, when determining that both two nodes are defined as internal nodes in step S0305, the node order of the parent of the order Y is set to new Y in step S0308 without performing the process in step S0306. Then, the processing is returned to step S0301 to repeat the processes described above.

On the other hand, in step S0309, node data j of the order Y−1 is read.

In next step S0310, the node data i read in step S0302 and the node data j read in step S0309 are referred to, and whether the node of the order Y or the node of the order Y−1 is a leaf or not is checked.

When determining that one of those nodes is the leaf, the node data i is exchanged for the node data j in step S0311. The data about the relationship with the parent is, however, made to remain in the previous node. In next step S0312, the node order of the parent of the order Y−1 is set to new Y, and the processing goes back to step S0301 to repeat the processes given above.

On the contrary, when determining that both two nodes are defined as internal nodes in step S0310, the node order of the parent of the order Y is set to new Y in step S0313 without performing the process in step S0311. Then, the processing is returned to step S0301 to repeat the processes described above.

If the order Y becomes 0 as a result of repeating the above processes, this indicates that the node to be processed is the root, and hence the processing returns to the main routing by terminating this subroutine in step S0301.

<Operation of Embodiment>

Figure 9:
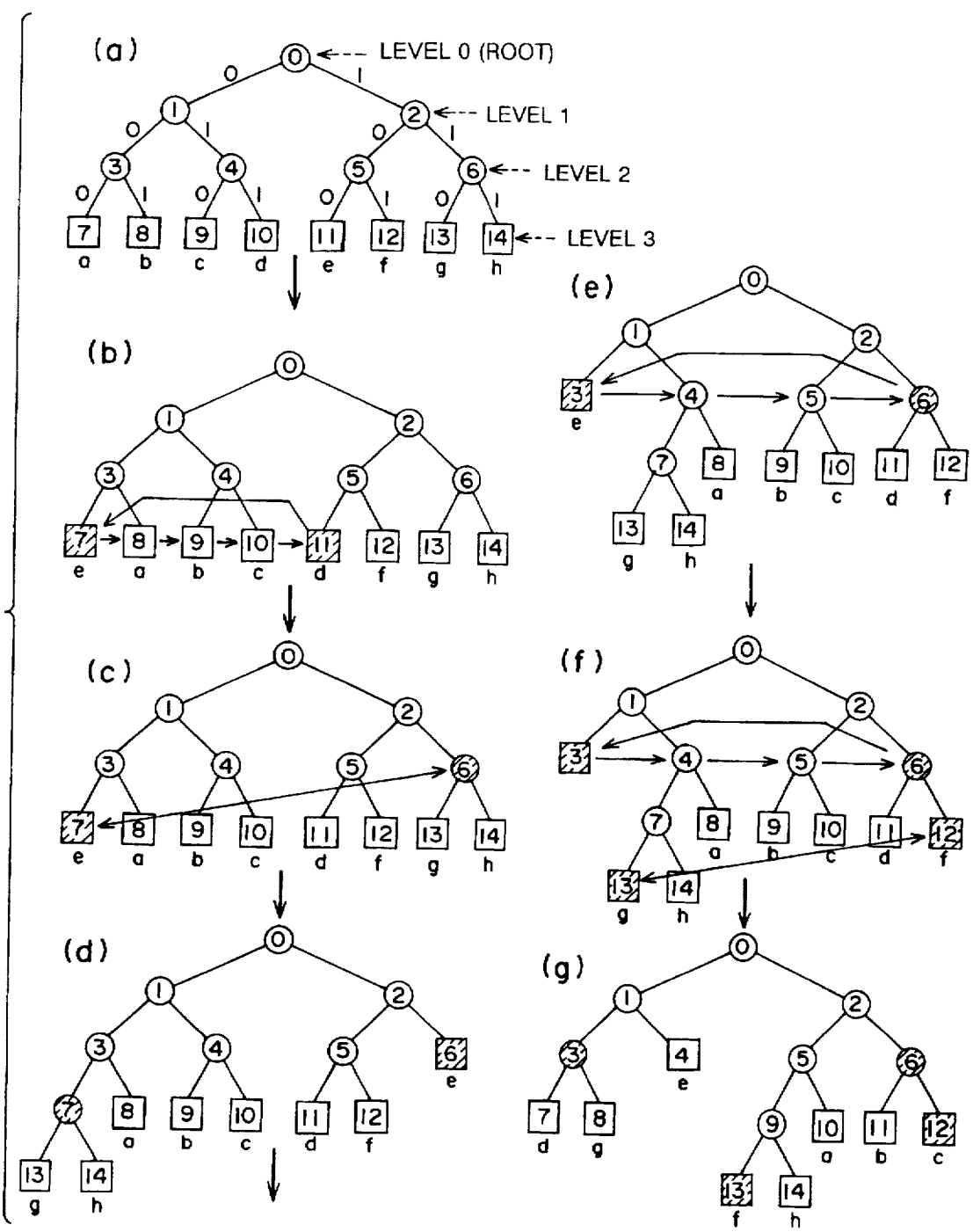
FIG. 9 is a explanatory drawing for an operation in the second embodiment of the present invention.

An operation of the thus constructed embodiment will be described with reference to FIG. 9.

Now, it is assumed that the code tree in the table 3 is initialized as shown in FIG. 9(a). Then, it is also assumed that a symbol "e" appears at first. Hereupon, the coding unit 2 retrieves the code tree in a form shown in FIG. 9(a), thereby encoding the symbol into a code word of "100". The coding unit 2, after effecting the encoding, sets the leaf of the coded symbol "e" as a target node (node to be processed). Then, a position of this target node is shifted to a position of the highest order within the same level, and the nodes ranging from the one previously positioned at the highest order to the one previously positioned just before the target node are shifted to let down their orders by one. In an example of FIG. 9(a), the order of a leaf corresponding to "e" is shifted to the highest order (i. e., order "7") within the level 3, and the leaves from the one corresponding to "a" to the one corresponding to "d" are shifted rightward one by one. Note that each of a parent and ancestors (i. e., nodes of the orders "3", "1" and "0") of the node corresponding to "e" is, after the exchange, of the highest order within their level, and hence their orders are not replaced. As a result, the form of the code tree after being updated goes as illustrated in FIG. 9(b).

On the other hand, in the initial status, the code tree taking the form shown in FIG. 9(a) is stored also in the table 11. Accordingly, the restoring unit 10, upon receiving a code word of "100", retrieves the code tree in the form illustrated in FIG. 9(a), whereby the symbol "e" can be obtained. The restoring unit 10, after implementing this restoration, sets the leaf of the restored symbol "e" as a target node, and shifts a position of this target node to a position of the highest order within the same level, and the nodes from the one previously positioned at the highest previous order to the one previously positioned just before the target node are shifted to let down the orders by one. That is, as in the same way with the code tree in the table 3, the position of the leaf corresponding to "e" is shifted to the position of the highest order within the same level. As a consequence of this, the form of the code tree after being updated goes as shown in FIG. 9(b).

Next, it is assumed that the symbol "e" again appears in the coding unit 2. Hereupon, the coding unit 2 retrieves the code tree taking a form illustrated in FIG. 9(b) and thereby encoding the symbol into the code word of "000". The coding unit 2, after carrying out the encoding, sets the leaf of the encoded symbol "e" as a target node. However, the position of this target node is of the highest order at the same level, and therefore the coding unit 2 exchanges a position of this target node for a node of the order higher by one. In an example of FIG. 9(b), the order of the leaf corresponding to "e" is "7", and, therefore, it is exchanged for a node of the order "6" (see FIG. 9(c)). Note that when the node of the order "6" shifted, nodes of the children (i. e., nodes of the orders "13" and "14") connected thereto also shift together. Further, after the exchange, each of a parent and an ancestor (i. e., nodes of the orders "2" and "0") of the node corresponding to "e" has no leaf at the node of the highest order within the same level, and hence the orders thereof are not exchanged. As a result, the form of the code tree after being updated goes as illustrated in FIG. 9(d).

On the other hand, the restoring unit 10, upon receiving the code word of "000", retrieves the code tree in the form illustrated in FIG. 9(b), whereby the symbol "e" can be obtained. The restoring unit 10, after implementing this restoration, sets the leaf of the restored symbol "e" as a target node, and exchanges a position of this target node for a node of the order higher by one (see FIG. 9(c)). Namely, as in the same way with the code tree within the table 3, the position of the leaf corresponding to "e" is exchanged for the node of the order "6". As a consequence, the form of the code tree after being exchanged goes as illustrated in FIG. 9(d).

Next, it is assumed that the symbol "e" again appears in the coding unit 2. Hereupon, the coding unit 2 retrieves the code tree taking a form illustrated in FIG. 9(d) and thereby encoding the symbol into the code word of "11". The coding unit 2, after carrying out the encoding, sets the leaf of the encoded symbol "e" as a target node. Then, the position of this target is shifted to a position of the highest order within the same level, and the nodes from the one previously positioned at the highest order to the one previously positioned just before the target node are shifted to let down their orders by one. In an example of FIG. 9(d), the order of a leaf corresponding to "e" is shifted to the highest order (i.e., order "3") of the level 2, and the nodes of the previous order "3" through the order "5" are shifted rightward one by one. Note that when the nodes of the previous order "3" through the order "5" shifted, nodes of the children connected thereto also shift together. Further, after the exchange, a parent and an ancestor (i.e., nodes of the orders "1" and "0") of the node corresponding to "e" are each of the highest order within their level, and hence the orders thereof are not exchanged. As a result, the form of the code tree after being updated goes as illustrated in FIG. 9(e).

On the other hand, the restoring unit 10, upon receiving the code word of "11", retrieves the code tree in the form illustrated in FIG. 9(d), whereby the symbol "e" can be obtained. The restoring unit 10, after implementing this restoration, sets the leaf of the restored symbol "e" as a target node, and shifts a position of this target node to a position of the highest order within the same level, and the nodes from the one previously positioned at the highest order to the one previously positioned just before the target node are shifted to let down their orders by one. Namely, as in the same way with the code tree in the table 3, the position of the leaf corresponding to "e" is shifted to the position of the highest order within the same level. As a consequence of this, the form of the code tree after being updated goes as shown in FIG. 9(e).

Next, it is assumed that the symbol "g" appears. Hereupon, the coding unit 2 retrieves the code tree taking a form illustrated in FIG. 9(e) and thereby encoding the symbol into a code word of "0100". The coding unit 2, after carrying out the encoding, sets the leaf of the encoded symbol "g" as a target node. However, the position of this target node is of the highest order at the same level, and therefore the coding unit exchanges a position of this target node for a node of the order higher by one. In an example of FIG. 9(f), the order of the leaf corresponding to "g" is "13", and, therefore, it is exchanged for a node of the order "12" (see FIG. 9(f)). After the exchange, a parent (i. e., node of the order "6") of the node corresponding to "g" is set as a target node. Since the node of the highest order within the same level as this target node is a leaf (corresponding to "e"), a position of this target node is shifted to the position of the highest order within the same level, and the nodes from the one previously positioned at the highest order to the one previously positioned just before the target node are shifted to let down their orders by one. In the example of FIG. 9(f), the order of the node of the order "6" is shifted to the highest order (i.e., order "3") at the level 2, and the nodes of the orders "3" through "5" are shifted rightward one by one. Note that when the nodes of the previous order "3" through the order "5" shifted, nodes of the children connected thereto also shift together. Further, after the exchange, a parent and an ancestor (i.e., nodes of the orders "1" and "0") of the node of the order "3" are each of the highest order within their level, and hence the orders thereof are not exchanged. As a result, the form of the code tree after being updated goes as illustrated in FIG. 9(g).

On the other hand, the restoring unit 10, upon receiving a code word of "0100", retrieves the code tree in the form illustrated in FIG. 9(e), whereby the symbol "g" can be obtained. The restoring unit 10, after implementing this restoration, sets the leaf of the restored symbol "g" as a target node, and exchanges a position of this target node for a node of the order higher by one. Namely, as in the same way with the code tree in the table 3, the position of the leaf corresponding to "g" is exchanged for the node of the order "12" (see FIG. 9(f)). Further, the restoring unit 10, sets a parent (i.e., node of the order "6") of the node corresponding to "g" as a target node, shifts a position of this target node to a position of the highest order within their level, and shifts the nodes from the one previously positioned at the highest order to the one previously positioned just before the target node to let down their orders by one. That is, as in the same way with the code tree in the table 3, the position of the node of the order "6" is shifted to the position of the highest order within their level. As a consequence of this, the form of the code tree after being updated goes as shown in FIG. 9(g).

Table 2 shows fluctuations of the order of the nodes when the respective symbols appear in the sequence described above.

TABLE 2

| | Order of Node | | | | | | | | | | | | | | |
|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 |
| | . | . | . | . | . | . | . | a | b | c | d | e | f | g | h |
| e Appearance | . | . | . | . | . | . | . | e | a | b | c | d | f | g | h |
| e Appearance | . | . | . | . | . | . | e | . | a | b | c | d | f | g | h |
| e Appearance | . | . | . | e | . | . | . | . | a | b | c | d | f | g | h |
| g Appearance | . | . | . | e | . | . | d | g | . | a | b | c | f | h | |
| | 1bit | | 2bits | | | | 3bits | | | | 4bits | | | | |

As obvious with paying attention to "e" and "g" in the table 2, in the case that same symbol occures consecutively, the order corresponding to the symbol goes up faster than in the first embodiment. Namely, if the same symbol occurs twice consecutively, the level of the leaf corresponding thereto invariably goes up by one, and the length of the code word shortens by one bit. Accordingly, the effect produced by the first embodiment is further improved in ths second embodiment, with the result that the compression efficiency can be enhanced.

THIRD EMBODIMENT

A third embodiment of the present invention has the same construction as the first embodiment except for a substance of the updating process for the code tree that is executed in step S0106 of FIG. 5 as well as in step S0006 of FIG. 4. Accordingly, descriptions for the same construction.

<Processing>

In accordance with the third embodiment, a coding unit 4 executes the processes of FIG. 4, while the restoring unit 10 implements the processes of FIG. 5.

Figure 10:
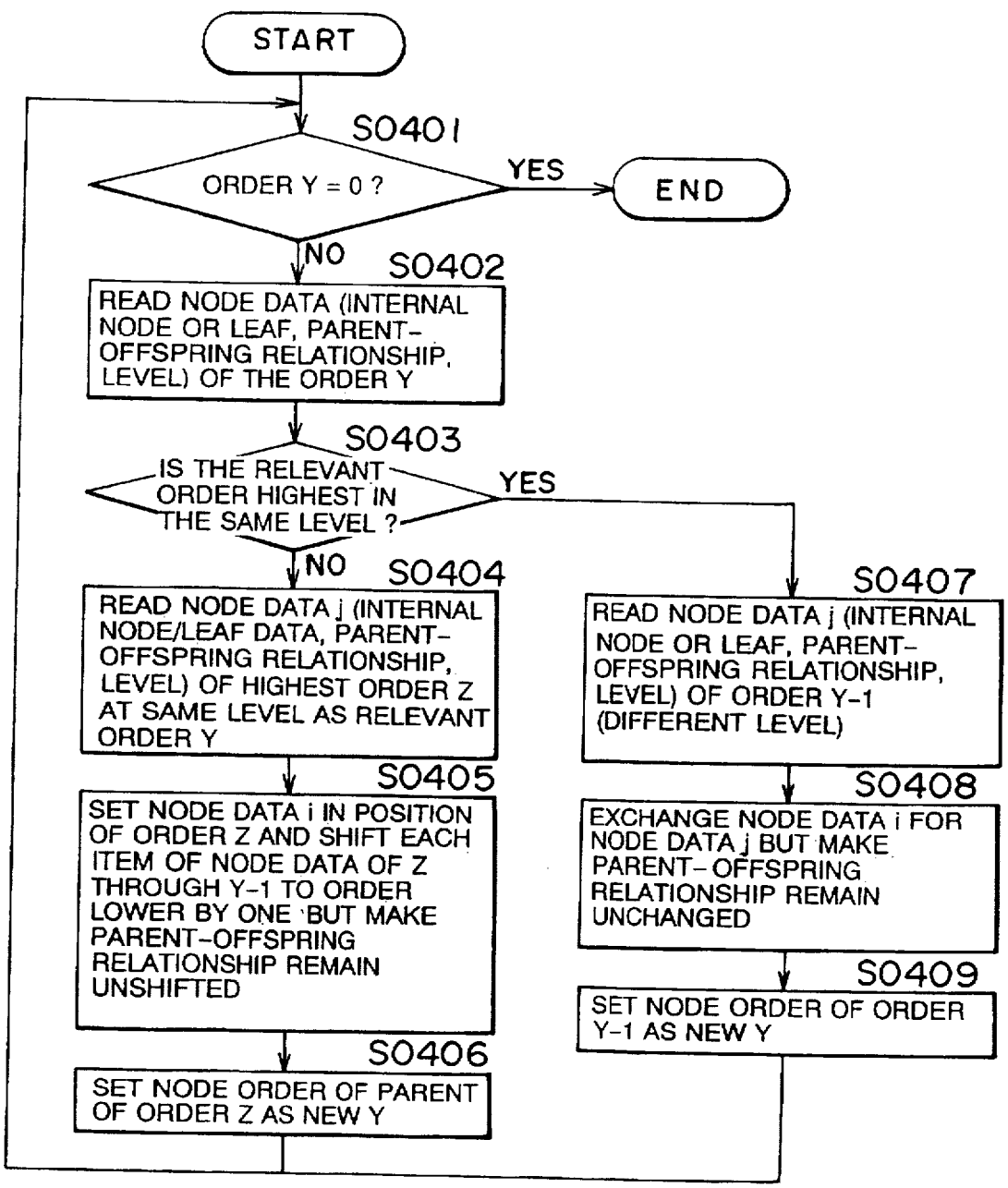
FIG. 10 is a flowchart showing the updating process subroutine for the code tree that is executed in step S0006 of FIG. 4 and step S0106 of FIG. 5 in a third embodiment of the present invention.

FIG. 10 is a flowchart showing an updating process subroutine of the code tree that is executed in step S0006 of FIG. 4 and in step S0106 of FIG. 5.

In first step S0401 after entering the subroutine of FIG. 10, the order of a leaf corresponding to a symbol processed in this time is substituted into the variable "Y", and whether Y is 1 or not is checked. If the variable Y is not 1, the processing proceeds to step S0402.

In this step S0402, the node data i of the order Y is read. This item of node data i indicates a substance of the symbol, the non-appeared symbol (ESC) or the end symbol (EOF) corresponding to this node. There are simultaneously, however, read a piece of data about whether this node is an internal node or a leaf, a piece of data about a parent-offspring relationship with this node being centered and a piece of data about a level of this node.

Checked in next step S0403 is whether or not the order Y is the highest at its level. Then, if not the highest order, the processing proceeds to step S0404. Whereas if the order is highest, the processing proceeds to step S0407.

In step S0404, node data j of the highest order (referred to as "Z") at the same level as the order Y is read. In next step S0405, the node data i is set in a position of the order Z, and the node data from the order Z to the order Y-1 are each shifted to the order lower by one (inserting process). On this occasion, the data about the relationship with the parent contained in the node data of the respective nodes is left in the previous node. In next step S0406, the node order of the order Z is set to new Y, and the processing is returned to step S0401 to repeat the processes given above.

On the other hand, the node data j of the order Y-1 is read in step S0407. In next step S0408, the node data i is exchanged for the node data j (exchanging process). The data about the relationship with the parent is, however, left in the previous node. In next step S0409, the node order of the parent of the order Y-1 is set to new Y, and the processing is returned to step S0401 to repeat the processes described above.

If the order Y becomes 1 as a result of repeating the processes described above, this implies that the node to be processed turns out a next node of the root, and therefore the processing returns to the main routing by terminating this subroutine in step S0401.

<Operation of Embodiment>

Figure 11:
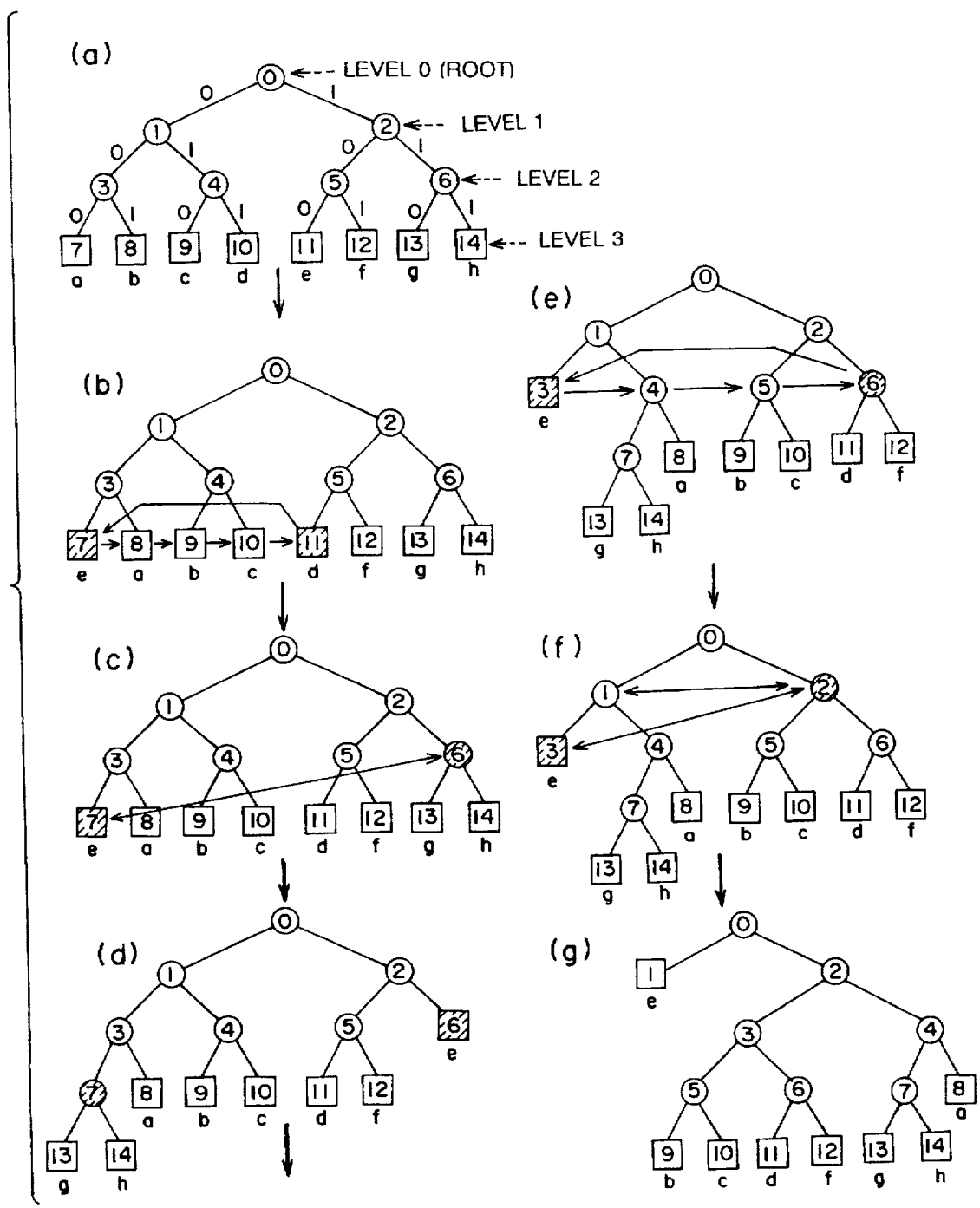
FIG. 11 is a explanatory drawing for an operation in the third embodiment of the present invention.

An operation of the thus constructed embodiment will be described with reference to FIG. 11.

Now, it is assumed that the code tree in the table 3 is initialized as shown in FIG. 11(a). Then, it is also assumed that the symbol "e" appears. Hereupon, the coding unit 2 retrieves the code tree in a form shown in FIG. 11(a), thereby encoding the symbol into the code word of "100". The coding unit 2, after effecting the encoding, sets the leaf of the coded symbol "e" as a target node (node to be processed). Then, a position of this target node is shifted to a position of the highest order within the same level, and the nodes from the one previously positioned at the highest previous order to the one previously positioned just before the target node are shifted to let down their orders by one. In an example of FIG. 11(a), the order of a leaf corresponding to "e" is shifted to the highest order (order "7") within the level 3, and the leaves from the one corresponding to "a" to the one corresponding to "d" are shifted rightward one by one (see FIG. 11(b)).

Next, the coding unit 2 sets the leaf corresponding to "e" after being shifted as a target node, and exchanges it for a node of the order higher by one. In the status of FIG. 11(b), the order of the leaf corresponding to "e" is "7", and hence it is exchanged for the node of the order "6" (see FIG. 11(c)). Note that when the node of the order "6" shifted, nodes of the children (i.e., nodes of the orders "13" and "14") connected thereto also shift together (see FIG. 11(d)).

Next, the leaf corresponding to "e" after being exchanged is set as a target node. Then, the position of this target is shifted to a position of the highest order within the same level, and the nodes from the one previously positioned at the highest order to the one previously positioned just before the target node are shifted to let down their orders by one. In an example of FIG. 11(d), the order of a leaf corresponding to "e" is shifted to the highest order (i.e., order "3") of within the level 2, and the nodes of the previous order "3" through the order "5" are shifted rightward one by one. Note that when the nodes of the previous order "3" through the order "5" shifted, nodes of the children connected thereto also shift together (see FIG. 11(e)).

Next, the leaf corresponding to "e" after being shifted is set as a target node, and it is exchanged for the node of the order higher by one. In the status of FIG. 11(e), the order of the leaf corresponding to "e" is "3", and hence it is exchanged for the node of the order "2" (see FIG. 11(f)). Further, it is exchanged for the node of the highest order within the level. As a result of the above, the order of the leaf corresponding to "e" rises up to the order "1" positioned next to the root (see FIG. 11(g)).

On the other hand, in the initial status, the code tree taking the form shown in FIG. 11(a) is stored also in the table 11. Accordingly, the restoring unit 10, upon receiving the code word of "100", retrieves the code tree in the form illustrated in FIG. 13(a), whereby the symbol "e" can be obtained. The restoring unit 10, after implementing this restoration, sets the leaf of the restored symbol "e" as a target node, and updates the code tree as in the same way with the coding unit 2. As a consequence, the form of the code tree after being updated goes as shown in FIG. 11(g).

Table 3 shows fluctuations in terms of the order of the node when the respective symbols appear in the sequence described above.

TABLE 3

| | | | | Order of Node | | | | | | | | | | |
|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 |
| . | . | . | . | . | . | . | a | b | c | d | e | f | g | h |
| e Appearance . | . | . | . | . | . | . | e | a | b | c | d | f | g | h |
| . | . | . | . | . | . | e | . | a | b | c | d | f | g | h |
| . | . | . | e | . | . | . | . | a | b | c | d | f | g | h |
| . | e | . | . | . | . | b | . | a | b | c | d | f | g | h |
| | 1bit | | 2bits | | | | | | | 3bits | | | 4bits | |

As obvious with paying attention to "e" in the table 3, even the symbol registered in any order can be shifted to the order "1" simply with one occurrence. That is, the code length of the code word becomes 1 bit. Accordingly, the effects produced by the first and second embodiments are further improved in this third embodiment, and the compression efficiency can be enhanced.

FOURTH EMBODIMENT

A fourth embodiment of the present invention has such a characteristic that the symbol is registered in the code tree not previously but each time a new symbol occurs.

<Construction of Hardware>

A construction of the hardware in this embodiment is the same as that in the first embodiment. Hence, its description will be omitted.

<Processing of Control>

Processing in Coding Unit

Figure 12:
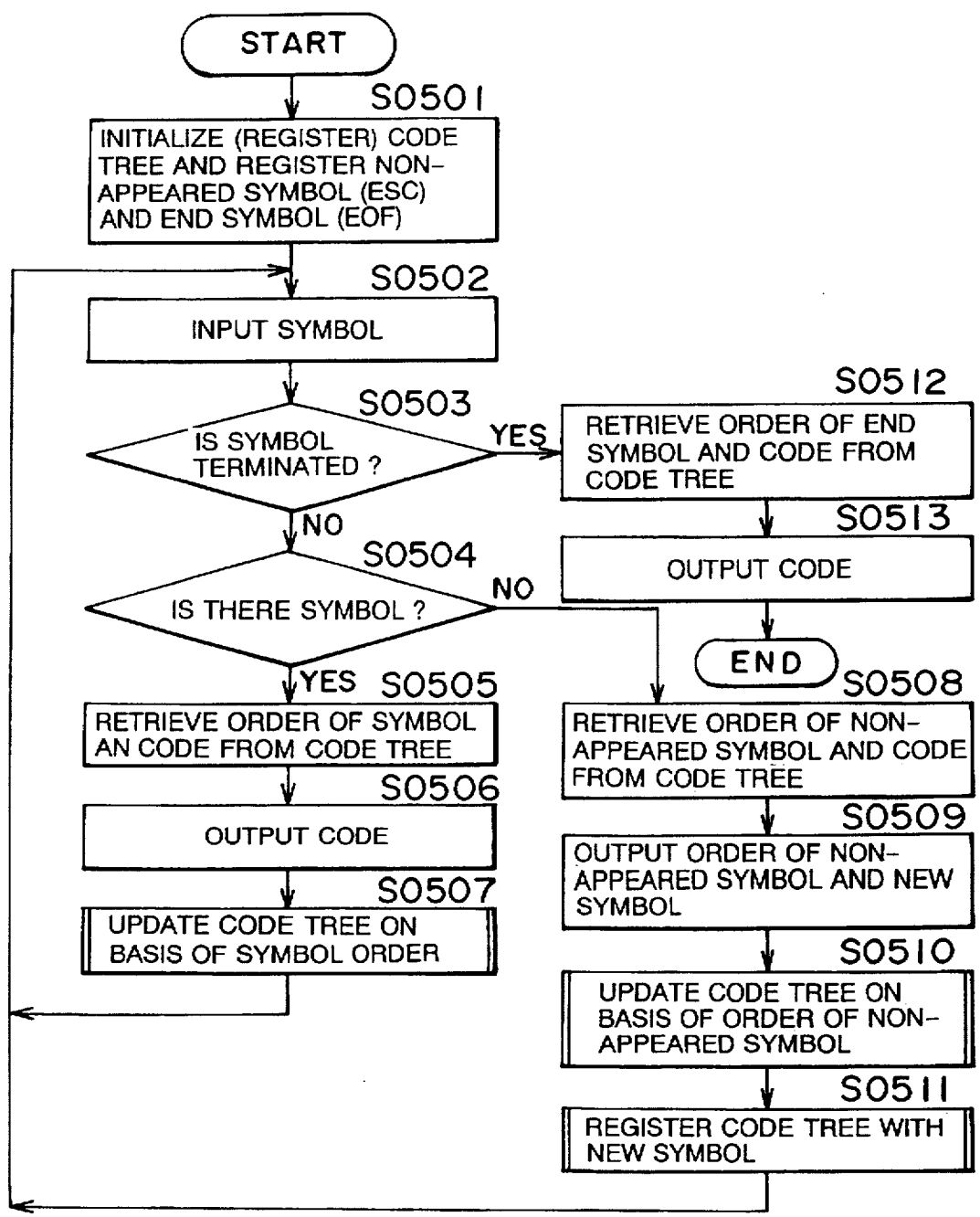
FIG. 12 is a flowchart showing a compressing process executed by the coding unit of FIG. 3 in a fourth embodiment of the present invention.

FIG. 12 shows the processes for the data compression (encoding) executed by the coding unit 2 when the data are transferred from the data input unit 1. The processing in FIG. 12 starts when the coding unit 2 receives a file (data) to be compressed, which serves as a trigger.

In first step S0501 after the start, the code tree is initialized and registered in the table 3. That is, as illustrated in FIG. 15(a), only a leaf corresponding to the end symbol (EOF) and a leaf corresponding to the non-appeared symbol (ESC) are connected via two branches to the only one root, thus generating a code tree. Then, the left branch connected to the end symbol (EOF) is labeled with the code "0", while the right branch connected to the non-appeared symbol (ESC) is labeled with the code "1". Subsequently, the order "0" is given to the root; the order "1" is given to the end symbol (EOF); and the order "2" is given to the non-appeared symbol (ESC). When completing the initialization of the code tree in this manner, the coding unit 2 stores the table 3 with this code tree.

In next step S0502, the symbols (letters) are taken one by one out of the inputted data (inputting of symbols). Checked in next step S0503 is whether or not the symbols are taken out in step S0502, i.e., whether or not the symbols in the file are terminated. Then, if the symbols are not terminated, the processing proceeds to step S0504.

In step S0504, whether or not the leaf corresponding to the symbol taken out in step S0502 has already been registered is checked with reference to the code tree stored in the table 3. Then, if the symbol is not yet registered, the processing proceeds to step S0508. Whereas if the symbol has already been registered, the processing proceeds to step S0505 (corresponding to data registration/non-registration determining means).

In step S0508 when the symbol is not yet registered, the order of the leaf corresponding to the non-appeared symbol (ESC) is retrieved with reference to the code tree stored in Table 3. Then, the path extending from the root to the leaf corresponding to the non-appeared symbol (ESC) is traced, and the codes of "0" or "1" labeled to the branches on that path are picked up in sequence, thus obtaining a series of code word.

In next step S0509, the code word obtained in step S0508 are outputted to the data transmitting unit 4 or the data writing unit 7, and, thereafter, raw data (non-compressed data) of the new symbol taken out in step S0502 is outputted (corresponding to coding means).

In next step S0510, the code tree is updated on the basis of the order of the leaf corresponding to the non-appeared symbol (ESC) retrieved in step S0508. The updating process of this code tree is done by executing the processes of FIG. 6. If the processes of FIG. 6 are carried out as a subroutine in this step S0510, however, the target node to be processed is the leaf corresponding to the non-appeared symbol (ESC).

Figure 14:
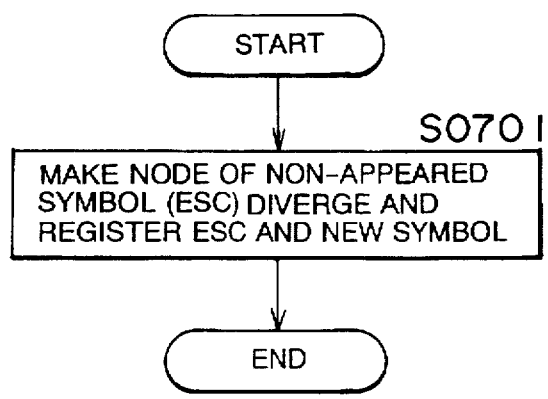
FIG. 14 is a flowchart showing a registering process subroutine for a new symbol with respect to the code tree that is executed in step S0511 of FIG. 12 and step S0611 of FIG. 13.

In the main routine of FIG. 12 to which the processing was returned from FIG. 8, the new item of data taken out in step S0502 is registered in the code tree in step S0511 (corresponding to compression table updating means). FIG. 14 is a flowchart showing a subroutine for registering the new symbols that is to be executed in step S0511.

Figure 15:
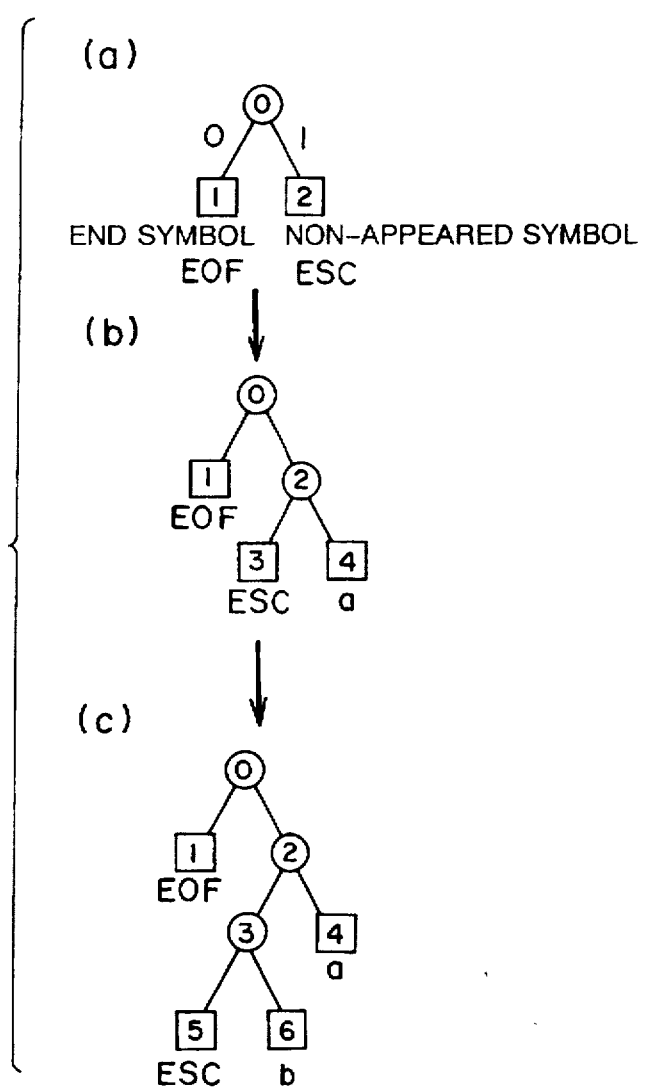
FIG. 15 is an explanatory drawing for the processes of FIG. 14.
Figure 16:
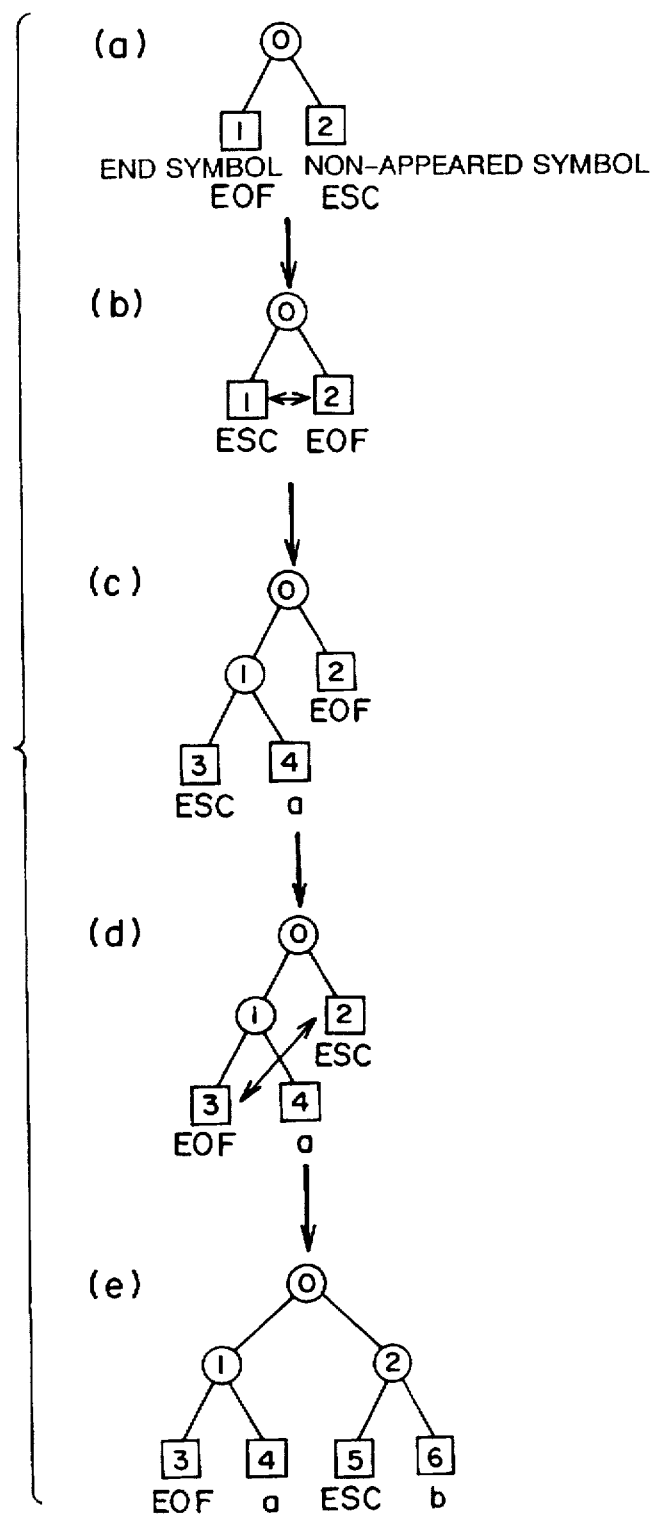
FIG. 16 is a explanatory drawing for the operation in fourth embodiment of the present invention.

In first step S0701 after entering this subroutine, the node corresponding to the non-appeared symbol (ESC) in the code tree branches off, and the non-appeared symbol (ESC) and the new symbol are registered in newly generated two leaves. On this occasion, the leaf corresponding to the non-appeared symbol (ESC) is disposed leftward so that the order thereof is higher than the leaf corresponding to the new symbol. FIG. 15 illustrates how the code tree varies due to an implementation of the subroutine of FIG. 14. FIG. 15(a) illustrates an initializing status. FIG. 15(b) shows a status after generating a new symbol "a". FIG. 15(c) depicts a status after generating a new symbol "b" (Note that the code tree is, as a matter of fact, updated and therefore varies as shown in FIG. 16.). Table 4 shows fluctuations of the node order in this case.

TABLE 4

| | | | Order of Node | | | |
|---|---|---|---|---|---|---|
| | 0 | 1 | 2 | 3 | 4 | 5 | 6 |
| Initial | . | EOF | ESC | | | | |
| Registration | | | | | | | |
| a Registration | . | EOF | . | ESC | a | | |
| b Registration | . | EOF | . | . | a | ESC | b |
| | | 1bit | | | 2bits | | |

When completing the execution of step S0701, the subroutine of FIG. 14 is finished, and the processing returns to the main routine.

In the main routine of FIG. 12 to which the processing is returned from FIG. 14, the processing goes back to step S0502 to perform the compressing process of the next symbol.

On the other hand, in step S0505 when determining that the symbol is not yet registered in step S0504, the order of the leaf corresponding to the symbol taken out in step S0502 is retrieved with reference to the code tree stored in the table 3. Then, the path from the root to the corresponding leaf is traced, and the codes of "0" or "1" labeled to the branches on that path are picked up in sequence, thus a series of code word obtained.

In next step S0506, the thus obtained code word is outputted to the data transmitting unit 4 or the data writing unit 7 (corresponding to coding means).

In next step S0507, the code tree is updated based on the order of the leaf corresponding to the symbol processed in this time that is retrieved in step S0505 (corresponding to compression table updating means). The updating process of this code tree is done by executing the processes of FIG. 8. If the processes of FIG. 8 are carried out as the subroutine in this step S0510, however, the target node to be processed is defined as the leaf corresponding to the symbol taken out in step S0502.

In the main routine of FIG. 14 to which the processing is returned from FIG. 6, the processing goes back to step S0502 to perform the compressing process of the next symbol.

When determining that the symbols are terminated in step S0503 as a result of effecting the above compressing process with respect to all the symbols in the file, the processing proceeds to step S0512. In this step S0512, the order of the leaf corresponding to the end symbol (EOF) is retrieved with reference to the code tree within the table 3. Then, the path from the root to the leaf corresponding to the end symbol (EOF) is traced, and the codes of "0" or "1" labeled to the branches on that path are picked up in sequence, thus a series of code word obtained.

In next step S0513, the code word obtained in step S0512 are outputted to the data transmitting unit 4 or the data writing unit 7, thus this compressing (encoding) process finished.

Processing in Restoring Unit

Figure 13:
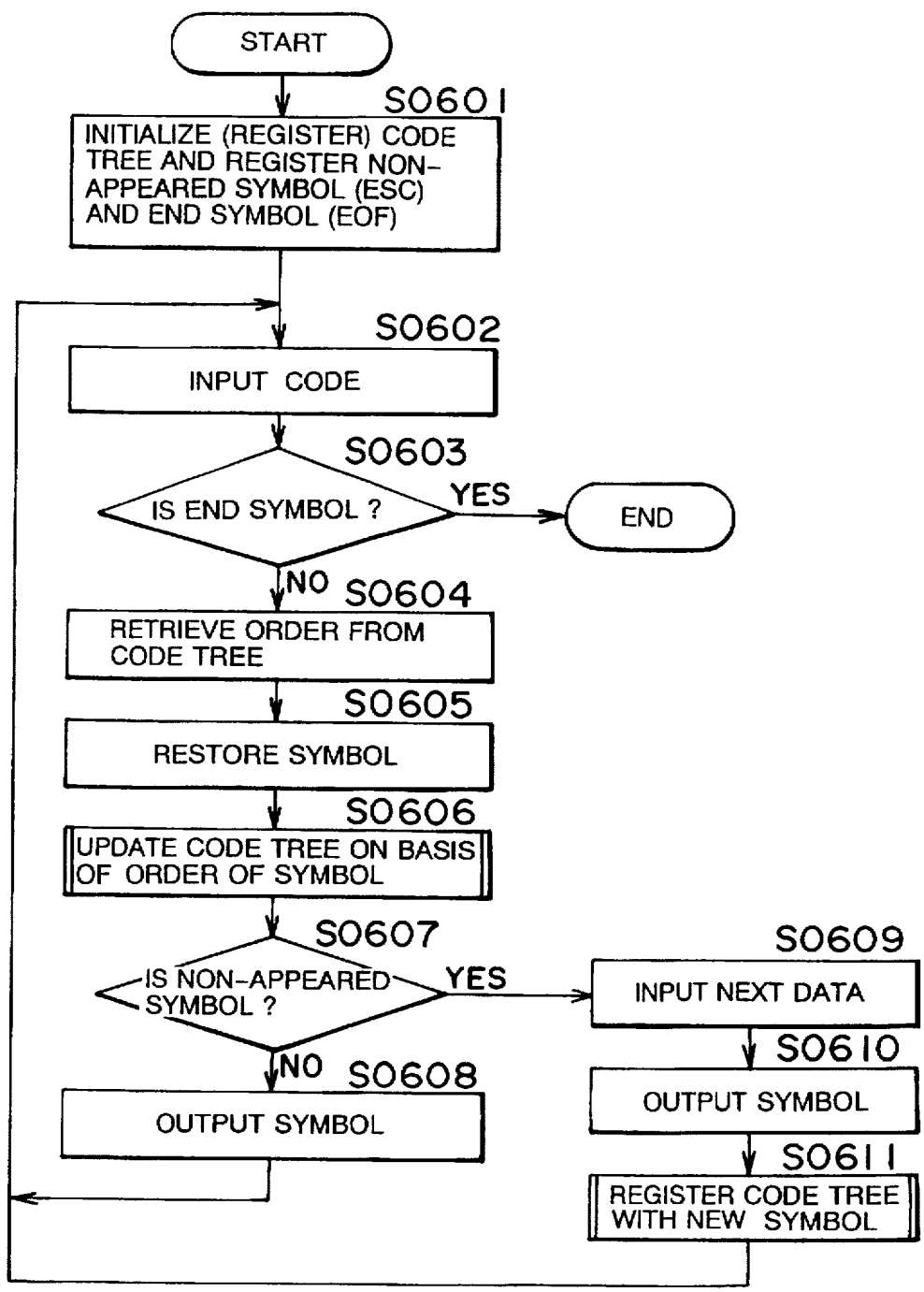
FIG. 13 is a flowchart showing a restoring process executed by a restoring unit of FIG. 3 in the fourth embodiment of the present invention.

FIG. 13 shows the processes for a data restoration executed by the restoring unit 10. The processes in starts when the data receiving unit 6 receives the data or when the data reading unit 9 reads the data from the data storage unit 8 in accordance with an external indication, which serves as a trigger.

In first step S0601 after the start, the code tree is initialized and registered in the table 3. Namely, the restoring unit 10, as in the same way with step S0501 of FIG. 12, generates a code tree shown in FIG. 15(a) wherein only the non-appeared symbol (ESC) and the end symbol (EOF) are the leaves and stores the table 11 with this code tree.

In next step S0602, one of the code words corresponding to the symbols within the file is inputted in the receiving sequence (i.e., the sequence in which the data are compressed by the coding unit 2). Checked in subsequent step S0603 is whether or not the inputted code word corresponds to the end symbol (EOF) with reference to the code tree stored in the table 11. If it does not correspond to the end symbol, the processing proceeds to step S0604.

In this step S0604, the order of the leaf corresponding to the code word inputted in step S0602 is retrieved referring to the code tree stored in the table 11. That is, the branches are traced originating from the root of the code tree according to the sequence of "0" and "1" indicated by the code word, thus a corresponding node (leaf) searched.

In next step S0605, a symbol corresponding to the leaf retrieved in step S0604 is obtained (restoration of symbol) (corresponding to data restoring means).

In next step S0606, the code tree stored in the table 11 is updated based on the order of the leaf to which the symbol corresponding to the code restored in step S0605 is written (corresponding to restoration table updating means). Executed in this step S0606 is exactly the same process as that executed in steps S0507 and S0510 of FIG. 12, i.e., the subroutine of FIG. 6. Accordingly, the updating of the code tree stored in the table 11 goes on in absolutely the same way in synchronization with the code tree stored in the table 3.

In the main routine of FIG. 13 to which the processing is returned from FIG. 6, whether or not the symbol restored in step S0605 is defined as the non-appeared symbol (ESC) is checked in step S0607.

When it is determined that the symbol is the non-appeared symbol (ESC) in step S0607, data subsequent to the code inputted in step S0602 is inputted in next step S0609. This item of data is defined as raw data (non-compressed data) of the new symbol outputted in step S0509 of FIG. 12. This new symbol is outputted from the restoring unit 10 in next step S0610.

In subsequent step S0611, the new symbol outputted in step S0610 is registered in the code tree within the table 11 (corresponding to restoration table updating means). Executed in this step S0611 is exactly the same process as that executed in steps S0511 of FIG. 12, i.e., the subroutine of FIG. 14. Accordingly, the updating of the code tree stored in the table 11 goes on in absolutely the same way in synchronization with the code tree stored in the table 3. Upon a completion of step S0611, the processing goes back to step S0602 to restore the next code word.

On the other hand, when it is determined that the symbol is not the non-appeared symbol (ESC) in step S0607, the symbol restored in step S0605 is outputted in step S0608. Upon a completion of step S0608, the processing goes back to step S0602 to restore the next code word.

<Operation of Embodiment>

An operation of the thus constructed fourth embodiment will be described with reference to FIG. 16.

Now, it is assumed that the code tree in the table 3 is initialized as shown in FIG. 16(a). Then, it is also assumed that a symbol "a" appears at first. Hereupon, the coding unit 2 retrieves the code tree in a form shown in FIG. 16(a), thereby knowing that the symbol "a" is not yet registered. Hence, the non-appeared symbol (ESC) is encoded into a code word "1" and then outputted. The coding unit 2, after effecting the encoding, sets a leaf of the encoded symbol "a" as a target node (node to be processed). Then, a position of this target node is exchanged for a node (leaf corresponding to end symbol (EOF)) of the order higher by one. As a result, the form of the code tree after being updated goes as illustrated in FIG. 16(b). Subsequently, the coding unit 2 outputs the raw data (non-compressed data) of the new symbol "a". Next, the coding unit 2 causes a divergence of the branch connected to the node corresponding to the non-appeared symbol (ESC) in the code tree and registers the leaf corresponding to the new symbol. On this occasion, the order of the leaf corresponding to the non-appeared symbol (ESC) is set larger than the order of the leaf corresponding to the new symbol. As a result, the form of the code tree after being updated becomes as illustrated in FIG. 12(c).

On the other hand, in the initial status, the code tree taking the form shown in FIG. 12(a) is stored also in the table 11. Accordingly, the restoring unit 10, upon receiving a code word of "1", retrieves the code tree in the form illustrated in FIG. 16(a), whereby the non-appeared symbol (ESC) can be obtained. Hereupon, the restoring unit 10 is capable of recognizing that the code inputted after this code word "1" is raw data (non-compressed data) of the new symbol and therefore outputs this item of raw data "a" of the new symbol as it is. The restoring unit 10, after effecting this outputting, sets the leaf corresponding to the non-appeared symbol (ESC) as a target node and exchanges a position of this target node for a node (node corresponding to end symbol (EOF)) of the order higher by one (see FIG. 16(b)). Subsequently, the restoring unit 10 causes a divergence of the branch connected to the non-appeared symbol (ESC) in the code tree and registers the leaf corresponding to the new symbol. In consequence, the form of the code tree after being updated becomes as illustrated in FIG. 16(c) as in the same way with the code tree in the table 3.

Next, it is assumed that a new symbol "b" appears in the coding unit 2. Hereupon, the coding unit 2 retrieves the code tree taking a form illustrated in FIG. 16(c), thereby knowing that the symbol "b" is not yet registered; the coding unit 2 therefore encodes the non-appeared symbol (ESC) into a code word "00" and outputs it. The coding unit 2, after carrying out the encoding, sets the leaf corresponding to the encoded non-appeared symbol (ESC) as a target node, and exchanges a position of this target node for a node of the order higher by one. In an example of FIG. 16(c), the order of the leaf corresponding to "ESC" is "3", and hence it is exchanged for the node of the order "2". As a result, the form of the code tree after being updated goes as illustrated in FIG. 16(d). Subsequently, the coding unit 2 outputs the raw data (non-compressed data) of the new symbol "b". Next, the coding unit 2 causes a divergence of the branch connected to the non-appeared symbol (ESC) in the code tree and registers the leaf corresponding to the new symbol. On this occasion, the order of the leaf corresponding to the non-appeared symbol (ESC) is set larger than the order of the leaf corresponding to the new symbol. As a result, the form of the code tree after being updated goes as shown in FIG. 16(e).

On the other hand, the restoring unit 10, upon receiving a code word of "00", retrieves the code tree in the form illustrated in FIG. 16(c), and thereby obtains the non-appeared symbol (ESC). Hereupon, the restoring unit 10 is capable of recognizing that the code inputted after this code word "00" is raw data (non-compressed data) of the new symbol and therefore outputs this item of raw data "b" of the new symbol as it is. The restoring unit 10, after effecting this outputting, sets the leaf of the non-appeared symbol (ESC) as a target node and exchanges a position of this target node for a node of the order higher by one (see FIG. 16(d)). Subsequently, the restoring unit 10 causes a divergence of the branch connected to the non-appeared symbol (ESC) in the code tree and registers the leaf corresponding to the new symbol. As a result, the form of the code tree after being updated goes as illustrated in FIG. 16(e) as in the same way with the code tree in the table 3.

In consequence of repeating the registration of such new symbols, when the structure of the code tree becomes as shown in FIG. 7(a), the updating is conducted as in the same manner with the description in the first embodiment.

As discussed above, in accordance with this fourth embodiment, all the operations of the first embodiment can be actualized, and there is eliminated the necessity for notifying the restoring unit 10 of the initialized code tree as well as the necessity for searching the whole file at the beginning of the compressing process. It is therefore possible to reduce not only the processing time but also a load on the processing unit (CPU) for actualizing the functions of the coding unit 2 and of the restoring unit 10. Further, the compressing process can be also performed with respect to such real-time data inputting that the whole structure of the file can not be known beforehand.

Note that the subroutine of FIG. 6 is executed as the code tree updating process in steps S0507, S0510 of FIG. 12 and step S0606 of FIG. 13 in this fourth embodiment, but as a substitute for this, the subroutine of FIG. 8 or the subroutine of FIG. 10 may be implemented.

FIFTH EMBODIMENT

A fifth embodiment of the present invention has the same as construction as the fourth embodiment except for a substance of the registering process of the new symbol in the code tree, which will be executed in step S0611 of FIG. 13 as well as in step S0511 of FIG. 12. Accordingly, the description of others will be omitted.

<Processing of Control>

In accordance with the fifth embodiment, the coding unit 4 executes the processes of FIG. 12, while the restoring unit 10 implements the processes of FIG. 13.

Figure 17:
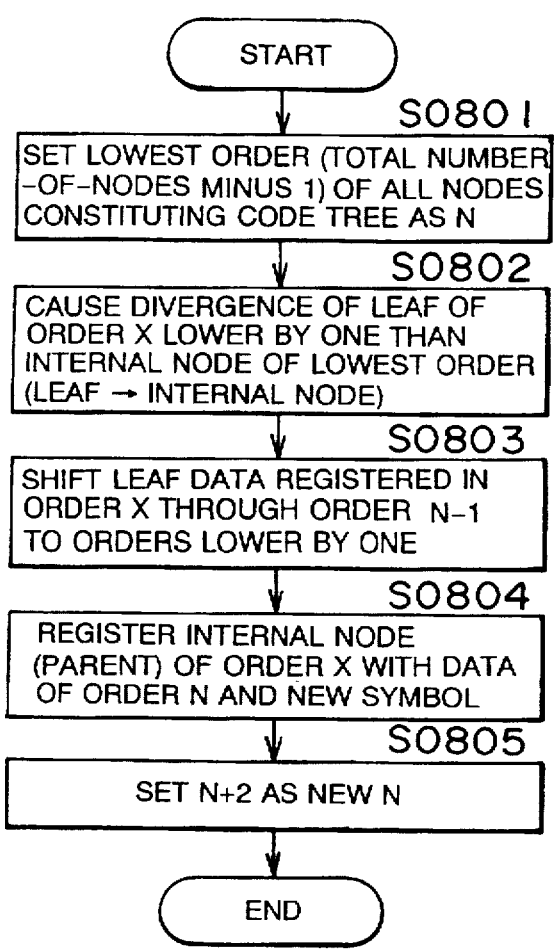
FIG. 17 is a flowchart showing the registering process subroutine for the new symbol with respect to the code tree that is executed in step S0511 of FIG. 12 and step S0611 of FIG. 13.

FIG. 17 is a flowchart showing a content of a registration subroutine for the new symbol in the code tree, which is to be executed in steps S0511 of FIG. 12 and step S0611 of FIG. 13.

In first step S0801 after entering the subroutine of FIG. 17, lowest orders of all the nodes constituting the code tree which is total number-of-nodes minus 1 are each set as a value of a variable N. In next step S0802, a leaf of which order is lower by one than the lowest order of the internal nodes is set as an order "X". Then, the leaf of order "X" branches off. As a result, the node of the order "X" turns out an internal node. In next step S0803, the symbols (EOF, ESC) previously registered in the orders "X" through "N−1" are each shifted to the order lower by one. In subsequently step S0804, the symbol previously registered in the order "N" and a new symbol are registered as children of the internal node of the new order "X". At this time, those symbols are registered so that the order of the new symbol is lower than the symbol previously registered in the order "N". In next step S0805, N+2 is set as new N.

Figure 18:
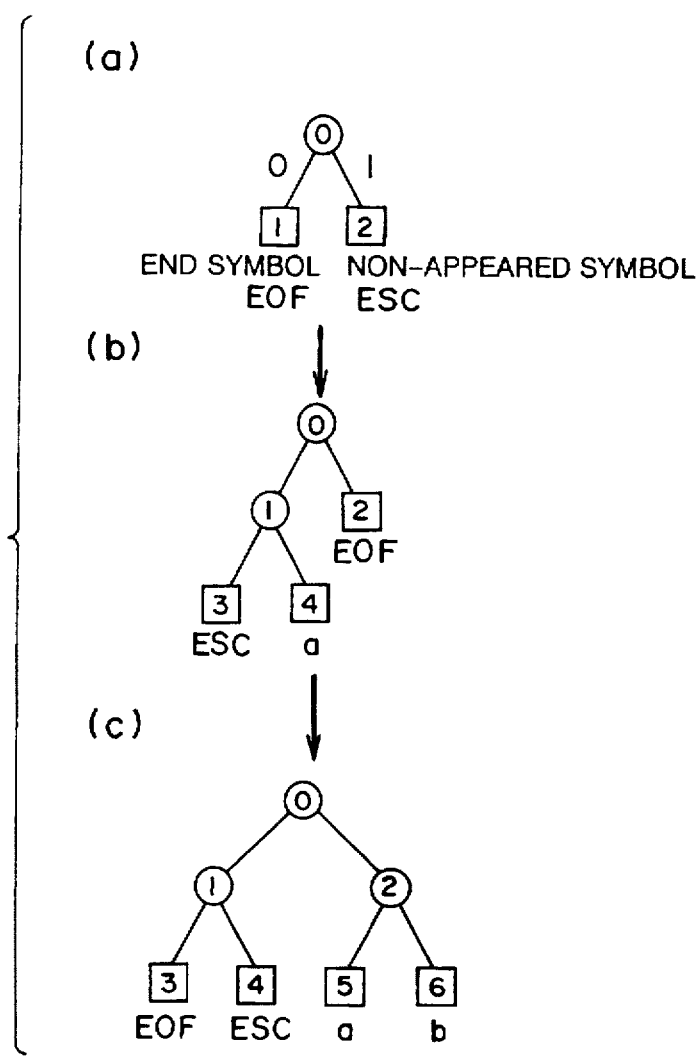
FIG. 18 is an explanatory drawing for the processes of FIG. 17.
Figure 19:
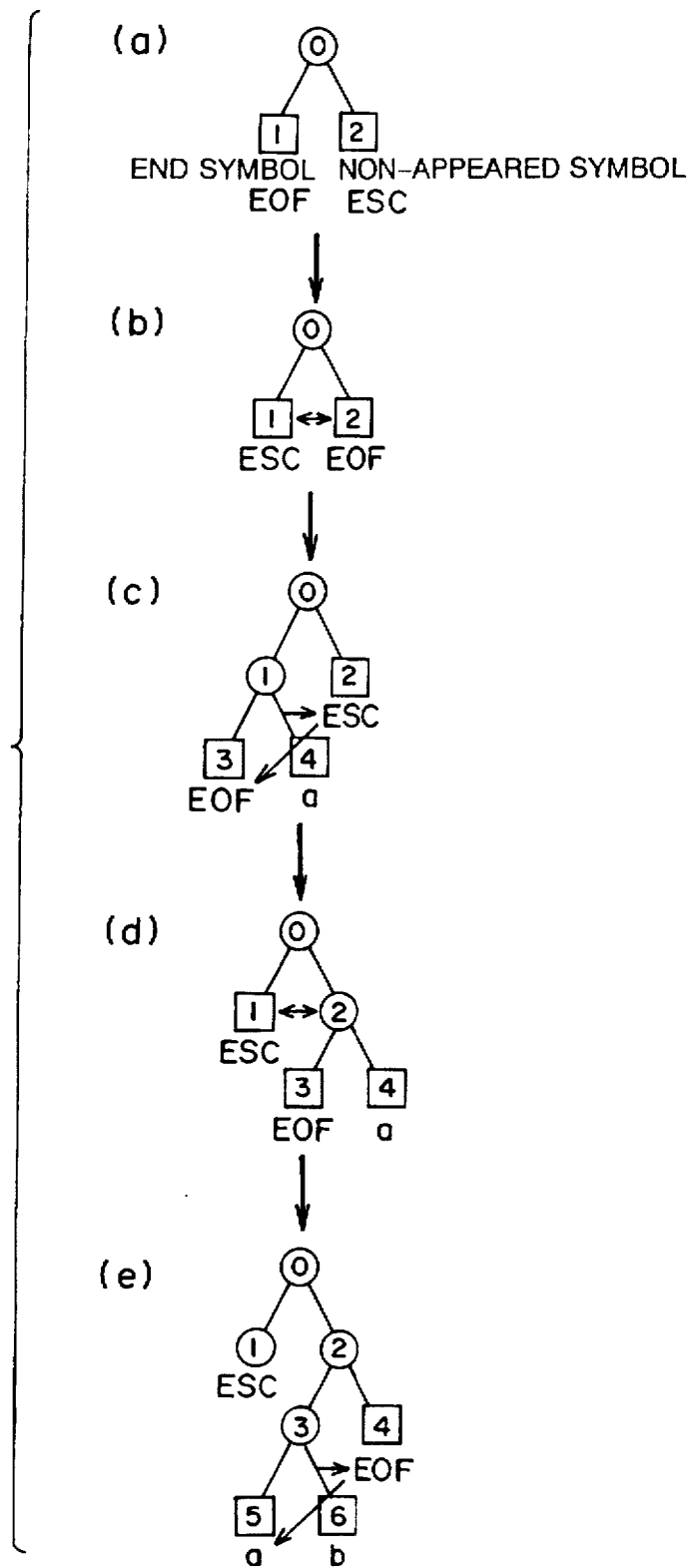
FIG. 19 is a explanatory drawing for an operation in a fifth embodiment of the present invention.

FIG. 18 illustrates how the code tree varies due to an execution of this subroutine of FIG. 17. FIG. 18(a) illustrates an initializing status. FIG. 18(b) shows a status after generating a new symbol "a". FIG. 18(c) depicts a status after generating a new symbol "b" (Note that the code tree is, as a matter of fact, updated and therefore varies as shown in FIG. 19.). Table 5 shows fluctuations of the node order in this case.

TABLE 5

| | \multicolumn{7}{c}{Order of Node} |
| | 0 | 1 | 2 | 3 | 4 | 5 | 6 |
| --- | --- | --- | --- | --- | --- | --- | --- |
| Initial Registration | . | EOF | ESC | | | | |
| a Registration | . | . | EOF | ESC | a | | |
| b Registration | . | . | . | EOF | ESC | a | b |
| | | 1 bit | | | | | 2 bits |

When completing the execution of step S0805, this subroutine of FIG. 19 is finished, and the processing returns to the main routine.

<Operation of Embodiment>

An operation of the thus constructed fifth embodiment will be described with reference to FIG. 19.

Now, it is assumed that the code tree in Table 3 is initialized as shown in FIG. 19(a). Then, it is also assumed that a symbol "a" appears at first. Hereupon, the coding unit 2 retrieves the code tree in a form shown in FIG. 19(a), thereby knowing that the symbol "a" is not yet registered. Hence, the non-appeared symbol (ESC) is encoded into a code word "1" and then outputted. The coding unit 2, after effecting the encoding, sets a leaf of the encoded non-appeared symbol (ESC) as a target node and exchanges a position of this target node for a node (leaf corresponding to end symbol (EOF)) of the order higher by one. As a result, the form of the code tree goes as illustrated in FIG. 19(b). Subsequently, the coding unit 2 outputs the raw data (non-compressed data) of the new symbol "a". Next, the coding unit 2 causes a divergence of the node (i.e., leaf of order "1": this node is referred to as "node X".) of the order next to the internal node of the lowest order (i.e., node of order "0"). Then, orders are given respectively to the two leaves generated by the divergence. Hereupon, a new leaf connected to the right-hand from the node X becomes a node of the lowest order, and, hence, the new symbol "a" is registered in this leaf. Then, the symbols from the one registered in the previous node X to the one registered in the previous lowest order node are shifted down one by one and registered again. As a result, the form of the code tree after being updated becomes as shown in FIG. 19(c).

On the other hand, in the initial status, the code tree taking the form shown in FIG. 19(a) is stored also in the table 11. Accordingly, the restoring unit 10, upon receiving the code word of "1", retrieves the code tree in the form illustrated in FIG. 19(a), and thereby obtains the non-appeared symbol (ESC). Hereupon, the restoring unit 10 is capable of recognizing that the code inputted after this code word "1" is raw data (non-compressed data) of the new symbol and therefore outputs this item of raw data "a" of the new symbol as it is. The restoring unit 10, after effecting this outputting, sets the leaf of the non-appeared symbol (ESC) as a target node and exchanges a position of this target node for a node (node corresponding to end symbol (EOF)) of the order higher by one (see FIG. 19(b)). Subsequently, the restoring unit 10 registers the new symbol "a" in the same manner as done by the coding unit 2. As a consequence, the form of the code tree after being updated becomes as illustrated in FIG. 19(c) as in the same way with the code tree in the table 3.

Next, it is assumed that the new symbol "b" appears in the coding unit 2. Hereupon, the coding unit 2 retrieves the code tree taking a form illustrated in FIG. 19(b), thereby knowing that the symbol "b" is not yet registered. Hence, the non-appeared symbol (ESC) is encoded into the code word "1" and then outputted. The coding unit 2, after effecting the encoding, sets a leaf of the encoded non-appeared symbol (ESC) as a target node and exchanges a position of this target node for a node (leaf corresponding to order "1") of the order higher by one. As a result, the form of the code tree becomes as illustrated in FIG. 19(d). Subsequently, the coding unit 2 outputs the raw data (non-compressed data) of the new symbol "b". Next, the coding unit 2 causes a divergence of a node (i.e., leaf of order "3": this node is referred to as "node X".) of the order next to the internal node of the lowest order (i.e., node of order "2"). Then, orders are given respectively to the two leaves generated by the divergence. Hereupon, a new leaf connected to the right-hand from the node X becomes a node of the lowest order, and, therefore, the new symbol "b" is registered in this leaf. Then, the symbols from the one registered in the previous node X to the one registered in the previous lowest order node are shifted down one by one and registered again. As a result, the form of the code tree after being updated becomes as shown in FIG. 19(e).

On the other hand, the restoring unit 10, upon receiving the code word of "1", retrieves the code tree in the form illustrated in FIG. 19(c), and thereby obtains the non-appeared symbol (ESC). Hereupon, the restoring unit 10 is capable of recognizing that the code inputted after this code word "1" is raw data of the new symbol and therefore outputs this item of raw data "b" of the new symbol as it is. The restoring unit 10, after effecting this outputting, sets the leaf of the non-appeared symbol (ESC) as a target node and exchanges a position of this target node for a node (node of order "1") of the order higher by one (see FIG. 19(d)). Subsequently, the restoring unit 10 registers the new symbol "b" in the same manner as done by the coding unit 2. As a consequence, the form of the code tree after being updated becomes as illustrated in FIG. 19(e) as in the same way with the code tree in the table 3.

In consequence of repeating the registration of such new symbols, when the structure of the code tree becomes as shown in FIG. 7(a), the updating is conducted as in the same manner with the description in the first embodiment.

As discussed above, in accordance with this fifth embodiment, all the operations of the first embodiment can be actualized, and there is eliminated the necessity for notifying the restoring unit 10 of the initialized code tree as well as the necessity for searching the whole file at the beginning of the compressing process. It is therefore possible to reduce not only the processing time but also the load on the processing unit (CPU) for actualizing the functions of the coding unit 2 and of the restoring unit 10. Further, the compressing process can be also performed with respect to such real-time data inputting that the whole structure of the file can not be known beforehand. Moreover, the code length of the code word corresponding to the new symbol is not extremely elongated, and hence an encoding efficiency does not worsen at all.

Note that the subroutine of FIG. 6 is executed as the code tree updating process in steps S0507, S0510 of FIG. 12 and step S0606 of FIG. 13 in this fifth embodiment, but as a substitute for this, the subroutine of FIG. 8 or the subroutine of FIG. 10 may be implemented.

SIXTH EMBODIMENT

A characteristic of a sixth embodiment of the present invention is that the symbol is registered in the code tree not previously but each time the new symbol occurs, and the compression is carried out with a context model used.

Figure 20:
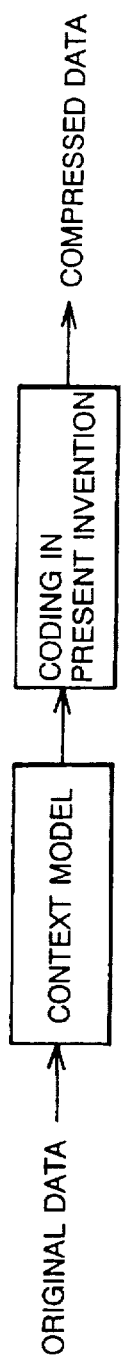
FIG. 20 is a explanatory drawing for the principle of a sixth embodiment of the present invention.

According to a compressing method in this sixth embodiment, as shown in a conceptual diagram of FIG. 20, conditioning based on the context model is effected at first, and, under this condition, the same encoding as that in the fifth embodiment is performed.

<Construction of Hardware>

A construction of the hardware in this sixth embodiment is the same as that described in the first embodiment, and hence its explanation will be omitted. However, the coding unit 2 in the sixth embodiment corresponds to a context retrieving means, a non-appeared symbol order coding means, a symbol order coding means, a code tree order updating means and a non-appeared symbol order updating means, while the restoring unit 10 corresponds to the context retrieving means, a symbol order decoding means, a symbol order re-decoding means, the code tree order updating means and the non-appeared symbol order updating means.

Figure 21:
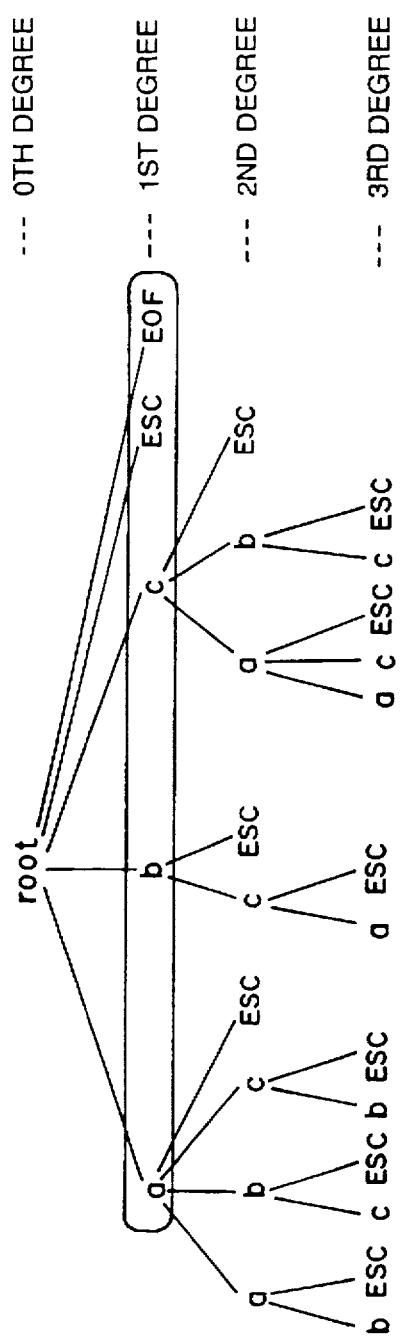
FIG. 21 is an explanatory drawing showing a context tree stored in each of tables 3 and 11 of FIG. 3 in the sixth embodiment of the present invention.

Further, tables 3 and 11 in the sixth embodiment store a context tree shown in FIG. 21 and a plurality of code trees with each internal node of the context tree serving as a root. A relationship between the context tree and the code trees will be hereinafter be explained.

The context tree includes contexts (that is, patterns of consecutively occurrence of a plurality of letters) occurred in the past, which are grouped based on only one root. An example of FIG. 21 shows that contexts such as "aab", "abc", "acb", "bca", "caa", "cac" and "cbc" occurred in the past. In this context tree, unlike the code tree, letters are allocated to all the nodes (irrespective of being the leaves or the internal nodes) exclusive of the root. Further, this context tree is used exclusively for conditioning, but the coding is not performed with the context tree itself. Hence, there is a possibility in which three or more branches diverge from a certain internal node. Further, those branches are not labeled with codes. Moreover, the non-appeared symbol (ESC) is also connected to each internal node in preparation against such a case that there occurs a context absolutely unapplicable to the context of the three letters registered in the context tree or a context applicable to it only one or two letters. Note that the end symbol (EOF) is also connected to the root to indicate an end of the file. Further, in the context tree, the term "level" is referred to as a "-th degree" or "degree".

Under such a condition that the letter corresponding to each internal node occurs, as compared with a unconditional case, it is considered that a deviation is caused in a probability of showing which letter is made to occur next. Namely, an occurrence probability of the letters along the contexts produced in the past is a higher than those of other letters. Accordingly, under a condition where a certain letter occurs, the encoding can be performed even if the code tree for encoding only the letters along the context subsequent to that letter is applied. Besides, if such a conditional code tree is applied, the letters to be encoded by this conditional code tree is limited, and, therefore, a scale of each code tree is reduced. As a result, the code length of the code word is shortened, and the compression efficiency increases.

Figure 22:
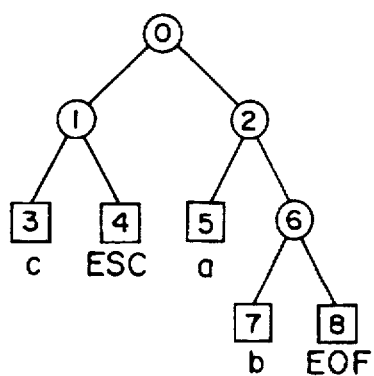
FIG. 22 is an explanatory drawing illustrating a code tree corresponding to a root of the context tree of FIG. 21.

From the reason given above, each internal node of the context tree is provided with a code tree having a root corresponding to the internal node, and leaves corresponding to the letter (including ECS, EOF) of the node at the next level of the context tree which is directly connected to the internal node. FIG. 22 illustrates a code tree prepared corresponding to the root of the context tree in FIG. 21 among those code trees. Note that in those code trees, as discussed in each embodiment given above, there shortens a code length corresponding to a letter having a possibility in which it will occur next. That is, the letter along the context exhibiting a higher possibility of occurrence has a higher compression efficiency thereof.

<Processing>

|Processing in Coding Unit|

Figure 23:
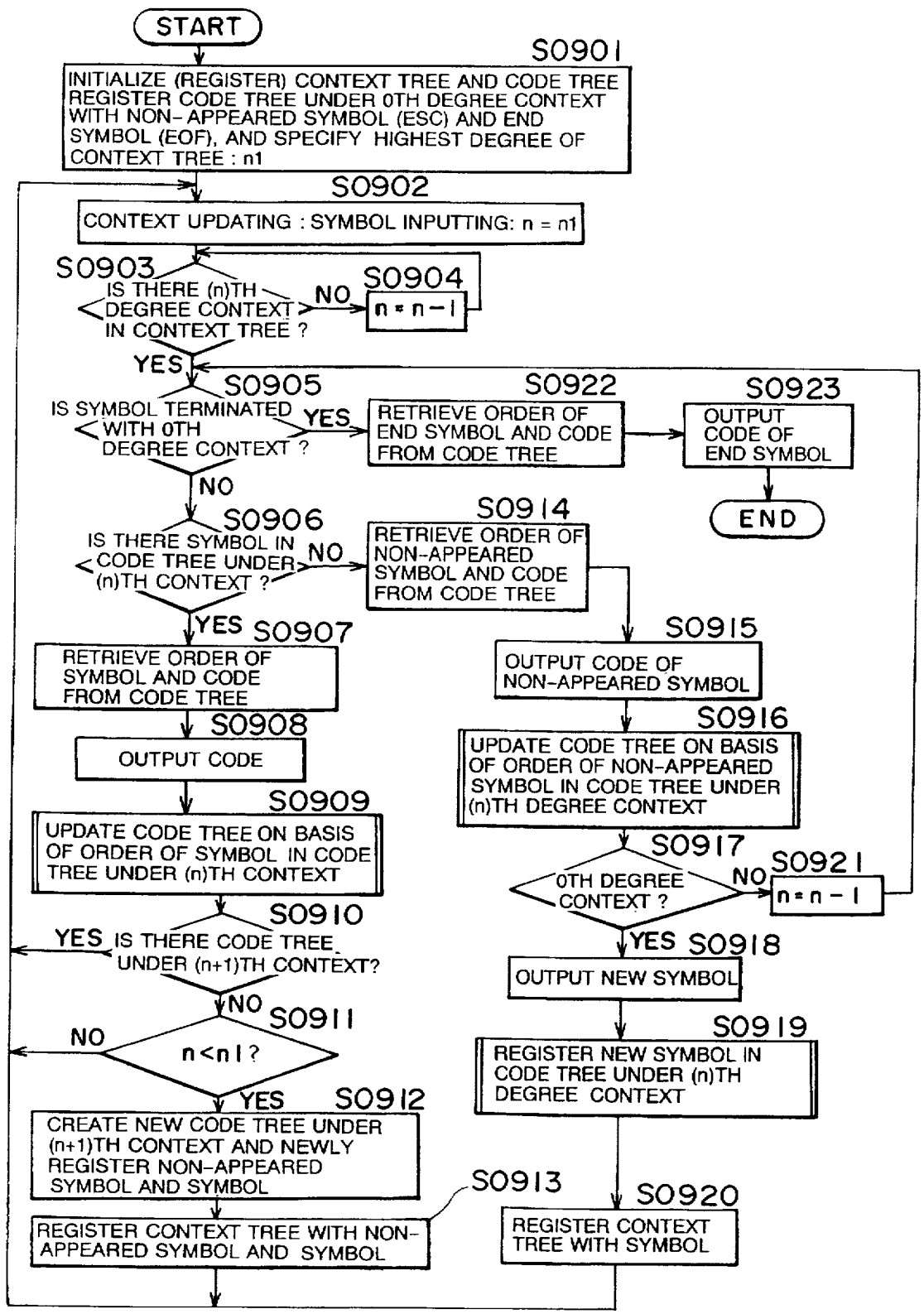
FIG. 23 is a flowchart showing a compressing process executed by the coding unit of FIG. 3 in the sixth embodiment of the present invention.

FIG. 23 shows processes for the data compression (encoding) executed by the coding unit 2 when the data are transferred from the data input unit 1. The processing in FIG. 23 starts when the coding unit 2 receives a file (data) to be compressed, which serves as a trigger.

In first step S0901 after the start, the context tree and the code tree are initialized and registered in the table 3. That is, as shown in column 1 of FIG. 25, the context tree in which only the end symbol (EOF) and the non-appeared symbol (ESC) are connected to the root is generated. Then, the code tree is generated based on this context tree. However, the internal node of the context tree is only the root, and hence only the code tree corresponding to this root is generated. Accordingly, the code tree under corresponding to the root has such a structure that only a leaf corresponding to the end symbol (EOF) and a leaf corresponding to the non-appeared symbol (ESC) are connected via two branches to only one root. Then, the left side branch connected to the end symbol (EOF) is labeled with a code "0", while the right side branch connected to the non-appeared symbol (ESC) is labeled with a code "1". Then, the order "0" is given to the root; the order "1" is given to the end symbol (EOF); and the order "2" is given to the non-appeared symbol (ESC). When completing the initialization of the context tree and the code tree in the above-described manner, the coding unit 2 stores the table 3 with the context tree and the code tree. With this storage, the coding unit 2 declares a highest degree (constant) n1 of the context tree. This highest degree of the context tree is a highest degree of the internal node within the context tree. Accordingly, n1=2 in the example of FIG. 23.

In next step S0902, the already-appeared context to be referred is updated. That is, as described above, if set as n1=2, the highest degree of the internal node of the context tree having the conditional code tree is 2nd-order. As can be understood by seeing FIG. 21, a case where the context tree corresponding to a 2nd-order node is applicable indicates a case where a condition that a character allocated to an internal node of 1st degree within the context tree and a character allocated to an internal node of 2nd degree are successively occurs are satisfied. It can be therefore known that the context to be referred is the 2nd-order context generated recently, that is, context consist of two characters successively occurred recently. Then, in this step S0902, the context to be referred is updated to the 2nd-order context generated recently. The coding unit 2 takes out one of the symbols (letters) in sequence from the data inputted (inputting of symbol). Further, a value of n1 declared in step S0901 is substituted into a variable n.

Checked in next step S0903 is whether or not the (n)th degree context for reference updated in step S0902 is registered in the context tree (corresponding to the context retrieving means). If the context tree elongates with an advancement of the compressing process, the (n)th degree context is registerable. When entering this step S0903 at first, however, n=n1>0, and it is assumed that no context is registered in the context tree. When it is confirmed that the (n)th degree context is not registered in step S0903, n is incremented by one in step S0904, and re-checking is effected.

When it is confirmed that the (n)th degree context is registered in step S0903 (including a case where n=0, and the contexts are not registered at all), the processing proceeds to step S0905. Checked in this step S0905 are whether or not the value of n at the present is "0" and the symbols are terminated. If the value of n at the present is not "0", or if the symbols are not terminated, the processing proceeds to step S0906.

Checked in step S0906 is whether or not the symbol inputted in step S0902 is registered in the code tree (under (n)th degree context) provided corresponding to the node corresponding to a terminal of the (n)th degree context searched in step S0903. At the initial stage, only a "0"th degree context is registered in the context tree. That is, no context is registered, and hence it follows that the code tree that corresponds to the root of the context tree is checked. Then, if the symbol is not yet registered, the processing proceeds to step S0914. If the symbol has already been registered, the processing proceeds to step S0907.

In step S0914 when the symbol is not yet registered, the order of the non-appeared symbol (ESC) is retrieved with reference to the code tree under the (n)th degree context. Then, the path from the root to the leaf corresponding to the non-appeared symbol (ESC) in the code tree is traced, and the codes of "0" or "1" labeled to the branches on that path are picked up in sequence, thus a series of code word is obtained.

In next step S0915, the code word for the non-appeared symbol (ESC) that is obtained in step S0914 is outputted to the data transmitting unit 4 or the data writing unit 7 (corresponding to the non-appeared symbol order coding means).

In next step S0915, the code tree under the (n)th degree context is updated based on the order of the leaf corresponding to the non-appeared symbol (ESC) retrieved in step S0914 (corresponding to the non-appeared symbol order updating means). The updating process of this code tree is done by executing the processes of FIG. 6. When implementing the processes of FIG. 6 as a subroutine in this step S0916, however, a target node to be processed is the leaf corresponding to the non-appeared symbol (ESC).

In the main routine of FIG. 23 to which the processing is returned from FIG. 6, the process in step S0917 is executed. Checked in this step S0917 is whether or not the present value of n is "0", i.e., whether or not the context to be checked in step S0906 is the 0th degree context. Then, if n=0 is not confirmed, i.e., if not the 0th degree context, the value of n is decremented by one in step S0921, and the processing goes back to step S0905. Namely, the node of the context tree is shifted back by one on the root side, and the encoding process is performed based on the code tree corresponding to that node.

Whereas if n=0 is confirmed, i.e., if the context is the 0th degree context, it is considered as a case where there is inputted absolutely a new symbol impossible of being encoded even by use of any code tree in the table 3. Therefore, in step S0918, the raw data (non-compressed data) of the symbol inputted in step S0902 is outputted to the data transmitting unit 4 or the data writing unit 7 as it is.

In next step S0919, the new symbol inputted in step S0902 is registered in the (n)th (0th) order code tree. The registration of the new symbol in this code tree is done by executing the processes of FIG. 17.

In the main routine of FIG. 23 to which the processing is returned from FIG. 17, the new symbol is registered in the context tree in step S0920. This registration is done by connecting this node to the root.

When completing the process in this step S0920, the processing goes back to step S0902 to perform the compressing process with respect to the next symbol.

On the other hand, in step S0907 in such a case that the symbol is registered in the code tree under the (n)th order context in step S0906, the order of a leaf corresponding to the symbol taken out in step S0902 is retrieved with reference to the code tree under the (n)th degree context. Then, the path from the root to the corresponding leaf is traced, and the codes of "0" or "1" labeled to the branches on that path are picked up in sequence, thus a series of code word is obtained.

In next step S0908, the thus obtained code word are outputted to the data transmitting unit 4 or the data writing unit 7 (corresponding to the symbol order coding means).

In subsequent step S0909, the code tree under the (n)th degree context is updated based on the order, retrieved in step S0905, of the leaf corresponding to the symbol to be processed in this time (corresponding to the code tree order updating means). This updating process for the code tree is effected by executing the processes of FIG. 7. When implementing the processes of FIG. 7 as a subroutine in this step S0909, however, the target node to be processed is the leaf corresponding to the symbol taken out in step S0902.

In the main routine of FIG. 23 to which the processing is returned from FIG. 6, whether or not there is a code tree under an (n+1)th degree context is checked in step S0910. That is, there is checked whether or not the corresponding code tree is provided in a node subsequent to the node in the context tree corresponding to the code tree processed in step S0909. If the code tree has already been provided, there is no necessity for creating a new code tree, and hence the processing is returned to step S0902 to compress the next symbol.

Whereas in the case that the code tree is not provided, whether the present value of n is smaller than n1 or not is checked in step S0911. If n is n1 or larger, the processing is returned to step S0902 so that it does not exceed the highest degree.

On the other hand, in the case that n is smaller than n1, a new code tree is created under the (n+1)th degree context in step S0912. That is, the code tree is created, subsequent to the node in the context tree corresponding to the code tree to be processed in step S0909, made to correspond with the root of the code tree. Only the non-appeared symbol (ESC) and the new symbol are registered in this code tree. On this occasion, the order of the node of the new symbol is set higher than the order of the node of the non-appeared symbol (ESC).

In next step S0913, the non-appeared symbol (ESC) and the new symbol are registered in the context tree. This registration is carried out by extending two branches from the (n+1)th degree node within the context tree and making the non-appeared symbol (ESC) and the new symbol corresponding respectively to nodes formed at their tips.

When completing the process in this step S0913, the processing goes back to step S0902 to compress the next symbol.

As a result of repeating the above processes, when confirming that the present value of n is "0" and that the symbol is terminated in step S0905, the order of leaf corresponding to the end symbol is retrieved with reference to the code tree corresponding to the root of the context tree in step S0922. Then, the path from the root to the corresponding leaf is traced, and the codes of "0" or "1" labeled to the branches on that path are picked up in sequence, thus a series of code word is obtained.

In next step S0923, the code words obtained in step S0922 are outputted to the data transmitting unit 4 or the data writing unit 7. Thereafter, this compressing process is ended.

[Processing in Restoring Unit]

Figure 24:
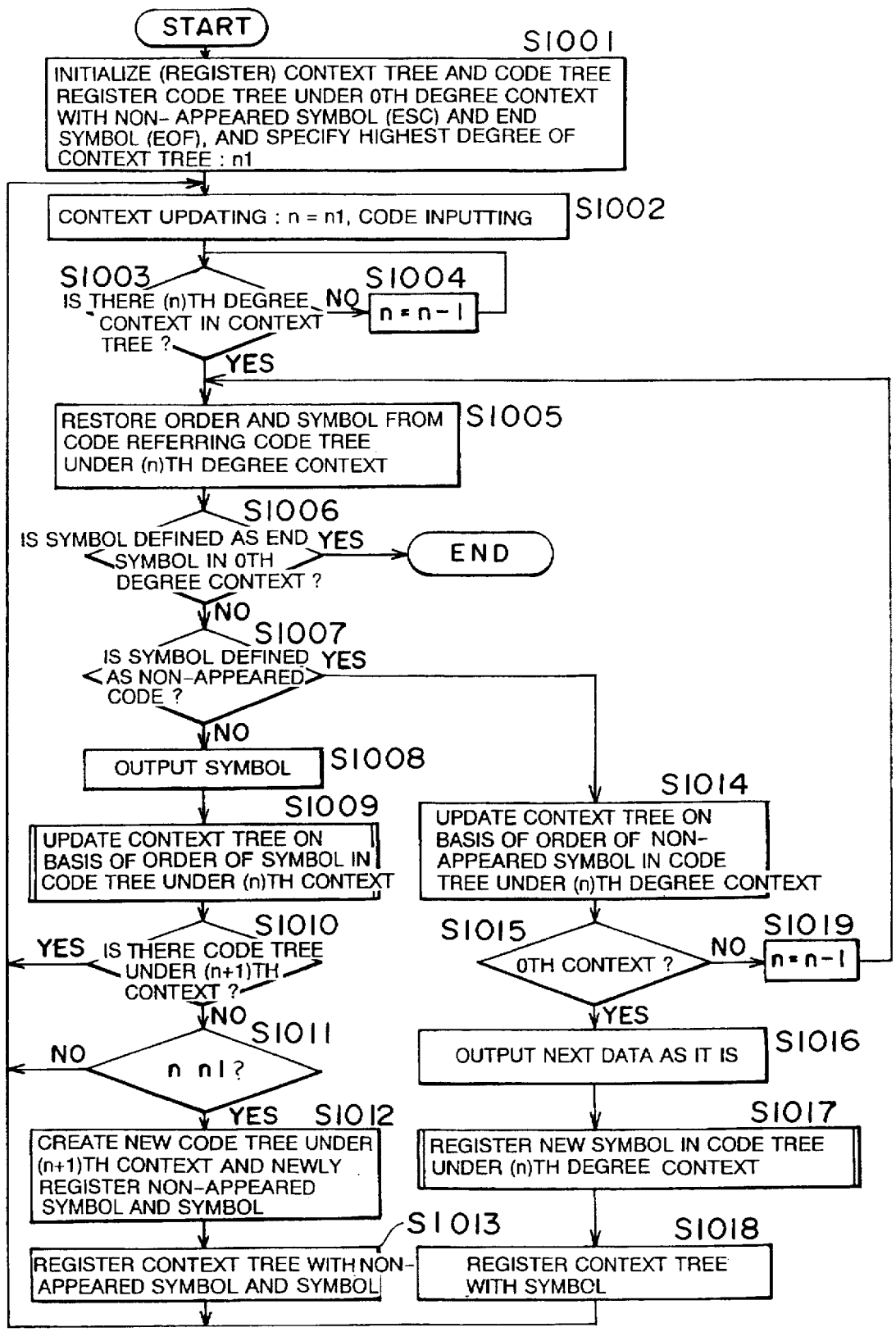
FIG. 24 is a flowchart showing a restoring process executed by the restoring unit of FIG. 3 in the sixth embodiment of the present invention.
Figure 25A:
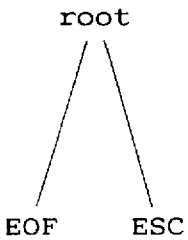
FIGS. 25(a)–25(d) are explanatory views for an operation in a sixth embodiment of the present invention.
Figure 25B:
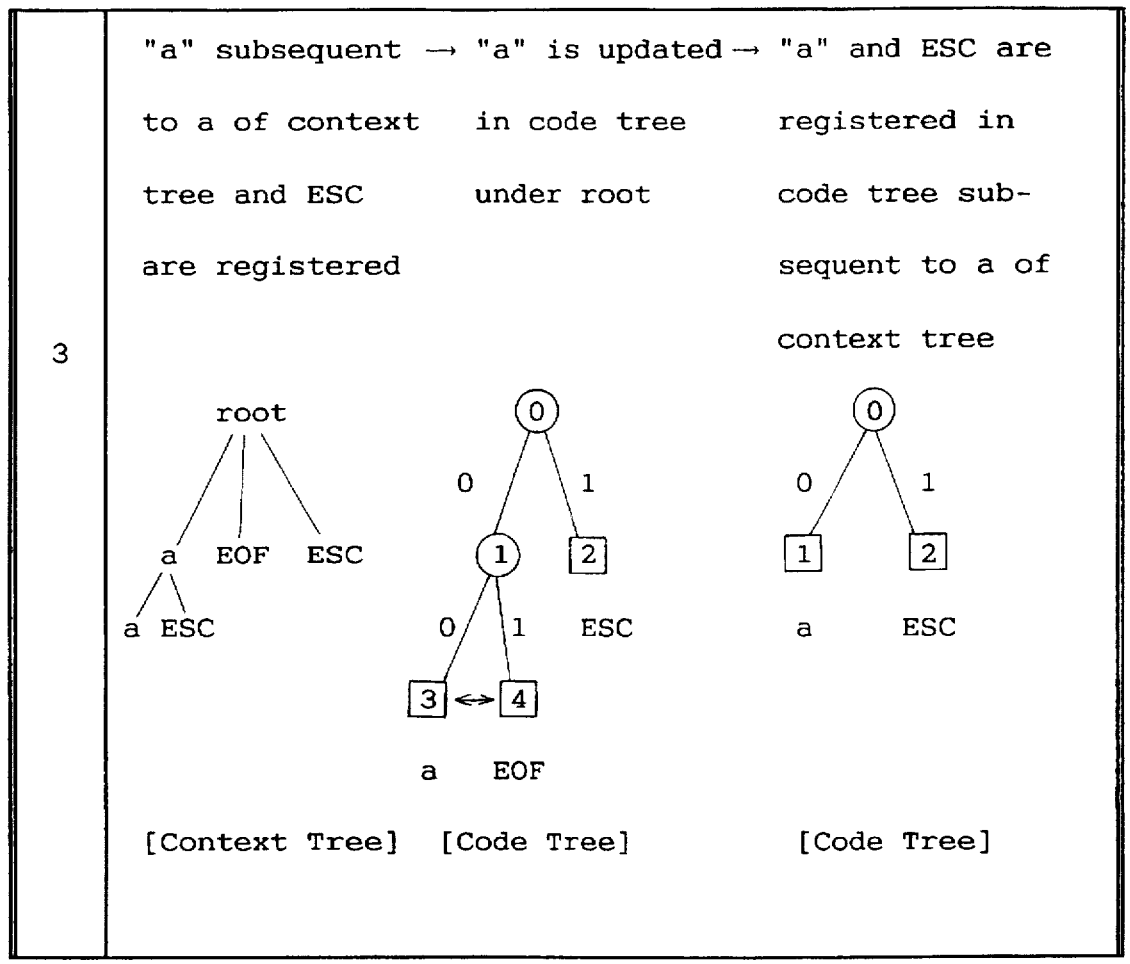
Figure 25C:
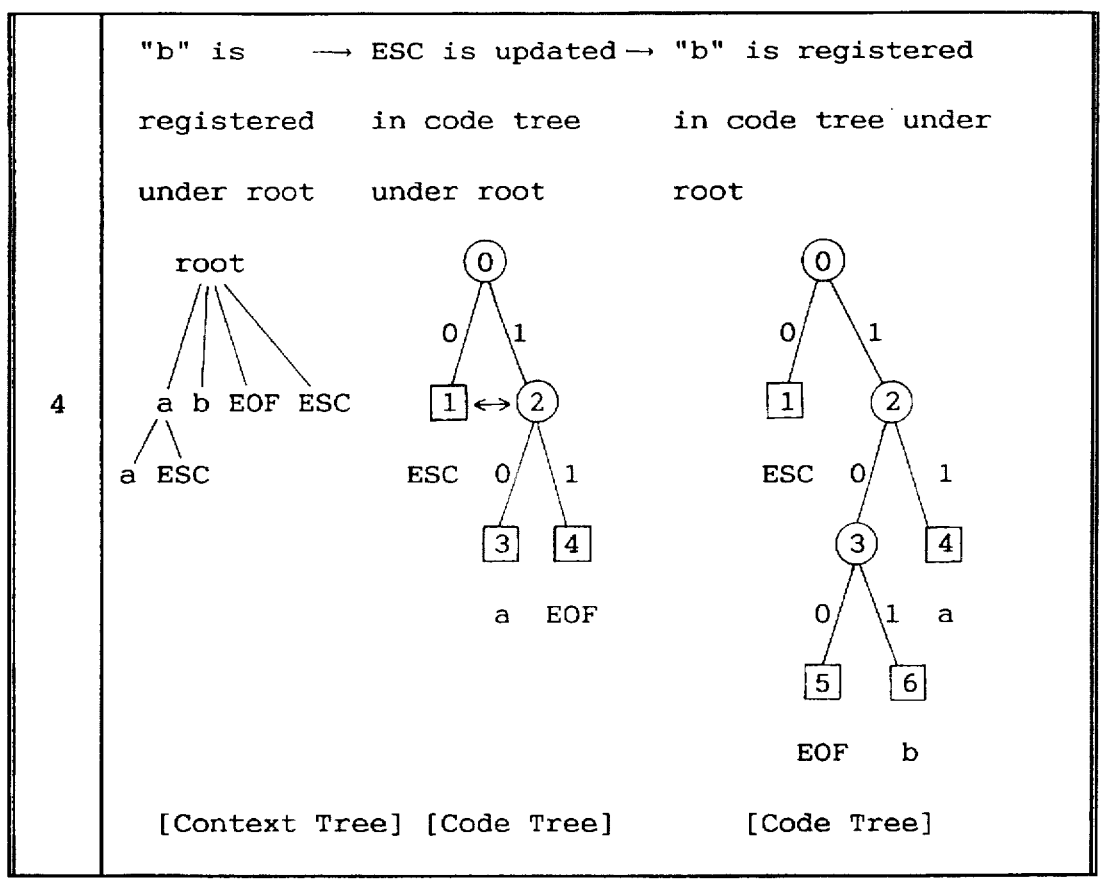
Figure 25D:
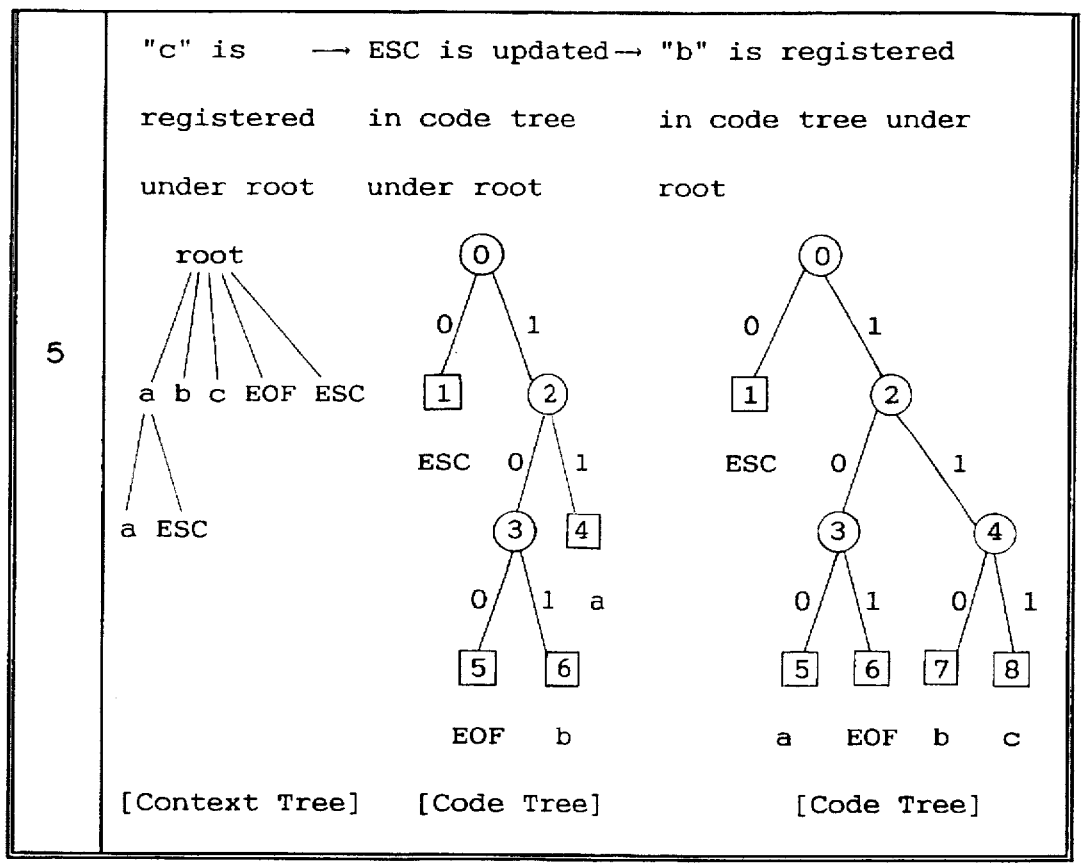
Figure 26:
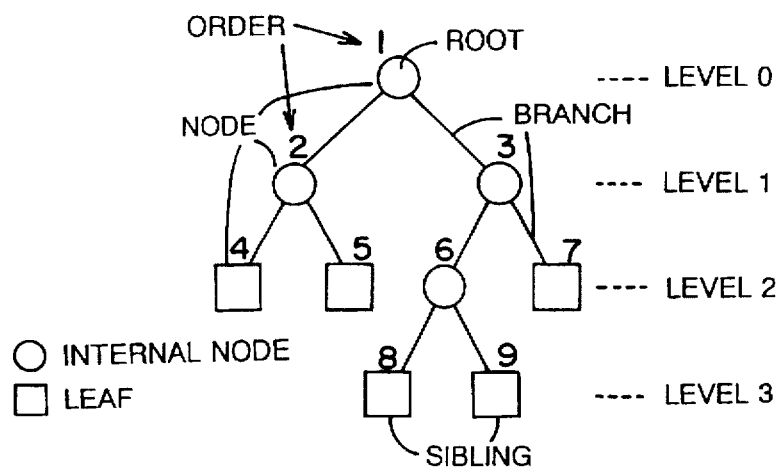
FIG. 26 is an explanatory drawing showing names of the respective parts of the code tree.
Figure 27:
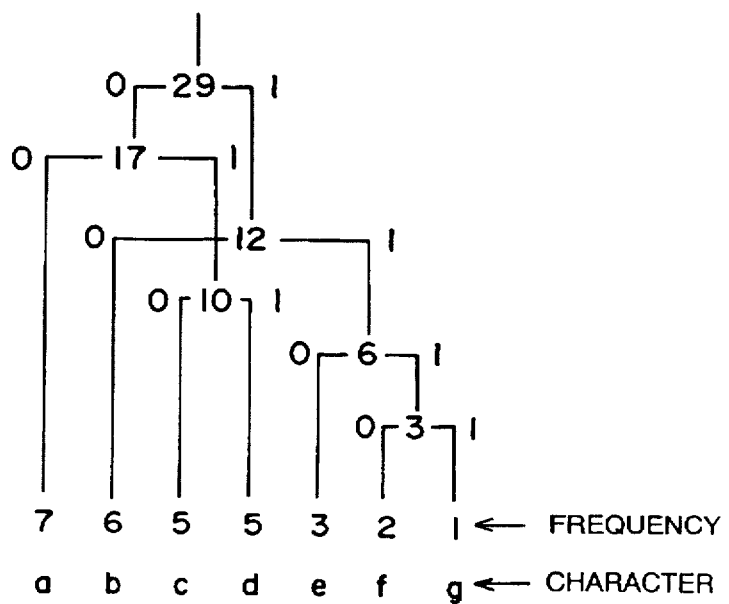
FIG. 27 is a diagram showing the principle of a Haffman coding method.
Figure 29:
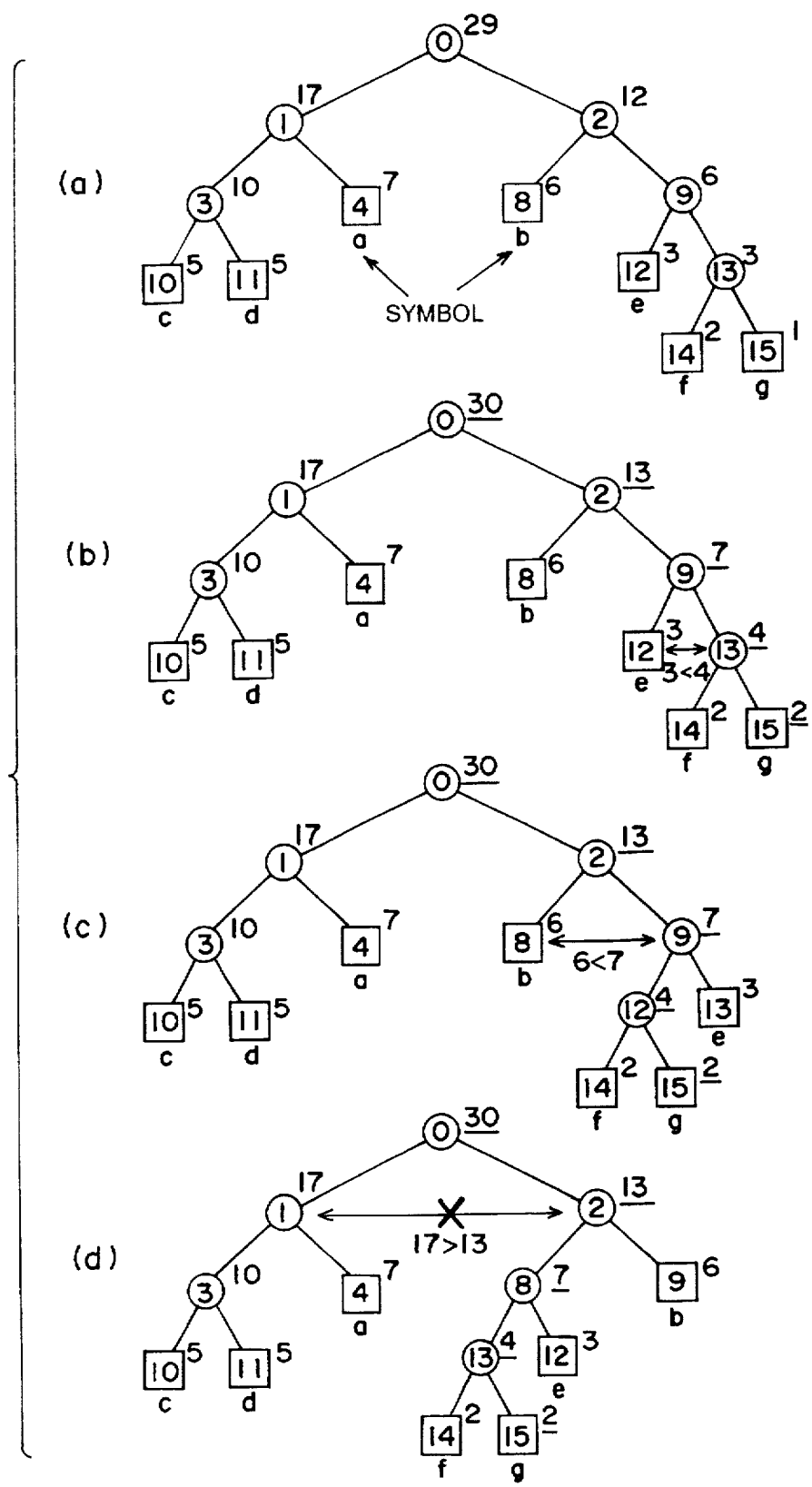
FIG. 29 is a diagram showing the principle of an adaptive type coding method.
Figures 33, 34, 35:
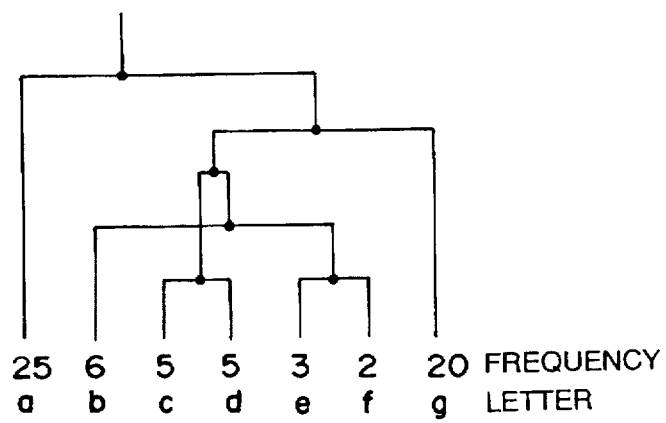
FIG. 33 is a diagram showing a relationship between the character and the cord word in the code tree of FIG. 32.
FIG. 34 is an explanatory diagram illustrating an example of updating the code tree by the adaptive type coding method.
FIG. 35 is a diagram showing a relationship between the character and the code word in the code tree of FIG. 34.
Figure 36:
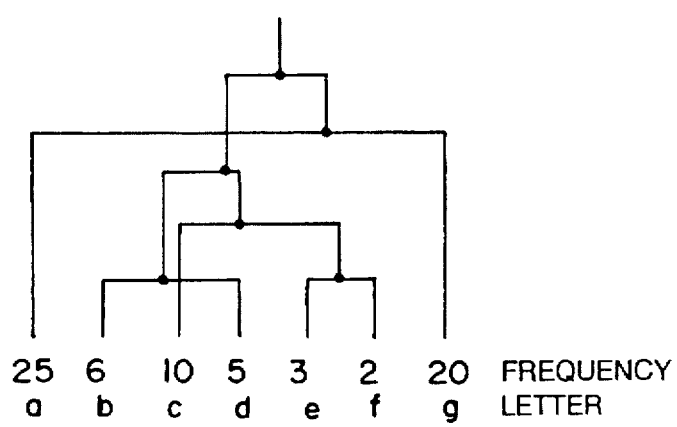
FIG. 36 is an explanatory diagram illustrating an example of updating the code tree by the adaptive type coding method.
Figure 37:
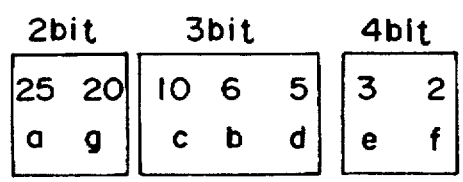
FIG. 37 is a diagram showing a relationship between the character and the cord word in the code tree of FIG. 36.
Figure 38:
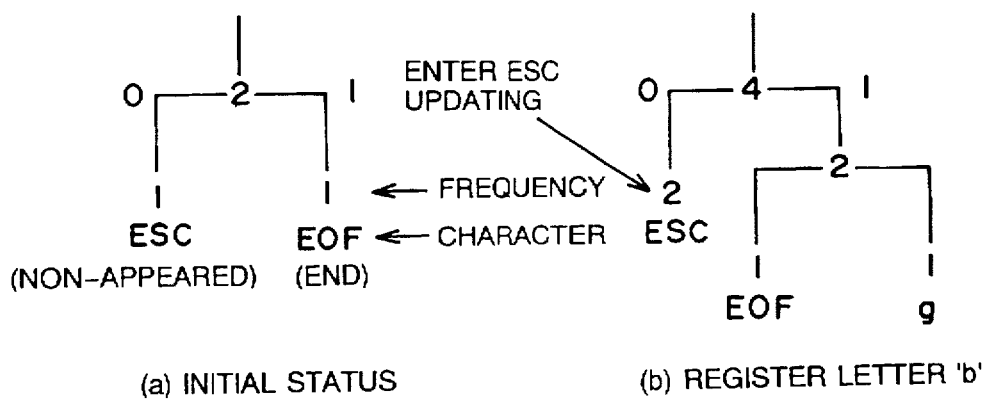
FIG. 38 is an explanatory diagram illustrating an example of registering a new symbol by the adaptive type coding method.

FIG. 24 shows contents of the processes for a data restoration executed by the restoring unit 10. The processing in FIG. 24 starts when the data receiving unit 6 receives the data or when the data reading unit 9 reads the data from the data storage unit 8 in accordance with an external indication, which serves as a trigger.

In first step S1001 after the start, the context tree and the code tree are initialized and registered in the table 3. That is, the restoring unit 10, as shown in column 1 of FIG. 25, generates the context tree in which only the end symbol (EOF) and the non-appeared symbol (ESC) are connected to the root and the code tree based on this context tree as in the same way with step S1001 of FIG. 23. When completing the initialization of the context tree and the code tree in the manner described above, the restoring unit 10 stores the table 3 with these context and code trees. With this storage, the restoring unit 10 declares the highest degree (constant) n1 of the context tree. Herein, as described above, n1=2.

In next step S1002, the already-appeared context to be referred is updated. That is, the restoring unit 10 updates the context to be referred to a 2nd order context generated recently. Further, the restoring unit 10 substitutes a value of n1 declared in step S1001 into the variable n. Moreover, the restoring unit 10 inputs one of the code word corresponding to the symbols within the file in accordance with the receiving sequence (sequence in which the data are compressed by the coding unit 2).

Checked in next step S1003 is whether or not the (n)th degree context for reference updated in step S1002 is registered in the context tree (corresponding to the context retrieving means). If the context tree elongates with an advancement of the compressing process, the (n)th degree context is also registerable. When entering this step S1003 at first, however, n=n1>0, and it is assumed that no context is registered in the context tree. When it is confirmed that the (n)th degree context is not registered in step S1003, n is incremented by one in step S1004, and re-checking is effected.

When it is confirmed that the (n)th degree context is registered in step S1003, the processing proceeds to step S1005. In this step S1005, the order of a leaf corresponding to the inputted code word is retrieved with reference to the code tree (code tree under the (n)th degree context) provided corresponding to the node corresponding to the terminal of the (n)th degree context searched in step S1003. That is, starting from the root of the code tree, the branches are traced in sequence according to "0" and "1" indicated by the code word, thus a leaf of the corresponding order is searched. Then, a symbol allocated to the searched leaf is read (corresponding to the symbol order decoding means).

Checked in next step S1006 are whether or not the value of n at the present is "0" and the symbols are terminated. If the value of n at the present is not "0", or if the symbols are not terminated, the processing proceeds to step S1007.

Checked in step S1007 is whether or not the symbol restored in step S1005 is the non-appeared symbol (ESC). If it is confirmed as the non-appeared symbol (ESC) in step S1007, the processing proceeds to step S1014 (corresponding to the symbol order re-decoding means). In this step S1014, the code tree under the (n)th degree context is updated based on the order of the leaf corresponding to this non-appeared symbol (ESC) (corresponding to the non-appeared symbol order updating means). The updating process of this code tree is done by executing the processes of FIG. 6. When implementing the processes of FIG. 6 as a subroutine in this step S1014, however, a target node to be processed is defined as a leaf corresponding to the non-appeared symbol (ESC).

In the main routine of FIG. 24 to which the processing is returned from FIG. 6, the process in step S1015 is executed. Checked in this step S1015 is whether or not the present value of n is "0", i.e., whether or not the updated code tree is under the 0th degree context in step S1014. Then, if n=0 is not established, i.e., if not under the 0th degree context tree, the value of n is decremented by one in step S1019, and the processing goes back to step S1005 (corresponding to the symbol order re-decoding means). Namely, the node of the context tree is shifted back by one on the root side, and the encoding process is performed based on the code tree corresponding to that node.

Whereas if n=0 is confirmed, i.e., if the context is the 0th degree context, this is, it can be considered as a case where the data subsequent thereto is raw data (non-compressed data) of th new symbol. Then, a next item of data is outputted as it is.

In next step S1017, the new symbol outputted in step S1016 is registered in the code tree under the (n)th degree context stored in the table 11. In this step S1017, exactly the same process as that executed in step S0919, i.e., the subroutine in FIG. 17 is implemented. Accordingly, the updating of the code tree under the (n)th degree context stored in the table 11 goes on absolutely the same manner in synchronization with the code tree stored in the table 3.

In the main routine of FIG. 23 to which the processing is returned from FIG. 17, the new symbol is registered in the context tree in step S1018. This registration is done by connecting this node to the root.

When completing the process in this step S1018, the processing goes back to step S1002 to perform the restoring process with respect to the next symbol.

On the other hand, when it is confirmed that the symbol is not the non-appeared symbol (ESC) in step S1007, the symbol restored in step S1005 is outputted in next step S1008.

In subsequent step S1009, the code tree under the (n)th degree context is updated based on the order of the leaf corresponding to the symbol outputted in step S1008 (corresponding to the code tree order updating means). This updating process of the code tree is effected by executing the processes of FIG. 6. When implementing the processes of FIG. 6 as a subroutine in this step S1016, however, the target node to be processed is defined as a leaf corresponding to the symbol restored in step S1005.

In the main routine of FIG. 24 to which the processing is returned from FIG. 6, whether or not there is a code tree under the (n+1)th degree context is checked in step S1010. That is, there is checked whether or not the corresponding code tree is provided in a node subsequent to the node in the context tree corresponding to the code tree processed in step S1009. If the code tree has already been provided, there is no necessity for creating a new code tree, and hence the processing is returned to step S1002 to restore the next code word.

Whereas in the case that the code tree is not provided, whether the present value of n is smaller than n1 or not is checked in step S1011. If n is n1 or larger, the processing is returned to step S1002 so that it does not exceed the highest degree.

On the other hand, in the case that n is smaller than n1, a new code tree is created under the (n+1)th degree context in step S1012. That is, the code tree is created in the same way as step S0912 of FIG. 13. Only the non-appeared symbol (ESC) and the new symbol are registered in this code tree. On this occasion, the order of the node of the new symbol is set higher than the order of the node of the non-appeared symbol (ESC).

In next step S1013, the non-appeared symbol (ESC) and the new symbol are registered in the context tree. This registration is carried out by extending two branches from the (n+1)th degree node within the context tree and making the non-appeared symbol (ESC) and the new symbol corresponding respectively to nodes formed at their tips.

When completing the process in this step S1013, the processing goes back to step S1002 to restore the next code word.

<Operation of Embodiment>

An operation of the thus constructed sixth embodiment will be explained with reference to FIG. 25

Now, it is assumed that the context tree and the code tree in the table 3 are initialized as shown in column 1 of FIG. 25. Then, it is also assumed that a symbol "a" appears at first. At this time, what is referred is the 0th degree context. The coding unit 2 retrieves the code tree under the 0th degree context tree taking the form shown in column 1 of FIG. 25, thereby knowing that the symbol "a" is not yet registered. Then, the non-appeared symbol (ESC) is encoded into a code word "1" and the outputted. The coding unit 2, sets the leaf of the coded non-appeared symbol (ESC) as a target node, and exchanges a position of this target node for a node (i.e. leaf corresponding to the end symbol (EOF)) of the order higher by one within the code tree under the 0th degree context. Subsequently, the coding unit 2 outputs the raw data (non-compressed data) of the new symbol "a". Nextly, the coding unit 2 causes a divergence of the node of the order "1" in the code tree under the 0th degree context and registers the new symbol in the leaf of the lowest order. Further, the coding unit 2 extends a branch from the root of the context tree and registers the new symbol "a" in a leaf at its tip. As a result, the form of the code tree after being updated becomes as shown in column 2 of FIG. 25.

On the other hand, in the initial status, the context tree and the code tree taking the form shown in column 1 of FIG. 25 are stored also in the table 11. Accordingly, the restoring unit 10, upon receiving the code word of "1", retrieves the code tree in the form shown in column 1 of FIG. 25, whereby the non-appeared (ESC) can be obtained. Hereupon, the restoring unit 10 is capable of recognizing that the data inputted after this code word "1" is raw data of the new symbol and therefore outputs this item of raw data "a" of the new symbol as it is. Thereafter, the restoring unit 10 updates the context tree and the code tree in the table 11 as in the same way with the coding unit 2.

Next, it is assumed that the new symbol "b" appears in the coding unit 2. At this time, what is referred at first is the first degree context "a" (it changes to a 0th degree context when exiting step S0903). The coding unit 2 retrieves the code tree under the 0th degree context taking the form shown in column 2 of FIG. 25, thereby knowing that the symbol is registered in this code tree. Then, the coding unit 2 encodes this symbol into a code word "01" and then outputs it. The coding unit 2, in the code tree under the 0th degree context, sets a leaf of the encoded symbol "a" as a target node and exchanges a position of this target node for a node (i.e. leaf corresponding to the end symbol (EOF)) of the order higher by one. Subsequently, the coding unit 2 generates a new code tree corresponding to a first degree node (i.e. node corresponding to "a") within the context tree and registers the symbol "a" and the non-appeared symbol (ESC) in this new code tree. Further, the coding unit 2 extends two branches from the first degree node (i.e. node corresponding to "a") of the context tree and registers the symbol "a" and the non-appeared symbol (ESC) in leaves at their tips. As a result, the form of the code tree after being updates becomes a shown in column 3 of FIG. 25.

On the other hand, the restoring unit 10, upon receiving the code word "01", retrieves the code tree under the 0th degree context taking the form shown in column 2 of FIG. 25 and is thereby capable of restoring the symbol "a". Thereafter, the restoring unit 10 updates the context tree and the code tree in the table 11, thereby generating a new code tree as in the same way with the coding unit 2.

Next, it is assumed that the new symbol "b" appears in the coding unit 2. At this time, what is referred is a second degree context "aa" (it changes to the first degree context "a" when exiting step S0903). Hereupon, the coding unit 2 retrieves the code tree under the first degree context (i. e. code tree corresponding to the node "a" at the terminal of the first degree context "a") taking the form shown in column 3 of FIG. 25, thereby knowing that the symbol "b" is not yet registered in the code tree. Then, the non-appeared symbol (ESC) is encoded into the code word "1" and then outputted. The coding unit 2 sets the leaf of the coded non-appeared symbol (ESC) as a target node in the code tree corresponding to the node "a" at the terminal of the first degree context "a" in the context tree, and exchanges a position of this target node for a node (i.e. leaf corresponding to the end symbol (EOF)) of the order higher by one. Next, the coding unit 2 retrieves the code tree under the 0th degree context taking the form shown in column 3 of FIG. 25, thereby knowing that the symbol "b" is not yet registered in the code tree. Then, the coding unit 2 encodes the non-appeared symbol (ESC) into the code word "1" and then outputs it. The coding unit 2 sets a leaf of the encoded non-appeared symbol (ESC) as a target node in the code tree under the 0th degree context, and exchanges a position of this target node for a node (node of the order "1") of the order higher by one. Subsequently, the coding unit 2 outputs the raw data (non-compressed data) of the new symbol "b". Next, the coding unit 2 causes a divergence of the node of the order "3" in the code tree under the 0th degree context and registers the new symbol "b" in the leaf of the lowest order. Further, the coding unit 2 extends a branch from the root of the context tree and registers the new symbol "a" in a leaf at its tip. As a result, the form of the code tree after being updated becomes as shown in column 4 of FIG. 25.

On the other hand, the restoring unit 10, upon receiving the code word of "1", retrieves the code tree under the first degree context in the form shown in Table 6(3), whereby the non-appeared (ESC) can be obtained. Next, the restoring unit 10 , upon receiving the code word "1", retrieves the code tree under the 0th degree context taking the form shown in column 3 of FIG. 25, thereby the non-appeared symbol (ESC) is obtained. Hereupon, the restoring unit 10 is capable of recognizing that the data inputted after this code word "11" is raw data of the new symbol and therefore outputs this item of raw data "b" of the new symbol as it is. Thereafter, the restoring unit 10 updates the context and the code tree in the table 11 as in the same way with the coding unit 2.

Next, it is assumed that a new symbol "c" appears in the coding unit 2. At this time, what is referred at first is a second degree context "ab" (it changes to the 0th degree context when exiting step S0903). The coding unit 2 retrieves the code tree under the 0th degree context taking the form shown in column 4 of FIG. 25, thereby knowing that the symbol "c" is not yet registered in the code tree. Then, the coding unit 2 encodes the non-appeared symbol (ESC) into a code word "0" and then outputs it. Subsequently, the coding unit 2 outputs the raw data (non-compressed data) of the new symbol "c". Next, the coding unit 2 causes a divergence of the node of the order "4" in the code tree under the 0th degree context and registers the new symbol "c" in the leaf of the lowest order. Further, the coding unit 2 extends a branch from the root of the context tree and registers the new symbol "c" in a leaf at its tip. As a result, the form of the code tree after being updated becomes as shown in column 5 of FIG. 25.

On the other hand, the restoring unit 10, upon receiving the code word "0", retrieves the code tree under the 0th degree context taking the form shown in column 4 of FIG. 25, thereby the non-appeared symbol (ESC) is obtained. Then, the restoring unit 10 is capable of recognizing that the data inputted after this code word "0" is raw data of the new symbol and therefore outputs this item of raw data "c" of the new symbol as it is. Thereafter, the restoring unit 10 updates the context tree and the code tree in the table 11 as in the same way with the coding unit 2.

As discussed above, in accordance with the sixth embodiment, all the operations of the first, fourth and fifth embodiments can be actualized, and the compression efficiency can be further enhanced in combination with the context model.

Note that the subroutine of FIG. 6 is executed as the code tree updating process in steps S0909, S0916 of FIG. 23 and steps S1009, S1014 of FIG. 24, but, as a substitute for this, the subroutine of FIG. 8 or FIG. 10 may also be executed. Further, the subroutine of FIG. 17 is implemented as the process of registering the new symbol in step S0919 of FIG. 23 and step S1017 of FIG. 24, but, as a substitute for this, the subroutine of FIG. 14 may also be executed.

According to the present invention, saving of the memory can be attained by eliminating the necessity for holding the frequency for every node of the code tree, and the code tree can be updated to increase the compression efficiency of the symbol having a high frequency of occurrence without comparing the frequency held in every node. Hence, the load on the control processing device can be reduced.

It is apparent that, in this invention, a wide range of different working modes can be formed based on the invention without deviating from the spirit and scope of the invention. This invention is not restricted by its specific working modes except being limited by the appended claims.

What is claimed is:

1. A data compressing apparatus for dynamically coding inputted unit data in accordance with a prior occurrence situation of the unit data, said apparatus comprising:

a compression table defining an order of each unit data and a code corresponding to each order such that as the order of each unit data becomes higher the corresponding code becomes shorter;

data inputting means for inputting the unit data to be compressed;

retrieving means for retrieving said compression table, to obtain the order corresponding to the unit data inputted by said data inputting means;

outputting means for outputting a code corresponding to the obtained order; and compression table updating means for updating the compression table so that the order of the unit data, inputted by said inputting means, increases, in a self-organizing manner, based on the current order thereof after said outputting means outputs the code corresponding to the unit data.

2. A data compressing apparatus according to claim 1, wherein said compression table has such a tree structure that branches repeatedly diverge from a single root, orders are given to respective nodes formed at diverging points of the branches and leaves thereof in sequence from the root towards the leaves, the unit data are registered in the nodes of the leaves, and the diverged branches are each labeled with codes distinguishable from each other, wherein said retrieving means reads the code on a path connecting the root to the leaf registered with the inputted unit data, and wherein said outputting means outputs code read by said retrieving means.

3. A data compressing apparatus according to claim 1, further comprising data registration/non-registration judging means for judging whether the unit data inputted by said data inputting means is registered in said compression table, wherein only an end symbol and a non-appeared symbol are registered in said compression table in an initial status, said outputting means, when said data registration/non-registration judging means judges that the unit data is not registered in said compression table, outputs a code corresponding to an order corresponding to the non-appeared symbol and thereafter outputs the unit data itself, and said compression table updating means, when said outputting means outputs the code corresponding to the non-appeared symbol and the unit data itself, updates the order of the non-appeared symbol in said compression table in a self-organizing manner and thereafter registers the unit data in said compression table.

4. A data restoring apparatus for outputting unit data, obtained by dynamically decoding an inputted code in accordance with a prior occurrence situation of the unit data, said apparatus comprising:

a restoration table defining an order of each unit data and a code corresponding to each order such that as the order of each unit data becomes higher the corresponding code becomes shorter;

code inputting means for inputting the code to be restored;

retrieving means for retrieving said restoration table to obtain the order corresponding to the unit data inputted by said code inputting means;

outputting means for outputting the unit data corresponding to the obtained order; and restoration table updating means for updating the restoration table so that the order of the unit data, outputted by said outputting means, increases, in a predetermined self-organizing manner, based on the current order thereof, after said outputting means outputs the unit data corresponding to the code.

5. A data restoring apparatus according to claim 4, wherein said restoration table has such a tree structure that branches repeatedly diverge from a single root, orders are given to respective nodes formed at diverging points of the branches and leaves thereof in sequence from the root towards the leaves, the unit data are registered in the nodes of the leaves, and the diverged branches are each labeled with codes distinguishable from each other, wherein said retrieving means retrieves the unit data registered in the nodes of the leaves of a path extending from the root labeled with the same code as the above code, and wherein said outputting means outputs the retrieved unit data.

6. A data restoring apparatus according to claim 4, wherein only an end symbol and a non-appeared symbol are registered in said restoration table in an initial status, said outputting means, when the order corresponding to the code in said restoration table corresponds to the non-appeared code, outputs the unit data inputted immediately after the code as it is, and said restoration table updating means, when said outputting means outputs the unit data inputted immediately after the code as it is, updates the order of the non-appeared symbol in said restoration table in the self-organizing manner based on the order thereof and thereafter registers the unit data in said restoration table.

7. A data compressing/restoring system for dynamically coding and decoding unit data based on a prior occurrence situation of the output data, the system comprising:

a compression table defining an order of each unit data and a code corresponding to each order such that as the order of each unit data becomes higher, the corresponding code becomes shorter;

data inputting means for inputting the unit data to be compressed;

first retrieving means for retrieving said compression table, to obtain the order corresponding to the unit data inputted by said data inputting means;

first outputting means for outputting a code corresponding to the obtained order;

compression table updating means for updating the compression table so that the order of the unit data, inputted by said first inputting means, increases, in a self-organizing manner based on the current order thereof after said first outputting means outputs the code corresponding to the unit data; and a restoration table defining an order of each unit data and a code corresponding to each order such that as the order of each unit data becomes higher, the corresponding code becomes shorter;

code inputting means for inputting the code to be restored;

second retrieving means for retrieving said restoration table to obtain the order corresponding to the unit data inputted by said code inputting means;

second outputting means for outputting the unit data corresponding to the obtained order; and restoration table updating means for updating the restoration table so that the order of the unit data, outputted by said second outputting means, increases, in a predetermined self-organizing manner, based on the current order thereof, after said second outputting means outputs the unit data corresponding to the code.

8. A data compressing/restoring system, as set forth in claim 7, wherein said compression table has such a tree structure that branches repeatedly diverge from a single root, orders are given to respective nodes formed at diverging points of the branches and leaves thereof in sequence from the root towards the leaves, the unit data are registered in the nodes of the leaves, and the diverged branches are each labeled with codes distinguishable from each other, wherein said retrieving means reads the code on a path connecting the root to the leaf registered with the inputted unit data, and wherein said first outputting means outputs code read by said retrieving means.

9. A data compressing/restoring system, as set forth in claim 8, wherein said restoration table has such a tree structure that branches repeatedly diverge from a single root, orders are given to respective nodes formed at diverging points of the branches and leaves thereof in sequence from the root towards the leaves, the unit data are registered in the nodes of the leaves, and the diverged branches are each labeled with codes distinguishable from each other, wherein said retrieving means retrieves the unit data registered in the nodes of the leaves of a path extending from the root labeled with the same code as the above code, and wherein said second outputting means outputs the retrieved unit data.

10. A data compressing/restoring system, according to claim 9, wherein contents of said compression table are identical with contents of said restoration table, and said compression table updating means and said restoration table updating means perform an updating process of each of said tables in accordance with the same procedures.

11. A data compressing/restoring system according to claim 10, wherein said compression table updating means and said restoration table updating means set the node registered with the unit data as a processing target node and perform an updating process of exchanging this processing target node for a node of the order higher by one.

12. A data compressing/restoring system according to claim 10, wherein said compression table updating means and said restoration table updating means set the node registered with the unit data as a processing target node and perform an updating process of inserting this processing target node into a position of the order higher by two or more and let down the orders of other nodes that are disposed in the inserting position through the previous position of the processing target node by ones.

13. A data compressing/restoring system according to one of claims 12, wherein said compression table updating means and said restoration table updating means set a node connected closer to the root side than the node at which the updating process had been effected as a processing target node and perform the updating process with respect to this processing target node.

14. A data compressing/restoring system according to claim 13, wherein said compression table updating means and said restoration table updating means perform the updating process except for the case both of the processing target node and the node of the order higher by one than this processing target node are not nodes of the leaves.

15. A data compressing/restoring system according to claim 10, wherein said compression table updating means and said restoration table updating means set the node registered with the unit data as a processing target node and perform an updating process of exchanging this processing target node for a node of the order higher by one in case the processing target node is of the highest order within the same level spaced the same away from the root, inserting this processing target node into a position of the highest order within the same level in case this processing target node is an order exclusive of the highest order within the same level and let down the orders of other nodes that are disposed in the inserting position through the previous position of the processing target node by ones.

16. A data compressing/restoring system according to claim 10, wherein said compression table updating means and said restoration table updating means perform the updating process of inserting the node registered with the unit data into a position of the order next to the root.

17. A data compressing/restoring system according to claim 10, wherein said compression table updating means and said restoration table updating means perform an updating process of shifting the node registered with the unit data to a position of the order next to the root by repeating an inserting process of inserting the node registered with the unit data into a position of the highest order within the same level spaced the same away from the root and letting down the orders of other nodes that are disposed in this inserting position through the previous position of the node registered with the unit data by ones and an exchanging process of exchanging the node registered with the unit data for a node of the order higher by one.

18. A data compressing/restoring system, as set forth in claim 7, further comprising:

data registration/non-registration judging means for judging whether the unit data inputted by said data inputting means is registered in said compression table, wherein only an end symbol and a non-appeared symbol are registered in said compression table in an initial status, said first outputting means, when said data registration/non-registration judging means judges that the unit data is not registered in said compression table, outputs a code corresponding to an order corresponding to the non-appeared symbol and thereafter outputs the unit data itself, and said compression table updating means, when said first outputting means outputs the code corresponding to the non-appeared symbol and the unit data itself, updates the order of the non-appeared symbol in said compression table in a self-organizing manner and thereafter registers the unit data in said compression table.

19. A data compressing/restoring system, as set forth in claim 7, wherein only an end symbol and a non-appeared symbol are registered in said restoration table in an initial status, said second outputting means, when the order corresponding to the code in said restoration table corresponds to the non-appeared code, outputs the unit data inputted immediately after the code as it is, and said restoration table updating means, when said second outputting means outputs the unit data inputted immediately after the code as it is, updates the order of the non-appeared symbol in said restoration table in the self-organizing manner based on the order thereof and thereafter registers the unit data in said restoration table.

20. A data compressing/restoring system, as set forth in claim 19, wherein contents of said compression table are identical with contents of said restoration table, and said compression table updating means and said restoration table updating means performs an updating process of each of said tables in accordance with the same procedures.

21. A data compressing/restoring system according to claim 20, wherein said compression table updating means and said restoration table updating means cause a divergence of the node of the non-appeared symbol and register the non-appeared symbol and the unit data in nodes of leaves of two branches generated by this divergence.

22. A data compressing/restoring system according to claim 20, wherein said compression table updating means and said restoration table updating means cause a divergence of the node of the leaf positioned at the order next to the node of the lowest order that is not a leaf and register the unit data in the nodes of the leaves of the branches generated by this divergence.

23. A data compressing apparatus for dynamically performing a coding process in accordance with a conditional occurrence situation in a context appeared in the past, said apparatus comprising:

a compression table for storing a context tree in which contexts consisting of symbols within a range from a 0th degree to a certain degree appeared in the past and a non-appeared symbol are registered as a tree structure and a code tree which is provided for said every symbol and in which codes are allocated to symbols having order respectively subsequent to the symbol;

inputting means for inputting a compression target symbol;

context retrieving means for retrieving said certain degree context having the symbol at the leaf thereof from the context tree;

non-appeared symbol order coding means for coding an order of the non-appeared symbol with reference to each of the code trees corresponding to the symbols of the contexts from the one corresponding to said certain degree to the one corresponding to such a degree that the symbol exists;

symbol order coding means for coding the order of the symbol with reference to the code tree registered with the symbol, said code tree corresponding to a symbol of the highest degree consisting the context tree retrieved by said context retrieving means;

code tree order updating means for updating the order of the symbol in the code tree in a self-organizing manner on the basis of only the order of the symbol in the code tree referred; and non-appeared symbol order updating means for updating the order of the non-appeared symbol in each code tree in the self-organizing manner on the basis of only the order of the non-appeared symbol in each code tree referred.

24. A data restoring apparatus for dynamically outputting a symbol to which an inputted code is decoded in accordance with a conditional occurrence situation in a context appeared in the past, said apparatus comprising:

a restoration table for storing a context tree in which contexts consisting of symbols within a range from a 0th degree to a certain degree appeared in the past registered as a tree structure and a code tree which is provided for said every symbol and in which codes are allocated to symbols having order respectively subsequent to the symbol;

inputting means for inputting a restoration target code;

context retrieving means for retrieving said certain degree context having the symbol at the leaf thereof from the context tree;

symbol order decoding means for decoding an order of the symbol from the code with reference to the code tree corresponding to a symbol at the leaf of the fixed degree context in which the symbol is expected to exist;

symbol order re-decoding means for making said symbol order decoding means decode the symbol order with reference to a code tree corresponding to a symbol of which degree lower by one than the degree of the above code tree in case the non-appeared symbol is obtained by said symbol order decoding means;

code tree order updating means for updating the order of the symbol in the code tree in a self-organizing manner on the basis of only the order of the symbol in the code tree referred; and non-appeared symbol order updating means for updating the order of the non-appeared symbol in each code tree in the self-organizing manner on the basis of only the order of the non-appeared symbol in each code tree referred.

25. A data compressing/restoring system comprising:

a data compressing apparatus for dynamically performing a coding process in accordance with a conditional occurrence situation in a context appeared in the past, said apparatus comprising:

- a compression table for storing a context tree in which contents consisting of symbols within a range from a 0th degree to a certain degree appeared in the past and a non-appeared symbol are registered as a tree structure and a code tree which is provided for said every symbol and in which codes are allocated to symbols having order respectively subsequent to the symbol;
- first inputting means for inputting a compression target symbol;
- first context retrieving means for retrieving said certain degree context having the symbol at the leaf thereof from the context tree;
- non-appeared symbol order coding means for coding an order of the non-appeared symbol with reference to each of the code trees corresponding to the symbols of the contexts from the one corresponding to said certain degree to the one corresponding to such a degree that the symbol exists;
- symbol order coding means for coding the order of the symbol with reference to the code tree registered with the symbol, said code tree corresponding to a symbol of the highest degree consisting the context tree retrieved by said first context retrieving means;
- first code tree order updating means for updating the order of the symbol in the code tree in a self-organizing manner on the basis of only the order of the symbol in the code tree referred; and
- first non-appeared symbol order updating means for updating the order of the non-appeared symbol in each code tree in the self-organizing manner on the basis of only the order of the non-appeared symbol in each code tree referred; and a data restoring apparatus for dynamically outputting a symbol to which an inputted code is decoded in accordance with a conditional occurrence situation in a context appeared in the past, said apparatus comprising:

- a restoration table for storing a context tree in which contents consisting of symbols within a range from a 0th degree to a certain degree appeared in the past registered as a tree structure and a code tree which is provided for said every symbol and in which codes are allocated to symbols having order respectively subsequent to the symbol;
- second inputting means for inputting a restoration target code;
- second context retrieving means for retrieving said certain degree context having the symbol at the leaf thereof from the context tree;
- symbol order decoding means for decoding an order of the symbol from the code with reference to the code tree corresponding to a symbol at the leaf of the fixed degree context in which the symbol is expected to exist;
- symbol order re-decoding means for making said symbol order decoding means decode the symbol order with reference to a code tree corresponding to a symbol order with reference to a code tree corresponding to a symbol of which degree lower by one than the degree of the above code tree in case the non-appeared symbol is obtained by said symbol order decoding means;
- second code tree order updating means for updating the order of the symbol in the code tree in a self-organizing manner on the basis of only the order of the symbol in the code tree referred; and
- second non-appeared symbol order updating means for updating the order of the non-appeared symbol in each code tree in the self-organizing manner on the basis of only the order of the non-appeared symbol in each code tree referred.

26. A data compressing/restoring system, as set forth in claim 25, wherein contents of said compression table are identical with contents of said restoration table, and said each code tree order updating means and said each non-appeared symbol order updating means of said data compressing apparatus and said data restoring apparatus respectively perform the same process.

27. A data compressing/restoring system according to claim 26, wherein all the appeared symbols including the end symbol are registered in the code tree in the initial status.

* * * * *